(12) United States Patent
Tomita

(10) Patent No.: US 12,063,765 B2
(45) Date of Patent: Aug. 13, 2024

(54) MEMORY CELL AND CMOS INVERTER CIRCUIT

(71) Applicant: SONY SEMICONDUCTOR SOLUTIONS CORPORATION, Kanagawa (JP)

(72) Inventor: Manabu Tomita, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 733 days.

(21) Appl. No.: 17/266,716

(22) PCT Filed: Aug. 13, 2019

(86) PCT No.: PCT/JP2019/031825
§ 371 (c)(1),
(2) Date: Feb. 8, 2021

(87) PCT Pub. No.: WO2020/039996
PCT Pub. Date: Feb. 27, 2020

(65) Prior Publication Data
US 2021/0305263 A1 Sep. 30, 2021

(30) Foreign Application Priority Data
Aug. 22, 2018 (JP) ................................. 2018-155658

(51) Int. Cl.
*H10B 10/00* (2023.01)
*H01L 23/528* (2006.01)
(Continued)

(52) U.S. Cl.
CPC ......... *H10B 10/12* (2023.02); *H01L 23/5286* (2013.01); *H01L 27/092* (2013.01);
(Continued)

(58) Field of Classification Search
CPC .............. H10B 10/12; H01L 29/41741; H01L 29/66666; H01L 29/7827; H01L 29/0676
See application file for complete search history.

(56) References Cited

U.S. PATENT DOCUMENTS

| 5,994,735 A | 11/1999 | Maeda et al. |
| 2002/0195652 A1 | 12/2002 | Maeda et al. |

(Continued)

FOREIGN PATENT DOCUMENTS

| JP | H07-99311 | 4/1995 |
| JP | 2008-205168 | 9/2008 |

(Continued)

OTHER PUBLICATIONS

International Search Report prepared by the Japan Patent Office on Oct. 16, 2019, for International Application No. PCT/JP2019/031825.

*Primary Examiner* — Peter M Albrecht
(74) *Attorney, Agent, or Firm* — Sheridan Ross PC

(57) ABSTRACT

A memory cell includes a flip-flop circuit that includes a first CMOS inverter circuit including a 1Ath transistor $TR_1$ and a 1Bth transistor $TR_2$ and a second inverter circuit including a 2Ath transistor $TR_3$ and a 2Bth transistor $TR_4$ and two transfer transistors $TR_5$ and $TR_6$. The 1Ath transistor $TR_1$ and the 2Ath transistor $TR_2$ are connected to a common first power supply line, and the 1Bth transistor $TR_3$ and the 2Bth transistor $TR_4$ are connected to a common second power supply line.

20 Claims, 52 Drawing Sheets

(51) Int. Cl.
*H01L 27/092* (2006.01)
*H01L 29/06* (2006.01)
*H01L 29/423* (2006.01)
*H01L 29/775* (2006.01)
*H01L 29/786* (2006.01)

(52) U.S. Cl.
CPC .... *H01L 29/0676* (2013.01); *H01L 29/42392* (2013.01); *H01L 29/775* (2013.01); *H01L 29/78642* (2013.01); *H01L 29/78696* (2013.01); *H10B 10/125* (2023.02)

(56) References Cited

U.S. PATENT DOCUMENTS

| | | | |
|---|---|---|---|
| 2007/0132009 | A1 | 6/2007 | Takeuchi |
| 2008/0304313 | A1* | 12/2008 | Fukano ............... H10B 10/12 365/156 |
| 2010/0219483 | A1 | 9/2010 | Masuoka et al. |
| 2011/0024828 | A1 | 2/2011 | Takeuchi |
| 2016/0197021 | A1 | 7/2016 | Yamamoto |
| 2016/0240533 | A1* | 8/2016 | Oxland ............... H01L 27/092 |
| 2017/0301664 | A1 | 10/2017 | Yoshida |
| 2018/0374857 | A1* | 12/2018 | Zang ............... H10B 10/12 |

FOREIGN PATENT DOCUMENTS

| | | |
|---|---|---|
| WO | WO 2009/096465 | 8/2009 |
| WO | WO 2009/128450 | 10/2009 |

* cited by examiner

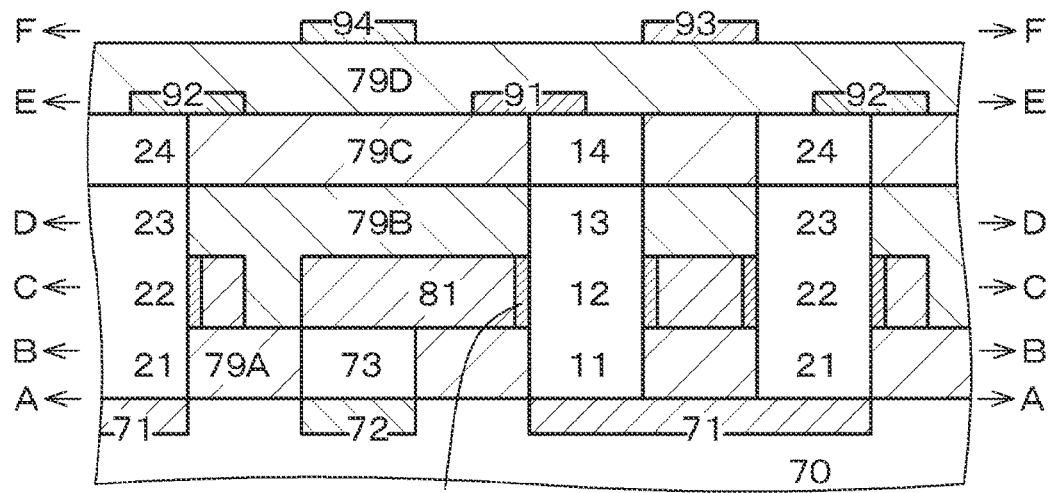
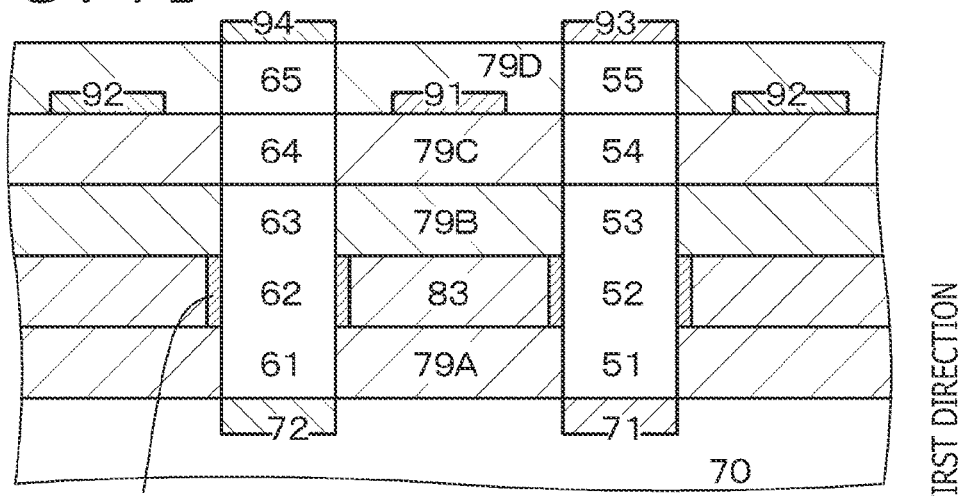
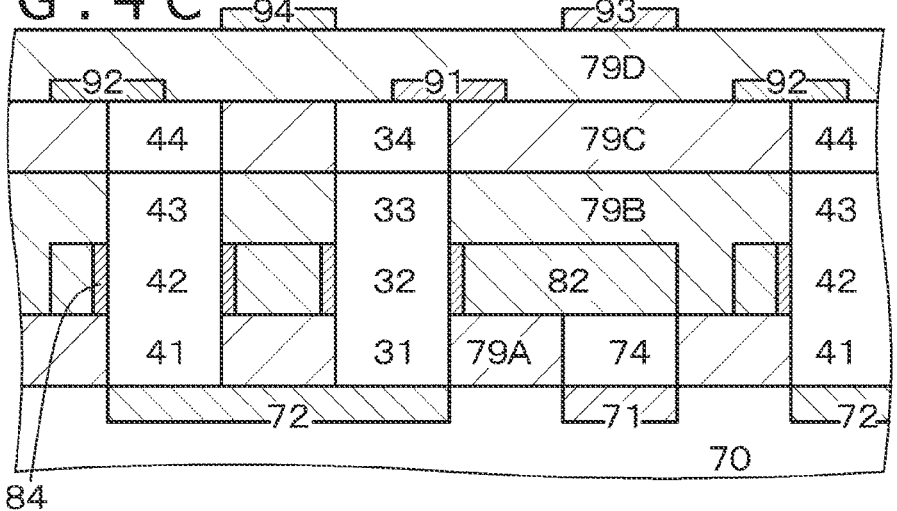

FIG.19

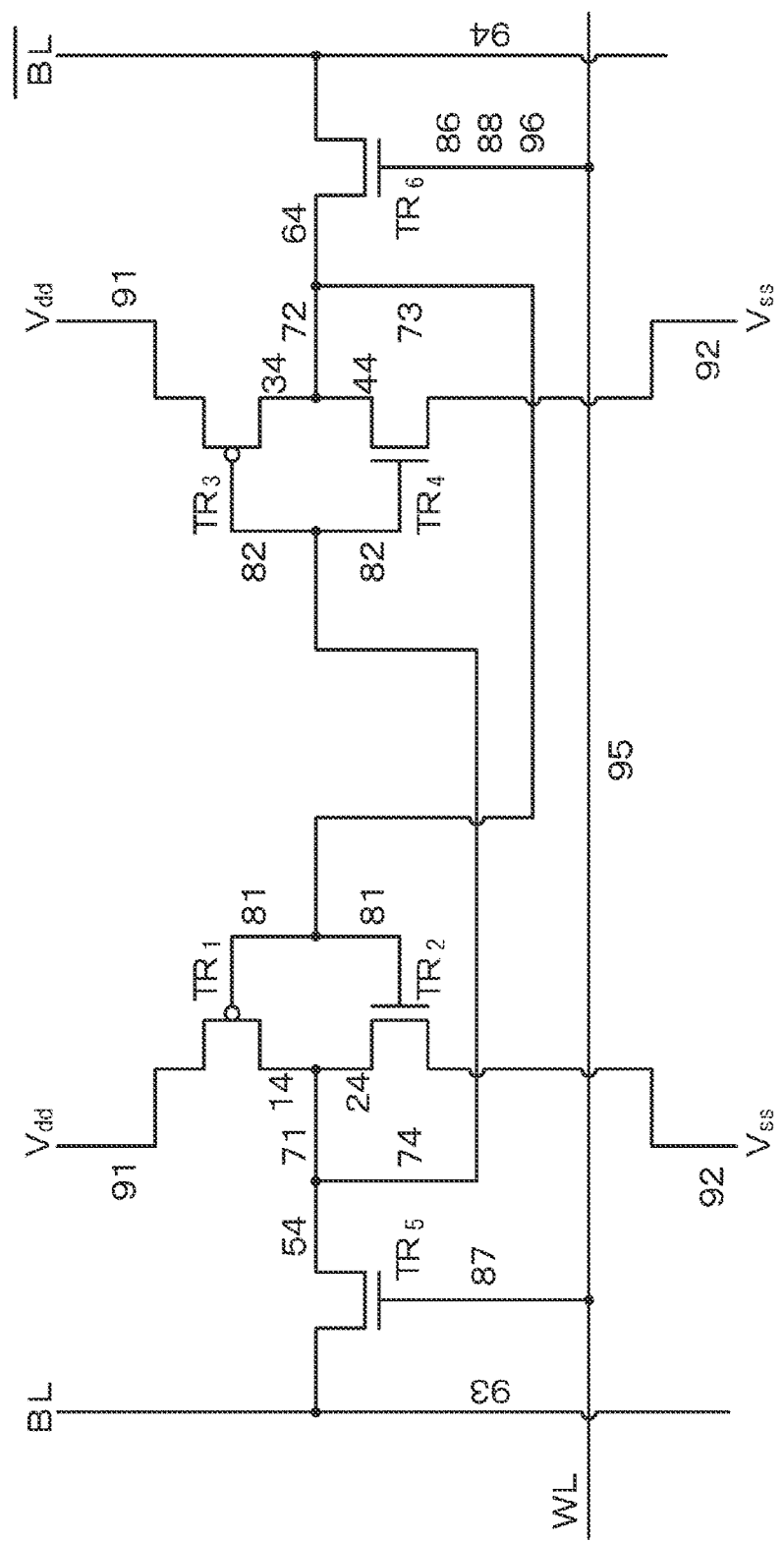
F I G. 3 1

FIG.34

FIRST DIRECTION
SECOND DIRECTION

FIRST DIRECTION

SECOND DIRECTION

MEMORY CELL AND CMOS INVERTER CIRCUIT

CROSS REFERENCE TO RELATED APPLICATIONS

This application is a national stage application under 35 U.S.C. 371 and claims the benefit of PCT Application No. PCT/JP2019/031825 having an international filing date of 13 Aug. 2019, which designated the United States, which PCT application claimed the benefit of Japanese Patent Application No. 2018-155658, filed 22 Aug. 2018, the entire disclosures of each of which are incorporated herein by reference.

TECHNICAL FIELD

The present disclosure relates to a memory cell, particularly, to a memory cell including an SRAM (Static Random Access Memory) and a CMOS inverter circuit.

BACKGROUND ART

A semiconductor apparatus including a CMOS inverter circuit that includes a pMOS transistor and an nMOS transistor having a channel formation region that includes a nanowire or a nanotube is well-known, for example, from Japanese Patent Laid-Open No. 2008-205168. In the CMOS inverter circuit disclosed in the Japanese Patent Laid-Open described above, the drains of the nMOS transistor and the pMOS transistor each include an n-type impurity region and a p-type impurity region formed on the surface of a semiconductor substrate, and the n-type impurity region and the p-type impurity region are ohmic-connected through a connection region for ohmic connection between the n-type impurity region and the p-type impurity region. Further, the nanowire or the nanotube is provided uprightly on the n-type impurity region and the p-type impurity region, and the sources of the nMOS transistor and the pMOS transistor are formed at an upper end of the nanowire or the nanotube, with the gate electrodes of the nMOS transistor and the pMOS transistor being connected to each other by gate electrode wiring. Here, the gate electrode includes a conductive thin film that covers the circumference of the nanowire or the nanotube with a gate insulating film interposed therebetween and the gate electrode wiring extends from the gate electrode, and a via to be connected to the gate electrode wiring is formed on the gate electrode wiring.

Further, in the above-mentioned Japanese Patent Laid-Open, an SRAM memory cell including the CMOS inverter circuit is also disclosed. Further, in FIG. 10(b) of the Japanese Patent Laid-Open, arrangement of a transistor and a via is displayed, and, when the area of a region occupied by the transistor and the via is represented by $\Delta^2$, the area of the region occupied by one SRAM memory cell is $36\Delta^2$ (=$6\Delta \times 6\Delta$) as depicted in FIG. 52A. It is to be noted that, in order to clearly indicate the size of "A," a grid is additionally depicted in FIGS. 52A and 52B. Further, reference characters "TR1," "TR2," "TR3," "TR4," "TR5," and "TR6" in FIGS. 52A and 52B each signify transistors same as a 1Ath transistor $TR_1$, a 1Bth transistor $TR_2$, a 2Ath transistor $TR_3$, a 2Bth transistor $TR_4$, a first transfer transistor $TR_5$, and a second transfer transistor $TR_6$ in the present disclosure hereinafter described. Further, reference sign "A" corresponds to a first gate electrode-connection portion 73 in the memory cell of the present disclosure hereinafter described. Further, reference sign "B" corresponds to a second gate electrode-connection portion 74 in the memory cell of the present disclosure hereinafter described, and reference sign "C" corresponds to connection holes 54 and 55 in the memory cell of the present disclosure hereinafter described while reference sign "D" corresponds to connection holes 64 and 65 in the memory cell of the present disclosure hereinafter described.

CITATION LIST

Patent Literature

[PTL 1]
Japanese Patent Laid-Open No. 2008-205168

SUMMARY

Technical Problem

Incidentally, as depicted in FIG. 10(b) of the Japanese Patent Laid-open or FIG. 52A, part of gate electrode wiring 15A, gate electrode wiring 15B, gate electrode wiring 15C, and gate electrode wiring 15D are formed in an oblique direction. However, in reality, it is difficult to form such wiring in an oblique direction as just described, as the refinement of the transistor progresses. In the case where the gate electrode wiring 15A, gate electrode wiring 15B, gate electrode wiring 15C, and gate electrode wiring 15D depicted in FIG. 10(b) of the Japanese Patent Laid-open or FIG. 52A are formed as wiring that extends in a vertical direction and a horizontal direction and that can be formed for real, the area of the region occupied by one SRAM memory cell is $48\Delta^2$ (=$60 \times 80$) as depicted in FIG. 52B. Here, there is a strong demand for further reduction of the area of the SRAM memory cell in order to implement high integration of SRAM memory cells. Further, in the configuration depicted in FIG. 52B, if one word line, two bit lines, one $V_{dd}$ power supply line, and one $V_{ss}$ power supply line are provided, then four wiring layers for providing the wiring are required. However, there is also a strong demand for further decrease of the number of wiring layers.

Accordingly, it is an object of the present disclosure to provide a memory cell that can further reduce the area or can further decrease the number of wiring layers and a CMOS inverter circuit that configures such a memory cell as just described.

Solution to Problem

The memory sell of the present disclosure for achieving the object described above is a memory cell including a flip-flop circuit that includes a first CMOS inverter circuit and a second inverter circuit and two transfer transistors, in which the first CMOS inverter includes
  a 1Ath transistor including a pMOS transistor that includes a drain region, a channel formation region, and a source region stacked one on another and further includes a gate electrode layer, and
  a 1Bth transistor including an nMOS transistor that includes a drain region, a channel formation region, and a source region stacked one on another and further includes a gate electrode layer, a second CMOS inverter circuit includes
  a 2Ath transistor including a pMOS transistor that includes a drain region, a channel formation region, and a source region stacked one on another and further includes a gate electrode layer, and a 2Bth transistor including an nMOS transistor that includes a drain region, a channel formation region, and a source region stacked one on another and further includes a gate electrode layer, each of the transfer transistors includes one source/drain region, a channel formation region, and another source/drain region stacked one on another and further includes a gate electrode layer, the drain region of the 1Ath transistor and the drain region of the 1Bth transistor are connected to a common first drain region-connection portion, the drain region of the 2Ath transistor and the drain region of the 2Bth transistor are connected to a common second drain region-connection portion, the gate electrode layer (first gate electrode layer) common to the 1Ath transistor and the 1Bth transistor is connected to the second drain region-connection portion through a first gate electrode-connection portion, the gate electrode layer (second gate electrode layer) common to the 2Ath transistor and the 2Bth transistor is connected to the first drain region-connection portion through a second gate electrode-connection portion, the source region of the 1Ath transistor and the source region of the 2Ath transistor are connected to a common first power supply line, and the source region of the 1Bth transistor and the source region of the 2Bth transistor are connected to a common second power supply line.

The CMOS inverter circuit of the present disclosure for achieving the object described above is a CMOS inverter circuit including a pMOS transistor that includes a drain region, a channel formation region, and a source region stacked one on another and further includes a gate electrode layer, and an nMOS transistor that includes a drain region, a channel formation region, and a source region stacked one on another and further includes a gate electrode layer, in which the drain region of the pMOS transistor and the drain region of the nMOS transistor are connected to a common drain region-connection portion, the gate electrode layer common to the pMOS transistor and the nMOS transistor are connected to a common gate wiring portion formed on a substrate, through a gate electrode-connection portion, the source region of the pMOS transistor is connected to a first power supply line, and the source region of the nMOS transistor is connected to a second power supply line.

BRIEF DESCRIPTION OF DRAWINGS

FIGS. 4A, 4B, and 4C are schematic partial sectional views taken along arrow marks A-A, arrow marks B-B, and arrow marks C-C of FIGS. 1 and 5 of the memory cell of the working example 1.

Figure 19:
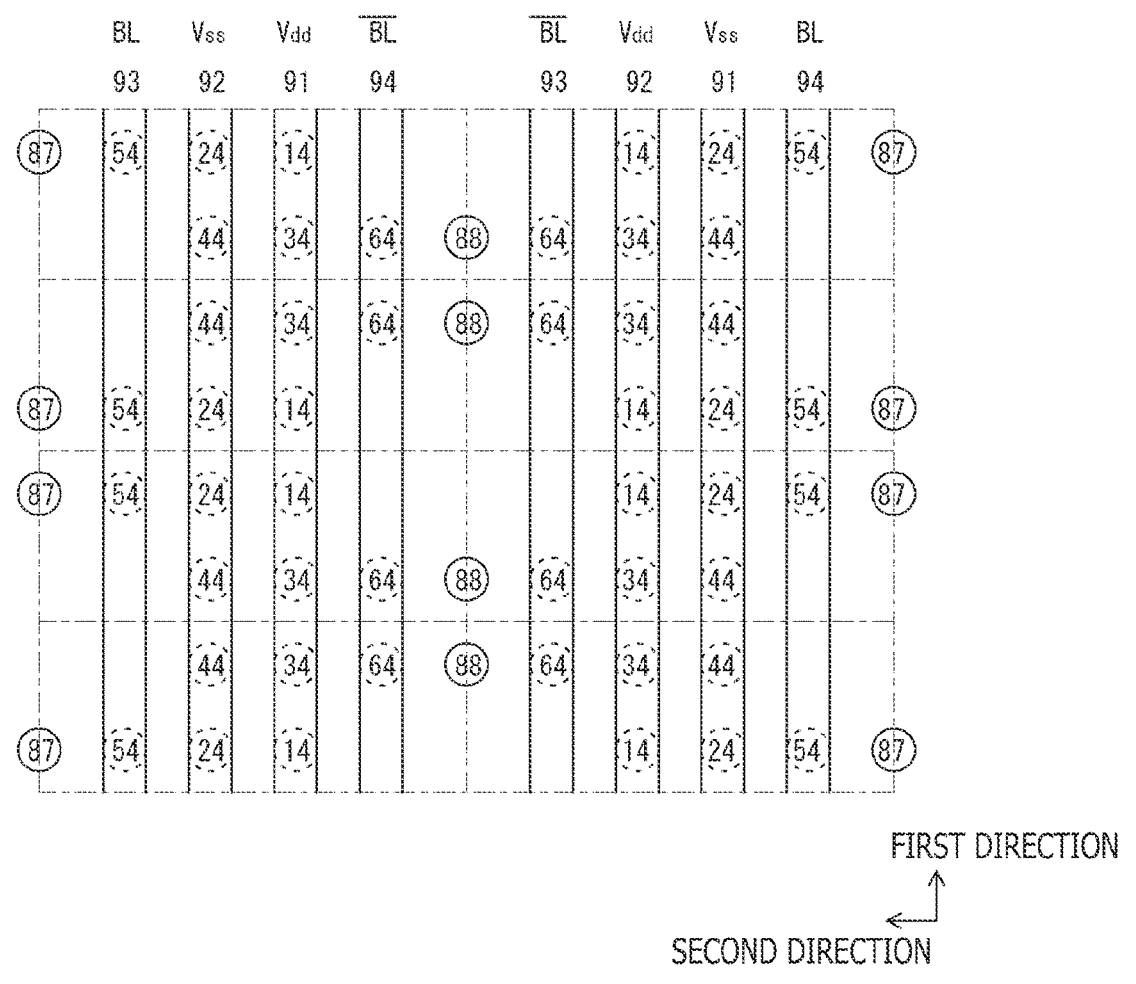

FIG. 19 is a conceptual view of an arrangement state of components configuring the memory cell of the working example 2 when the memory cell of the working example 2 is cut along a virtual horizontal plane including arrow marks E-E of FIG. 13A.

FIG. 31 is an equivalent circuit diagram of the memory cell of the working example 4.

FIG. 34 is a conceptual view of an arrangement state of components configuring the memory cell of the working example 4 when the memory cell of the working example 4 is cut along a virtual horizontal plane including arrow marks C-C of FIG. 30A.

Figure 38A:
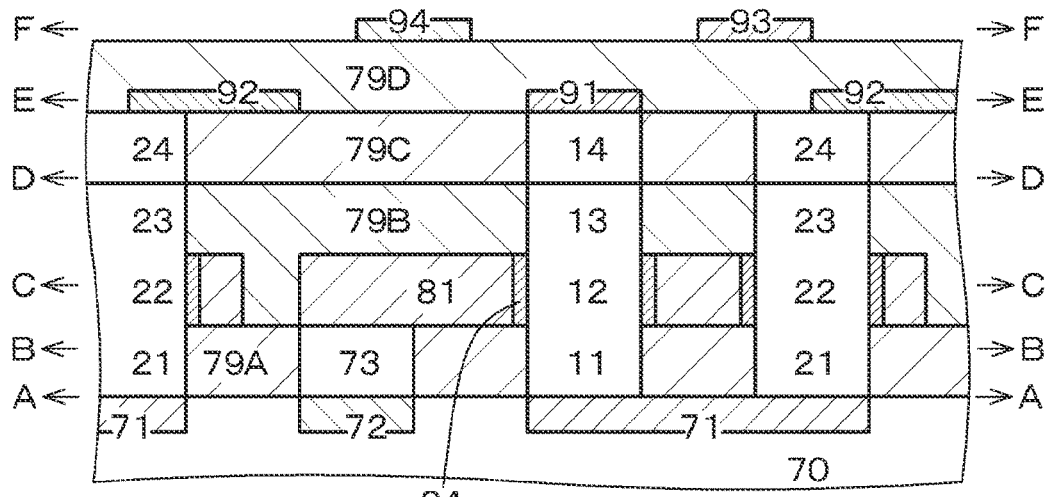
FIGS. 38A, 38B, and 38C are schematic partial sectional views taken along arrow marks A-A, arrow marks B-B, and arrow marks C-C of FIG. 39 of a third modification of the memory cell of the working example 1.
Figure 46:
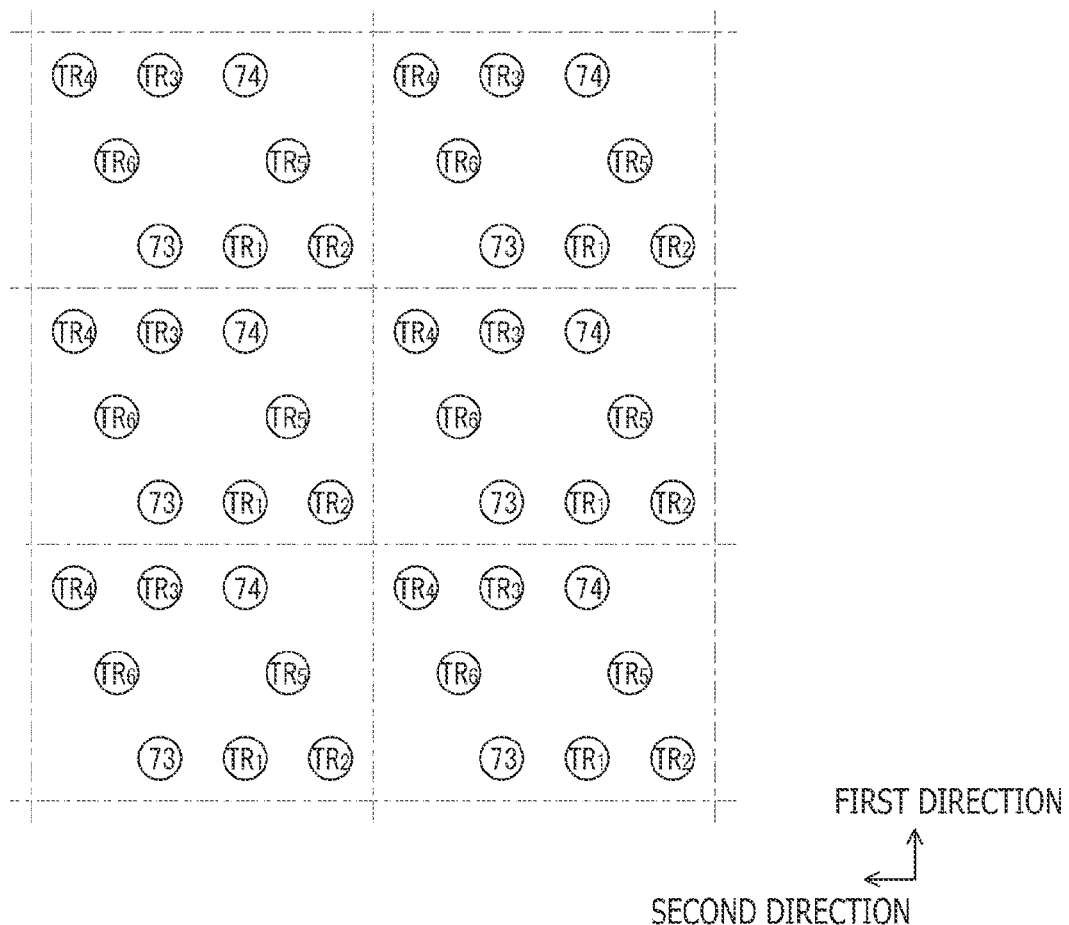

FIG. 46 is a conceptual view of an arrangement state of components configuring the third modification of the memory cell of the working example 1 when the third modification of the memory cell of the working example 1 is cut along a virtual horizontal plane similar to the virtual horizontal plane including arrow marks B-B of FIG. 38A.

Figure 47:
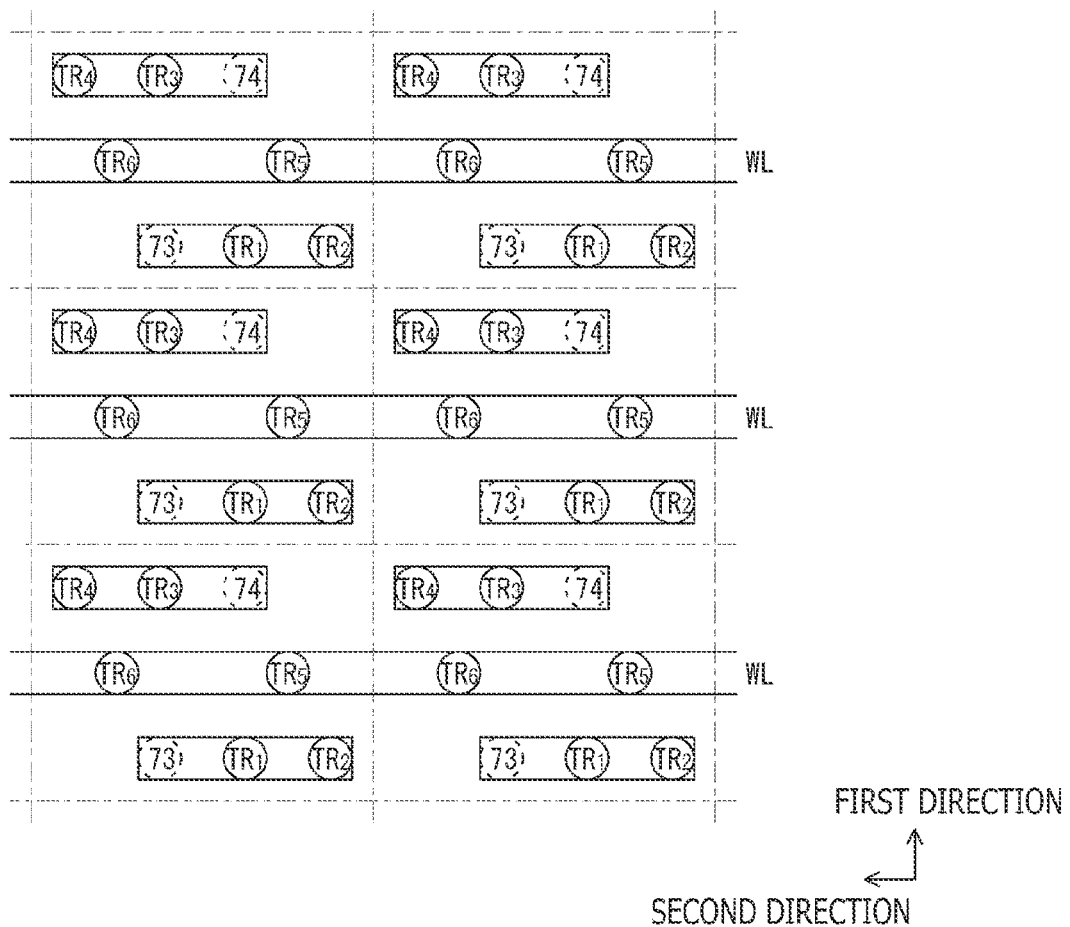

FIG. 47 is a conceptual view of an arrangement state of components configuring the third modification of the memory cell of the working example 1 when the third modification of the memory cell of the working example 1 is cut along a virtual horizontal plane similar to the virtual horizontal plane including arrow marks C-C of FIG. 38A.

Figure 48:
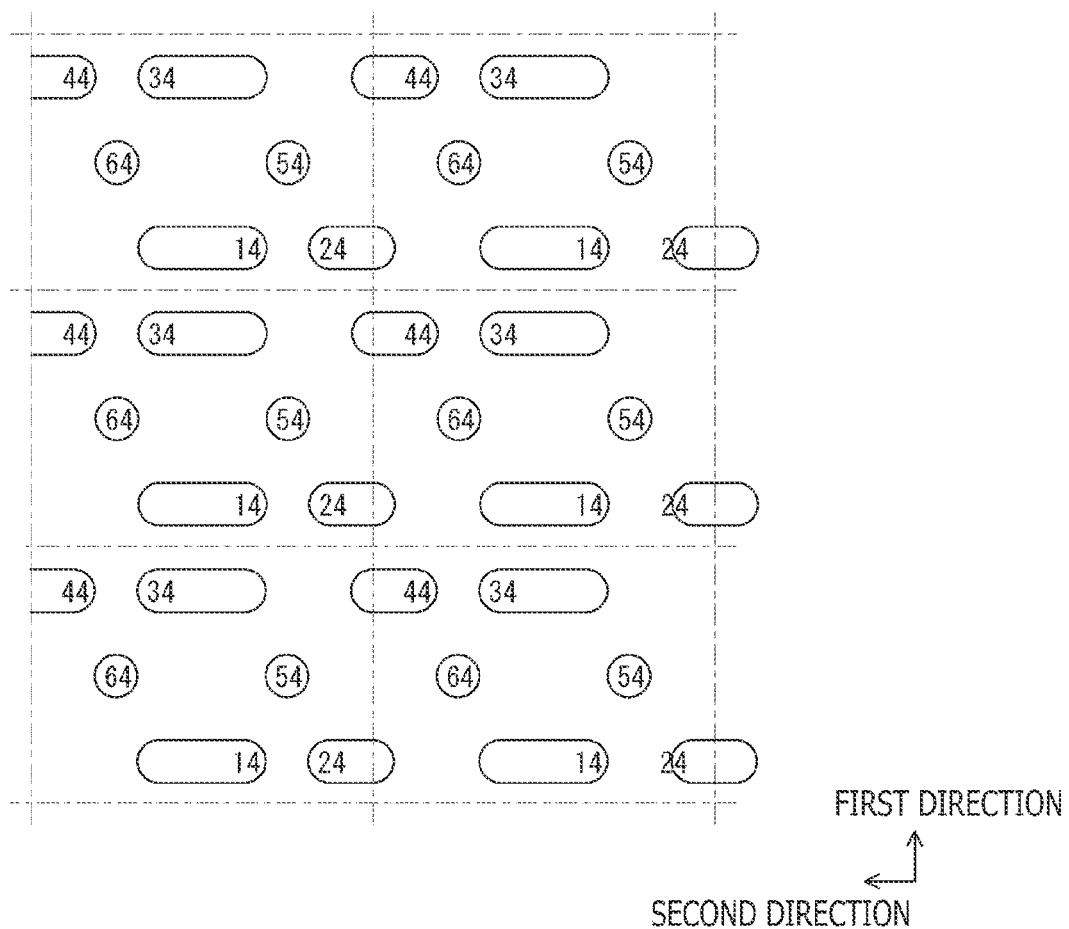

FIG. 48 is a conceptual view of an arrangement state of components configuring the third modification of the memory cell of the working example 1 when the third modification of the memory cell of the working example 1 is cut along a virtual horizontal plane similar to the virtual horizontal plane including arrow marks D-D of FIG. 38A.

Figure 49:
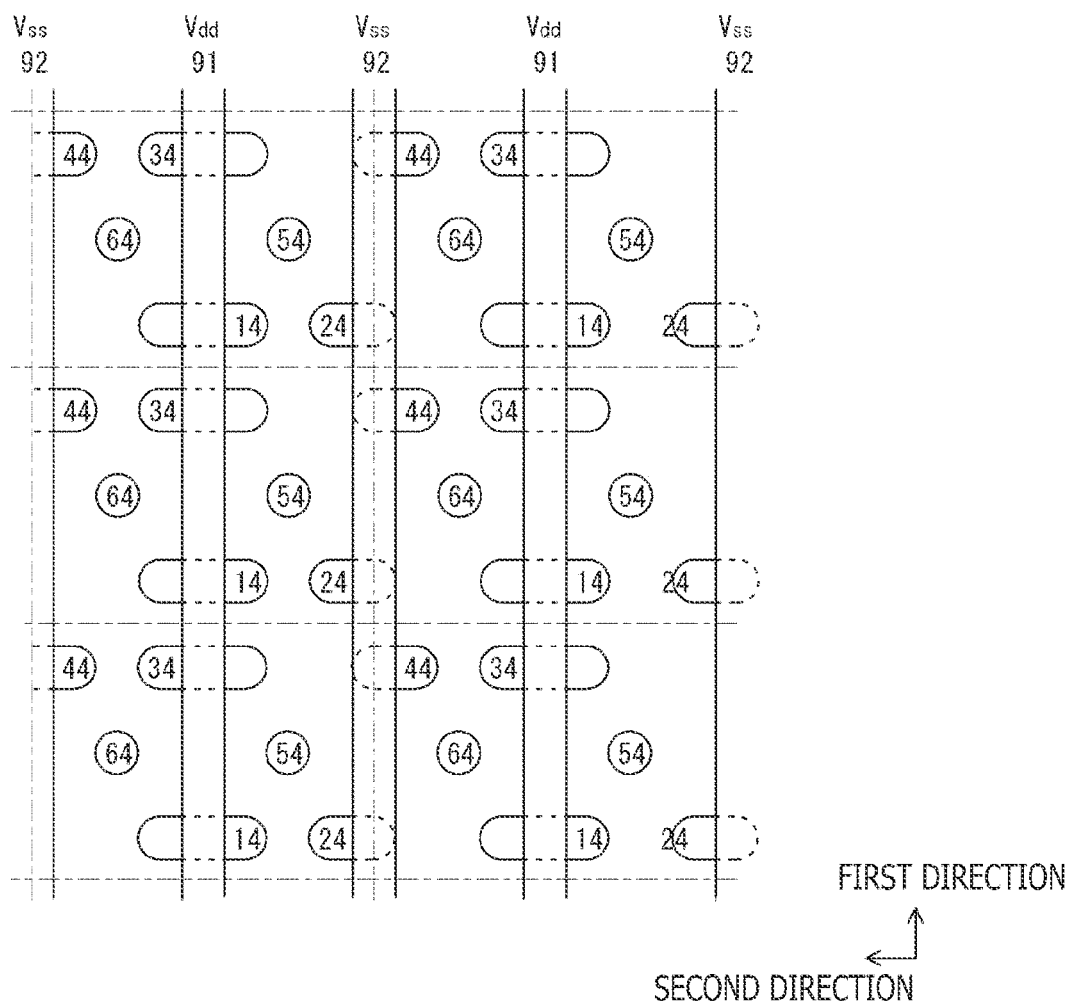

FIG. 49 is a conceptual view of an arrangement state of components configuring the third modification of the memory cell of the working example 1 when the third modification of the memory cell of the working example 1 is cut along a virtual horizontal plane similar to the virtual horizontal plane including arrow marks E-E of FIG. 38A.

Figure 50:
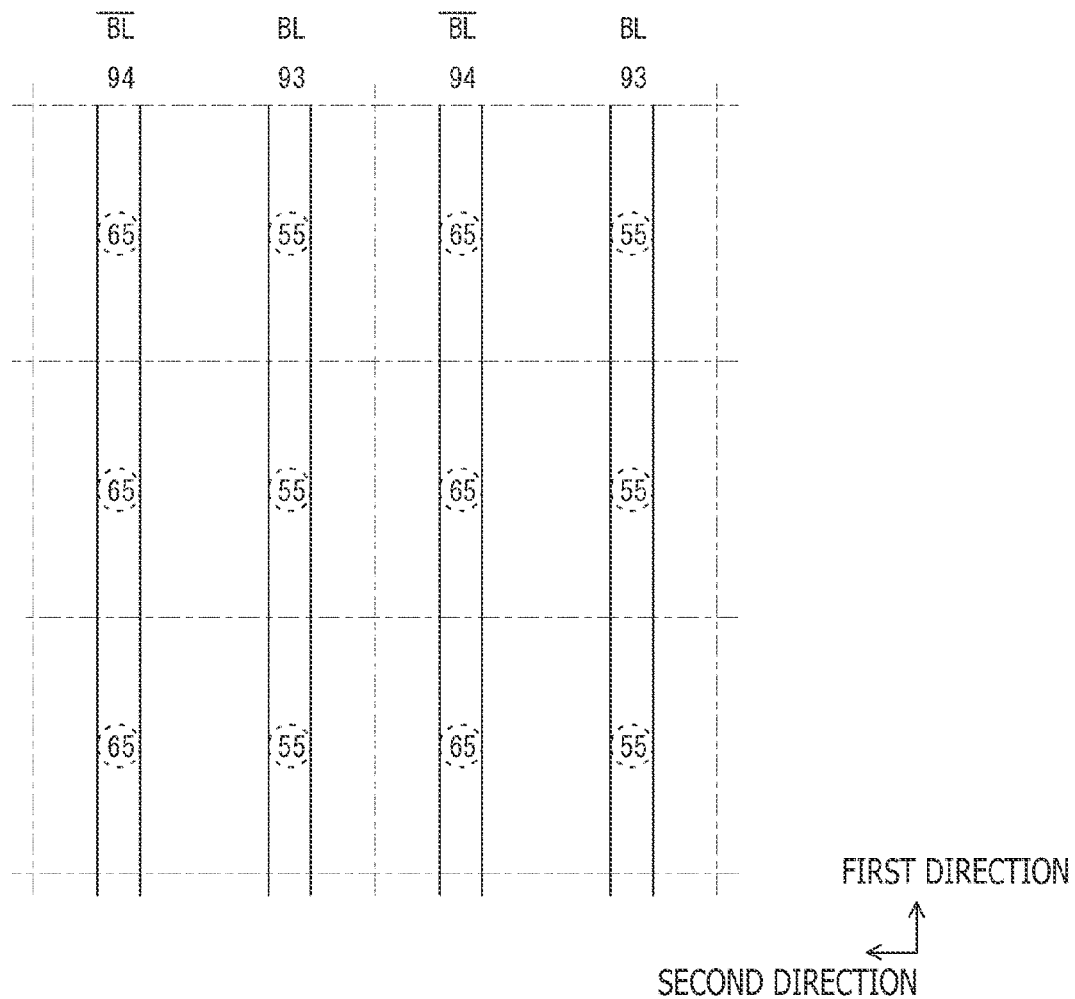

FIG. 50 is a conceptual view of an arrangement state of components configuring the third modification of the memory cell of the working example 1 when the third modification of the memory cell of the working example 1 is cut along a virtual horizontal plane similar to the virtual horizontal plane including arrow marks F-F of FIG. 38A.

Figure 17:
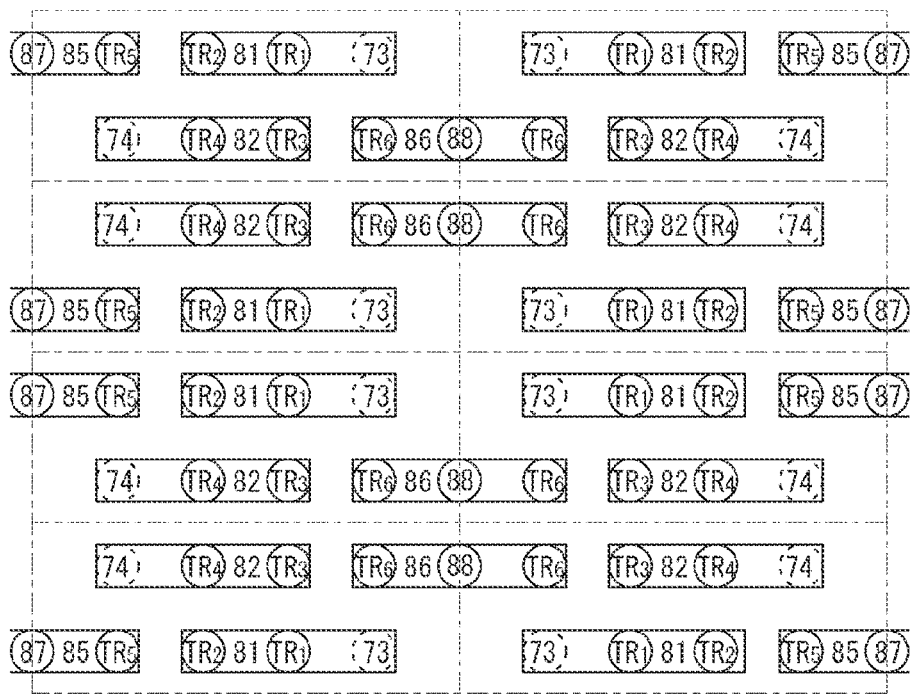
FIG. 17 is a conceptual view of an arrangement state of components configuring the memory cell of the working example 2 when the memory cell of the working example 2 is cut along a virtual horizontal plane including arrow marks C-C of FIG. 13A.
Figure 18:
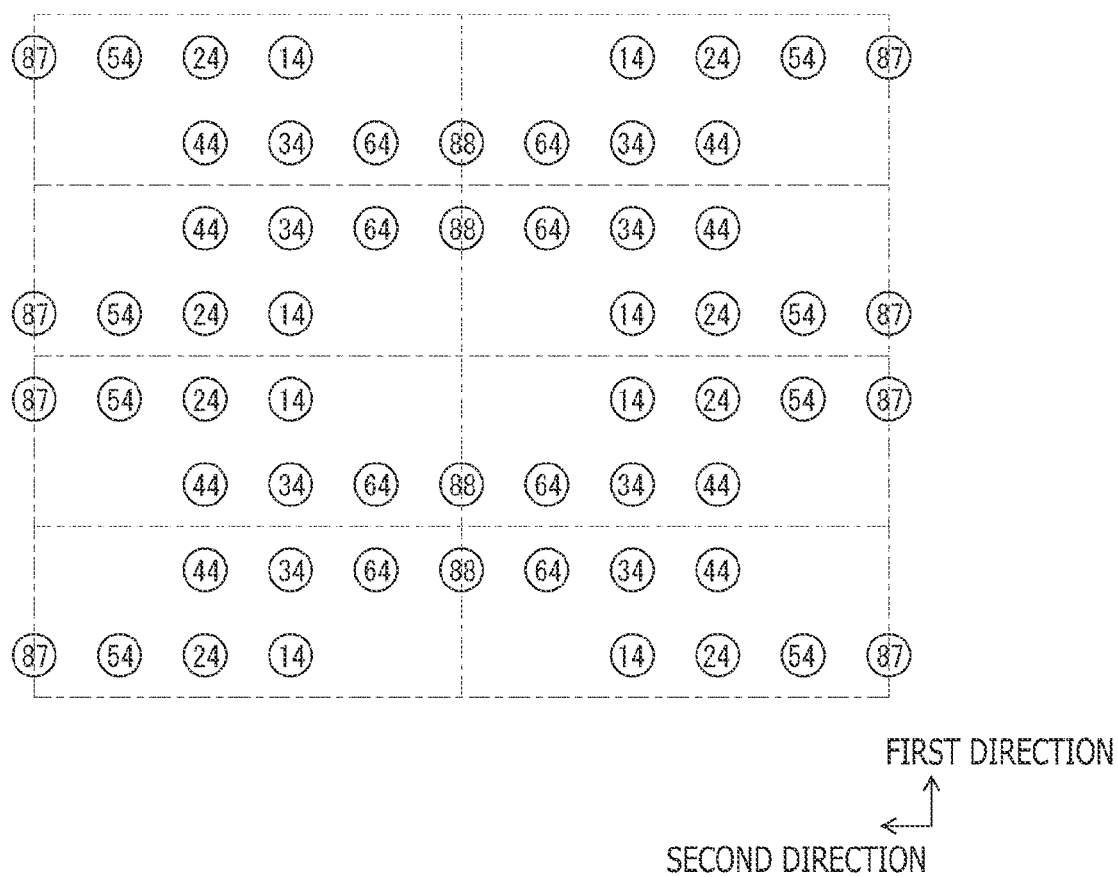
FIG. 18 is a conceptual view of an arrangement state of components configuring the memory cell of the working example 2 when the memory cell of the working example 2 is cut along a virtual horizontal plane including arrow marks D-D of FIG. 13A.
Figure 20:
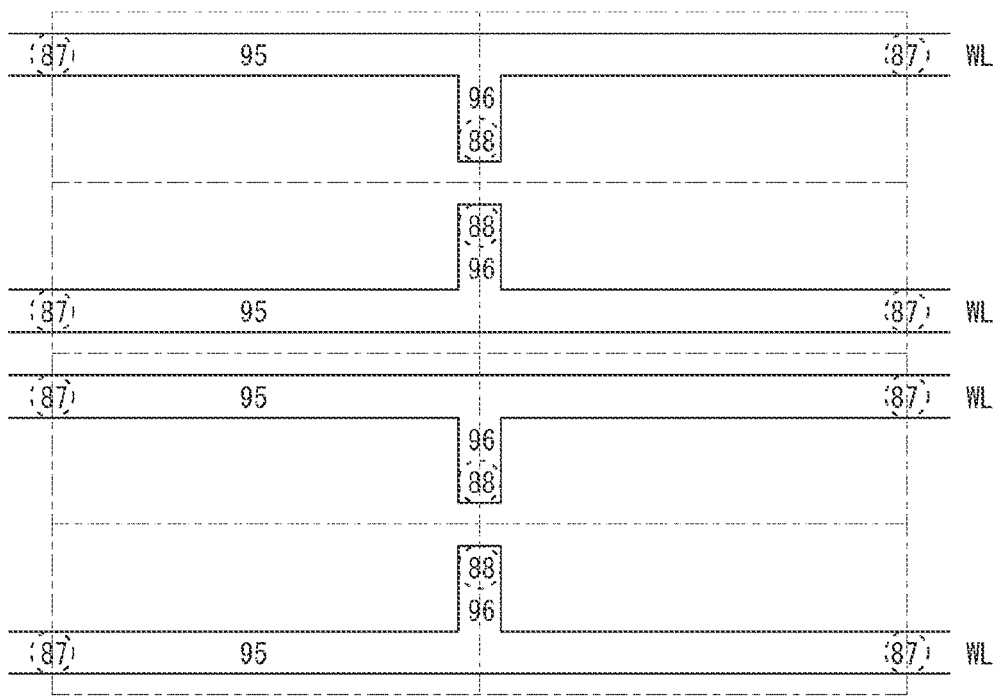
FIG. 20 is a conceptual view of an arrangement state of components configuring the memory cell of the working example 2 when the memory cell of the working example 2 is cut along a virtual horizontal plane including arrow marks F-F of FIG. 13A.
Figure 51:
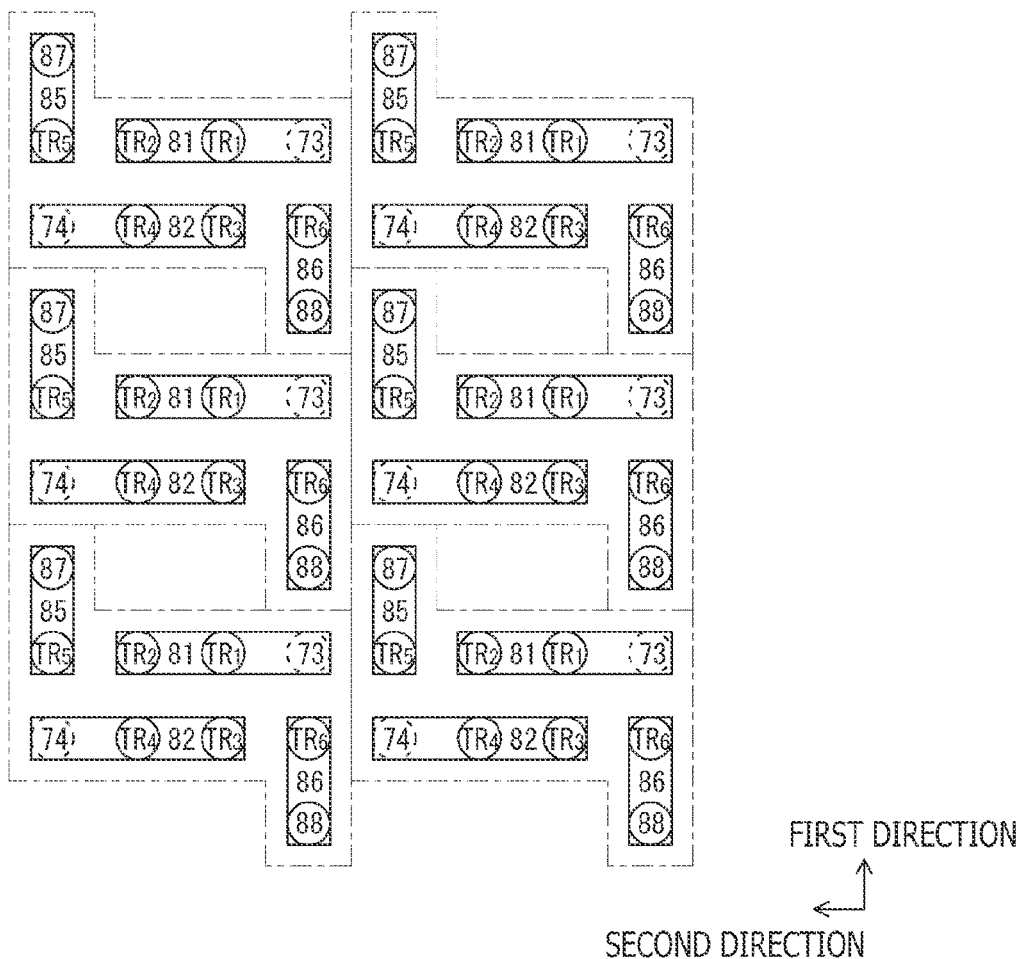

FIG. 51 is a conceptual view of an arrangement state of components configuring a first modification of the memory cell of the working example 2 when the first modification of the memory cell of the working example 2 is cut along a virtual horizontal plane similar to that depicted in FIG. 17.

Figure 52A:
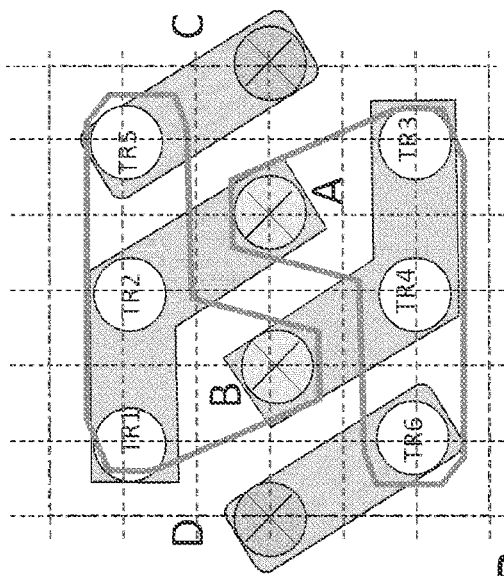
Figure 52B:
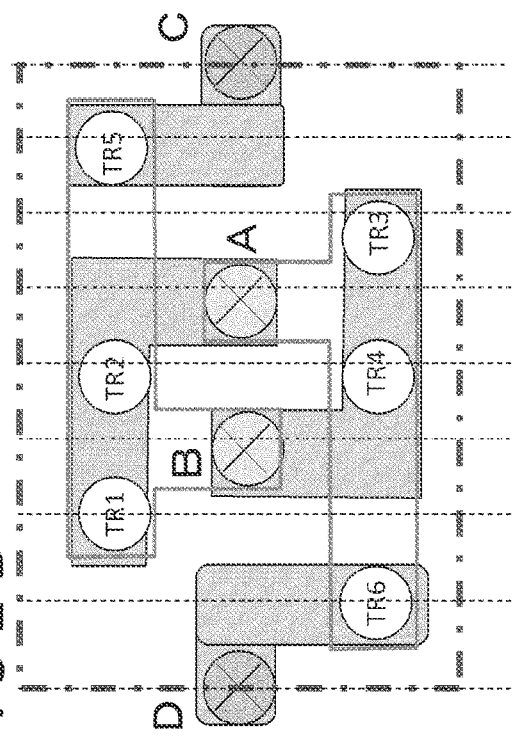

FIGS. 52A and 52B are schematic views illustrating the size of an SRAM memory disclosed in Japanese Patent Laid-open No. 2008-205168.

DESCRIPTION OF EMBODIMENTS

In the following, while the present disclosure is described on the basis of working examples with reference to the drawings, the present disclosure is not limited to the working examples, and various numerical values and materials in the working examples are exemplary. It is to be noted that the description is given in the following order.
1. Description Relating to Whole of Memory Cell and CMOS Inverter Circuit of Present Disclosure
2. Working Example 1 (Memory Cell and CMOS Inverter Circuit of Present Disclosure, Memory Cell of First Form of Present Disclosure, Memory Cell of First Configuration of Present Disclosure)
3. Working Example 2 (Modification of Working Example 1, Memory Cell of First Form of Present Disclosure, Memory Cell of Second Configuration of Present Disclosure)
4. Working Example 3 (Another Modification of Working Example 1, Memory Cell of Second Form of Present Disclosure, Memory Cell of First Configuration of Present Disclosure)
5. Working Example 4 (Modification of Working Example 2, Memory Cell of Second Form of Present Disclosure, Memory Cell of Second Configuration of Present Disclosure)
6. Others <Description Relating to Whole of Memory Cell and CMOS Inverter Circuit of Present Disclosure>

The memory cell of the present disclosure can be formed such that
the drain regions of the 1Ath transistor, the 1Bth transistor, the 2Ath transistor, and the 2Bth transistor and the one source/drain regions of the first transfer transistor and the second transfer transistor are formed on a substrate (particularly, just above the substrate), and
the first drain region-connection portion and the second drain region-connection portion are formed on the substrate (particularly, a top face portion of the substrate). It is to be noted that the memory cell of the present disclosure having such a form as just described is sometimes referred to as a "memory cell of the first form of the present disclosure" for the convenience of description. Further, in this case, the memory cell of the present disclosure can be formed such that the first drain region-connection portion and the second drain region-connection portion each include a high concentration impurity region or a conductive material layer (for example, a silicide layer, a salicide layer, or a layer made of a well-known conductive material) formed on the substrate. Further, it is sufficient if the first power supply line and the second power supply line are configured from a well-known wiring material.

Alternatively, the memory cell of the present disclosure can be formed such that
the source regions of the 1Ath transistor, the 1Bth transistor, the 2Ath transistor, and the 2Bth transistor and the one source/drain regions of the first transfer transistor and the second transfer transistor are formed on a substrate (particularly, just above the substrate), and
the first power supply line and the second power supply line are formed on the substrate (particularly, a top face portion of the substrate). It is to be noted that the memory cell of the present disclosure having such a form as just described is sometimes referred to as a "memory cell of the second form of the present disclosure" for the convenience of description. Further, in this case, the memory cell of the present disclosure can be formed such that the first power supply line and the second power supply line each include a high concentration impurity region or a conductive material layer (for example, a silicide layer, a salicide layer, or a layer made of a well-known conductive material) on the substrate. Further, it is sufficient if the first drain region-connection portion and the second drain region-connection portion are configured from a well-known wiring material.

The memory cell of the present disclosure including the various preferred forms described above can be formed such that
the other source/drain region of the first transfer transistor is connected to a first bit line,
the other source/drain region of the second transfer transistor is connected to a second bit line,
the one source/drain region of the first transfer transistor is connected to the first drain region-connection portion, and
the one source/drain region of the second transfer transistor is connected to the second drain region-connection portion. Further, in this case, the memory cell of the present disclosure can be formed such that the first power supply line, the second power supply line, the first bit line, and the second bit line extend in a first direction. It is sufficient if the first bit line and the second bit line are configured from a well-known wiring material.

Further, the memory cell of the present disclosure including the various preferred forms described above can be formed such that, where a direction in which the first power supply line, the second power supply line, the first bit line, and the second bit line extend is a first direction and a direction orthogonal to the first direction is a second direction, adjacent memory cells are arranged line symmetrically with respect to a boundary line (a boundary line extending in the first direction, a boundary line extending in the second direction, or boundary lines extending in the first direction and the second direction).

Further, the memory cell of the present disclosure including the various preferred forms described above can be formed such that the first CMOS inverter circuit and the second inverter circuit are arranged two times symmetrically with respect to a center axis of the memory cell. The center axis of the memory cell is a straight line parallel to a normal direction to the substrate.

Further, the memory cell of the present disclosure including the various preferred forms described above can be configured such that the gate electrode layer (third gate electrode layer) common to the first transfer transistor and the second transfer transistor serves also as a word line, and the word line extends in a second direction (particularly, for example, in a second direction orthogonal to the first direction) different from a first direction in which the first power supply line, the second power supply line, the first bit line, and the second bit line extend. It is to be noted that the memory cell of the present disclosure having such a form as just described is sometimes referred to as a "memory cell of the first configuration of the present disclosure" for the convenience of description. Further, in this case, the memory cell of the present disclosure including the various preferred forms described above can be configured such that an orthogonal projection image of the first power supply line overlaps with part of an orthogonal projection image of the source region of the 1Ath transistor and besides overlaps with part of an orthogonal projection image of the source region of the 2Ath transistor, and an orthogonal projection image of the second power supply line overlaps with part of an orthogonal projection image of the source region of the 1Bth transistor and besides overlaps with part of an orthogonal projection image of the source region of the 2Bth transistor. Furthermore, the memory cell of the present disclosure including the various preferred forms described above can be formed such that, in the configurations described, the following orthogonal projection images do not substantially overlap with each other:

[A] an orthogonal projection image of the drain region, the channel formation region, and the source region configuring the 1Ath transistor to a virtual plane (virtual vertical plane) vertical to a first direction;

[B] an orthogonal projection image of the drain region, the channel formation region, and the source region configuring the 1Bth transistor to a virtual plane (virtual vertical plane) vertical to the first direction;

[C] an orthogonal projection image of the drain region, the channel formation region, and the source region configuring the 2Ath transistor to a virtual plane (virtual vertical plane) vertical to the first direction;

[D] an orthogonal projection image of the drain region, the channel formation region, and the source region configuring the 2Bth transistor to a virtual plane (virtual vertical plane) vertical to the first direction;

[E] an orthogonal projection image of the one source/drain region, the channel formation region, and the other source/drain region configuring the first transfer transistor to a virtual plane (virtual vertical plane) vertical to the first direction; and

[F] an orthogonal projection image of the one source/drain region, the channel formation region and the other source/drain region configuring the second transfer transistor to a virtual plane (virtual vertical plane) vertical to the first direction. Further, the memory cell of the present disclosure including the various preferred forms described above can be formed such that, in the configurations described, an orthogonal projection image of the drain region, the channel formation region, and the source region configuring the 1Ath transistor to a virtual plane (virtual vertical plane) vertical to the second direction and an orthogonal projection image of the drain region, the channel formation region, and the source region configuring the 1Bth transistor to a virtual plane (virtual vertical plane) vertical to the second direction substantially overlap with each other, an orthogonal projection image of the drain region, the channel formation region, and the source region configuring the 2Ath transistor to a virtual plane (virtual vertical plane) vertical to the second direction and an orthogonal projection image of the drain region, the channel formation region, and the source region configuring the 2Bth transistor to a virtual plane (virtual vertical plane) vertical to the second direction substantially overlap with each other, and an orthogonal projection image of the one source/drain region, the channel formation region, and the other source/drain region configuring the first transfer transistor to a virtual plane (virtual vertical plane) vertical to the second direction and an orthogonal projection image of the one source/drain region, the channel formation region, and the other source/drain region configuring the second transfer transistor to a virtual plane (virtual vertical plane) vertical to the second direction substantially overlap with each other. Further, the memory cell of the present disclosure including the various preferred forms described above can be configured such that, in the configurations described, the first power supply line and the second power supply line are arranged in a first level, and the first bit line and the second bit line are arranged in a second level different from the first level. The first level may be positioned on the substrate side with respect to the second level, or the second level may be positioned on the substrate side with respect to the first level. The word line corresponds to an extension of the third gate electrode layer common to the first transfer transistor and the second transfer transistor and is configured from a material same as that of the third gate electrode layer. The orthogonal projection images substantially overlapping or not overlapping with each other is determined taking a dispersion in fabrication of the various transistors into consideration, and even if orthogonal projection images do not slightly overlap with each other, it is determined that they overlap with each other, and even if orthogonal projection images slightly overlap with each other, it is determined that they do not overlap with each other. This similarly applies to the description given below.

The memory cell of the first configuration of the present disclosure can be formed such that the second power supply line to which the source region of the 1Bth transistor configuring one memory cell is connected is connected to the source region of the 2Bth transistor that configures a memory cell adjacent to the one memory cell along the second direction (memory cell positioned across a boundary line extending in the first direction). In particular, the memory cell of the first configuration of the present disclosure can be formed such that the source region of the 1Bth transistor configuring the one memory cell and the source region of the 2Bth transistor configuring the memory cell adjacent to the one memory cell along the second direction are connected to the same second power supply line. To the first power supply line, for example, $V_{dd}$ is applied, and to the second power supply line, for example, $V_{ss}$ is applied.

Alternatively, the memory cell of the present disclosure including the various preferred forms described above can be configured such that the gate electrode layer of the first transfer transistor and the gate electrode layer of the second transfer transistor are connected to a word line, and the word line extends in a second direction different from a first direction in which the first power supply line, the second power supply line, the first bit line, and the second bit line extend (particularly, for example, in a second direction orthogonal to the first direction). It is to be noted that the memory cell of the present disclosure of such a form as just described is sometimes referred to as "memory cell of the second configuration of the present disclosure" for the convenience of description. Further, in this case, the memory cell of the present disclosure can be configured such that

[a] an orthogonal projection image of the drain region, the channel formation region, and the source region configuring the 1Ath transistor to a virtual plane (virtual vertical plane) vertical to the second direction,

[b] an orthogonal projection image of the drain region, the channel formation region, and the source region configuring the 1Bth transistor to a virtual plane (virtual vertical plane) vertical to the second direction, and

[c] an orthogonal projection image of the one source/drain region, the channel formation region, and the other source/drain region configuring the first transfer transistor to a virtual plane (virtual vertical plane) vertical to the second direction substantially overlap with each other, and

[d] an orthogonal projection image of the drain region, the channel formation region, and the source region configuring the 2Ath transistor to a virtual plane (virtual vertical plane) vertical to the second direction,

[e] an orthogonal projection image of the drain region, the channel formation region, and the source region configuring the 2Bth transistor to a virtual plane (virtual vertical plane) vertical to the second direction, and

[f] an orthogonal projection image of the one source/drain region, the channel formation region, and the other source/drain region configuring the second transfer transistor to a virtual plane (virtual vertical plane) vertical to the second direction substantially overlap with each other. Further, the memory cell of the present disclosure can be configured such that, in the configurations described, the first power supply line, the second power supply line, the first bit line, and the second bit line are arranged in a first level, and the word line is arranged in a second level different from the first level. The first level may be positioned on the substrate side with respect to the second level, or the second level may be positioned on the substrate side with respect to the first level.

Furthermore, the memory cell of the present disclosure including the various preferred forms described above can be formed such that the first power supply line and the second power supply line are not provided above the first transfer transistor and the second transfer transistor.

The CMOS inverter circuit of the present disclosure can be formed such that the drain region of the pMOS transistor and the drain region of the nMOS transistor are formed on the substrate, and the common drain region-connection portion is formed on the substrate, or the CMOS inverter circuit of the present disclosure can be formed such that the source region of the pMOS transistor and the source region of the nMOS transistor are formed on the substrate, and the first power supply line and the second power supply line are formed on the substrate.

In the memory cell or the CMOS inverter circuit of the present disclosure including the various preferred forms and configurations described above (that are hereinafter collectively referred to as "memory cell and so forth of the present disclosure" in some cases), as the substrate, a silicon semiconductor substrate, a SOI (Si On Insulator) substrate and an SGOI (SiGe On Insulator) substrate can be listed.

The memory cell and so forth of the present disclosure can be formed such that the various transistors have a nanowire structure, a nanosheet structure, or a nanotube structure. Further, the memory cell and so forth of the present disclosure can be formed such that the channel formation region is covered over an overall outer circumference thereof with a gate insulating film and that a gate electrode layer is formed in contact with the gate insulating film (that is, on the gate insulating film). In particular, the various transistors are transistors of the vertical structure having a GAA (Gate-All-Around) structure. In the various transistors, a stacked body of the drain region, the channel formation region, and the source region is sometimes referred to as a "channel structure portion" for the convenience of description. It is sufficient if, in the various transistors in the memory cell and so forth of the present disclosure, the number of channel structure portions that configure one transistor is one or two or more. As the formation method of the channel structure portion, an epitaxial CVD method, a plasma CVD method, and an atomic layer CVD method can be listed.

As the material for configuring the channel structure portion of the nMOS transistors and the pMOS transistors, Si or SiGe, Ge, and InGaAs can be listed. In particular, the memory cell and so forth of the present disclosure can be formed such that, in the nMOS transistor, the channel structure portion is configured from silicon (Si), and in the pMOS transistor, the channel structure portion is configured from a silicon-germanium (SiGe), germanium (Ge), or InGaAs.

However, this is not restrictive, and the memory cell and so forth of the present disclosure can be formed such that the channel structure portion of the nMOS transistor is configured from silicon-germanium (SiGe) and the channel structure portion of the pMOS transistor is configured from silicon (Si), germanium (Ge), or InGaAs, or can be configured such that the channel structure portion of the nMOS transistor is configured from germanium (Ge) and the channel structure portion of the pMOS transistor is configured from silicon (Si), silicon-germanium (SiGe) or InGaAS, or else can be formed such that the channel structure portion of the nMOS transistor is configured from InGaAs and the channel structure portion of the pMOS transistor is configured from silicon (Si), silicon-germanium (SiGe), or germanium (Ge).

Here, whether the MOS transistor is of the n channel type or of the p channel type is determined solely by selection of a material for configuring the gate electrode layer from the point of view of obtaining a work function optimum for each MOS transistor. In the case where the channel structure portion is configured from Si and the semiconductor apparatus is to be made an n-channel type semiconductor apparatus, TiN, TaN, Al, TiAl, and W can be listed as the material for configuring the gate electrode layer. Meanwhile, in the case where the channel structure portion is configured from SiGe and the semiconductor apparatus is to be made a p-channel semiconductor apparatus, TiN and W can be listed as the material for configuring the gate electrode layer. As the material for configuring the gate insulating film, it is possible to list SiN, SiON, and $SiO_2$, and it is also possible to list a high permittivity material (what is generally called a High-k material), for example, $HfO_2$, HfAlON, and $Y_2O_3$.

Alternatively, it is possible to configure the channel structure portion of the nMOS transistor and the pMOS transistor from silicon (Si). Further, in this case, as the material for configuring the gate electrode layer of the nMOS transistor, it is possible to list Ti, V, Cr, Zr, Nb, Mo, Hf, Ta, W, and a compound containing any of the metals, and it is possible to list, as the material for configuring the gate electrode layer of the pMOS transistor, Fe, Co, Ni, Cu, Ru, Rh, Pd, Ag, Os, Ir, Pt, Au, and a compound containing any of the metals.

In the nanowire structure or the nanotube structure, the drain region and the source region (or the one and the other source/drain regions) extend from the opposite ends of a channel formation region in the form of a wire or a tube having a diameter of, for example, 5 to 10 nm. Meanwhile, in the nanosheet structure, the drain region and the source region (or the one and the other source/drain regions) extend from the opposite ends of a channel formation region having a substantially rectangular cross sectional shape having a width×thickness of, for example, (10 to 50 nm)×(5 to 10 nm).

As the conductive material or the wiring material, for example, silicon (Si), aluminum or aluminum-based alloy (for example, pure aluminum, Al—Si, Al—Cu, Al—Si—Cu, Al—Ge, and Al—Si—Ge), polysilicon, copper, copper alloy, tungsten, tungsten alloy, titanium, titanium alloy (including TiW, TiNW, TiN, and TiAl), $WSi_2$, $MoSi_2$, and TaN can be listed. Further, in the case where the substrate is configured from a silicon semiconductor substrate, although plural insulating layers or interlayer insulating layers are provided on or above the substrate, as the material for configuring the insulating layers or the interlayer insulating layers, an $SiO_x$-based material (material configuring a silicon-based oxide film) such as $SiO_2$, NSG (non-doped silicate glass), BPSG (boron-phosphorus-silicate glass), PSG, BSG, AsSG, SbSG, PbSG, SOG (spin on glass), LTO (Low Temperature Oxide, low temperature CVD-$SiO_2$), low melting point glass, or glass paste; a SiN-based material including a SiON-based material such as SiN or SiON; SiOC; SiOF; and SiCN can be listed. Alternatively, it is also possible to list inorganic insulating materials such as titanium oxide ($TiO_2$), tantalum oxide ($Ta_2O_5$), aluminum oxide ($Al_2O_3$), magnesium oxide (MgO), chromium oxide ($CrO_x$), zirconium oxide ($ZrO_2$), niobium oxide ($Nb_2O_5$), tin oxide ($SnO_2$), and vanadium oxide ($VO_x$). Alternatively, it is possible to list various resins such as polyimide-based resin, epoxy-based resin, and acrylic resin or low permittivity insulating materials such as SiOCH, organic SOG, and fluorine resin (for example, a resin having a permittivity k ($=\varepsilon/\varepsilon_0$) of, for example, 3.5 or less, particularly, for example, fluorocarbon, cycloperfluorocabon polymer, benzocyclobutene, cyclic fluororesin, polytetrafluoroethylene, amorphous tetrafluoroethylene, polyallyl ether, allyl fluoride ether, polyimide fluoride, amorphous carbon, parilen (polyparaxylylene), and fluoride fullerenes). It is also possible to exemplify Silk (which is a trademark of The Dow Chemical Co. and is a coating type low permittivity interlayer insulating film material), Flare (which is a trademark of Honeywell Electronic Materials Co. and is a polyallyl ether (PAE)-based material). Further, they can be used solely or in a suitable combination. The insulating layer or the interlayer insulating layer can be formed on the basis of well-known methods such as various CVD methods, various coating methods, various PVD methods including a sputtering method and a vacuum deposition method, various printing methods such as a screen printing method, a plating method, an electrodeposition method, an immersion method, and a sol-gel method.

In the memory cell and so forth of the present disclosure, the voltage to be applied to the gate electrode layer of the various transistors is, for example, 0.5 to 0.8 volts. The memory cell and the CMOS inverter circuit of the present disclosure can be applied not only to a digital circuit such as a logic circuit, for example, but also to a logic circuit for performing control on an imaging apparatus or a driving circuit for an imaging device (light receiving device) configuring an imaging apparatus, for example. However, they are not restrictive.

Working Example 1

The working example 1 relates to the memory cell and the CMOS inverter circuit of the present disclosure, and particularly relates to a memory cell of the first form of the present disclosure and a memory cell of the first configuration of the present disclosure.

Figure 1:
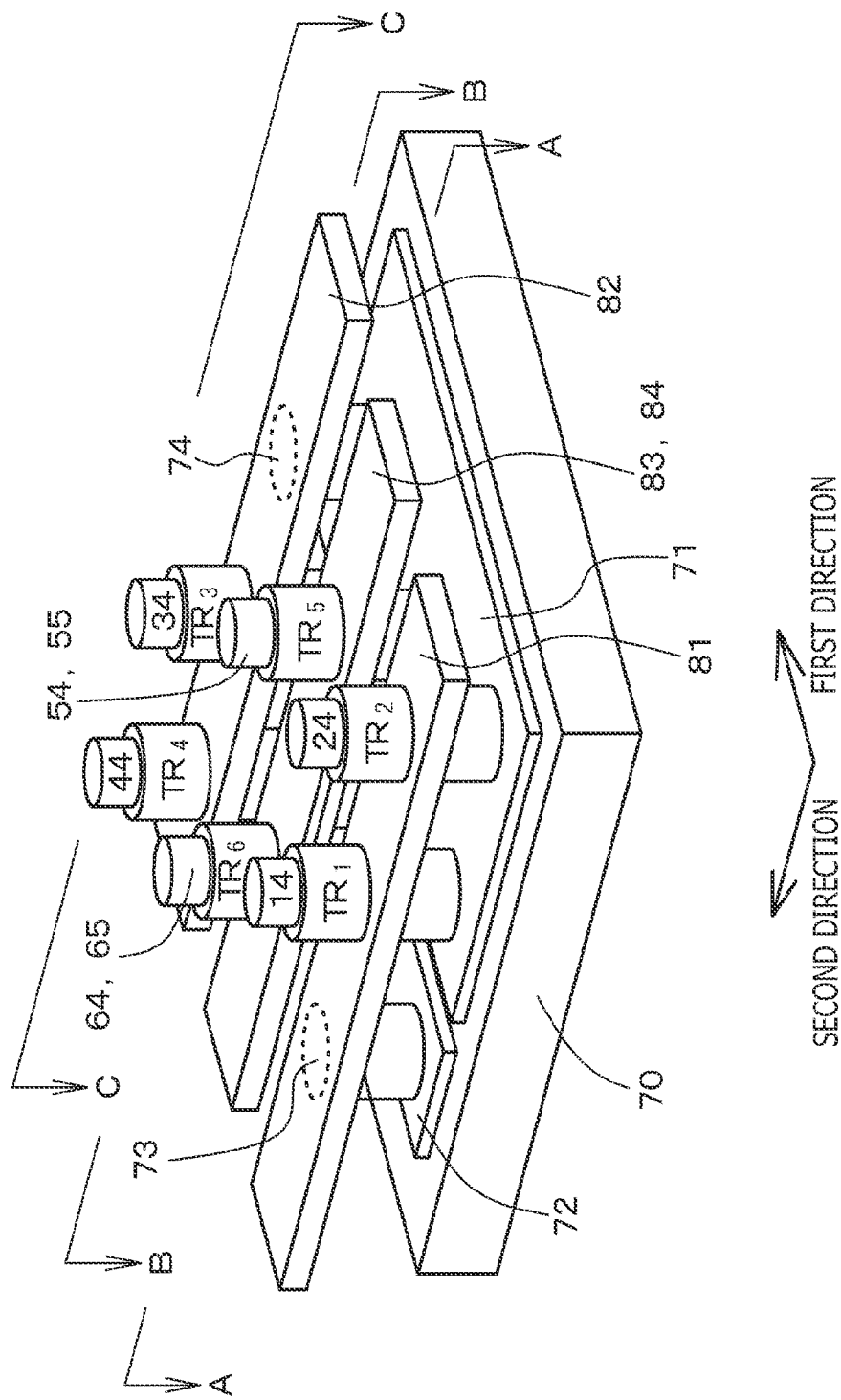
FIG. 1 is a schematic perspective view of part of a memory cell of a working example 1.
Figure 2:
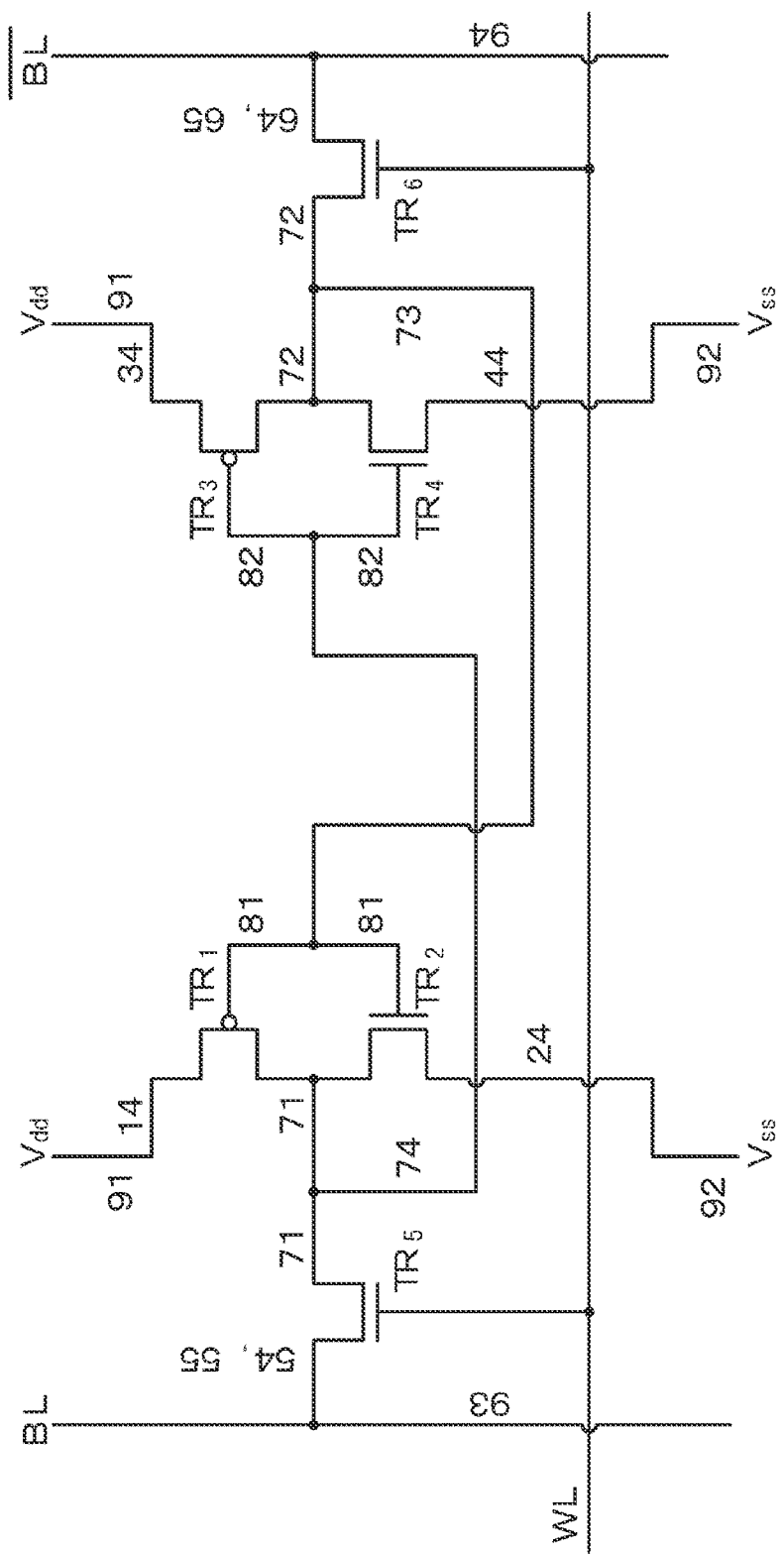
FIG. 2 is an equivalent circuit diagram of the memory cell of the working example 1.
Figure 3A:
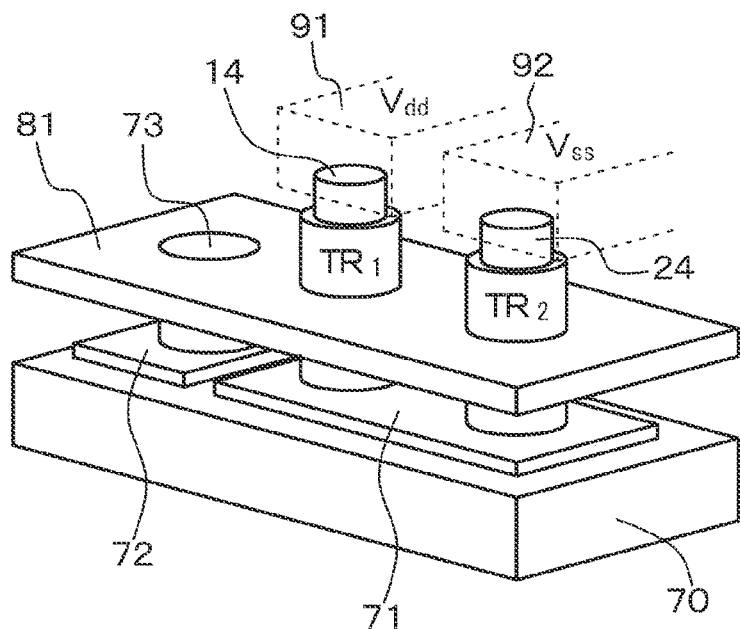
FIGS. 3A and 3B are each a schematic perspective view of part of a CMOS inverter circuit of the working example 1 and an equivalent circuit diagram of the CMOS inverter circuit of the working example 1.
Figure 3B:
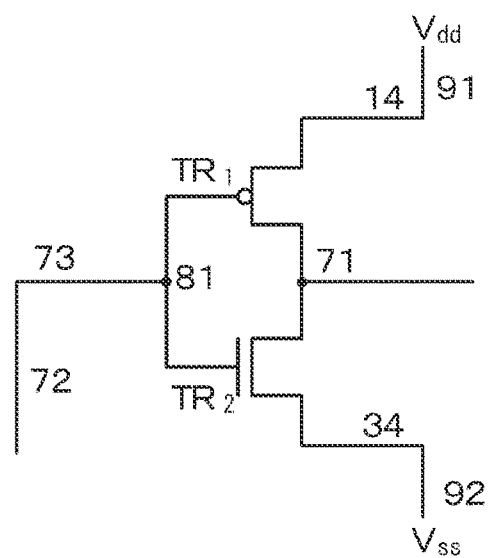
Figure 5:
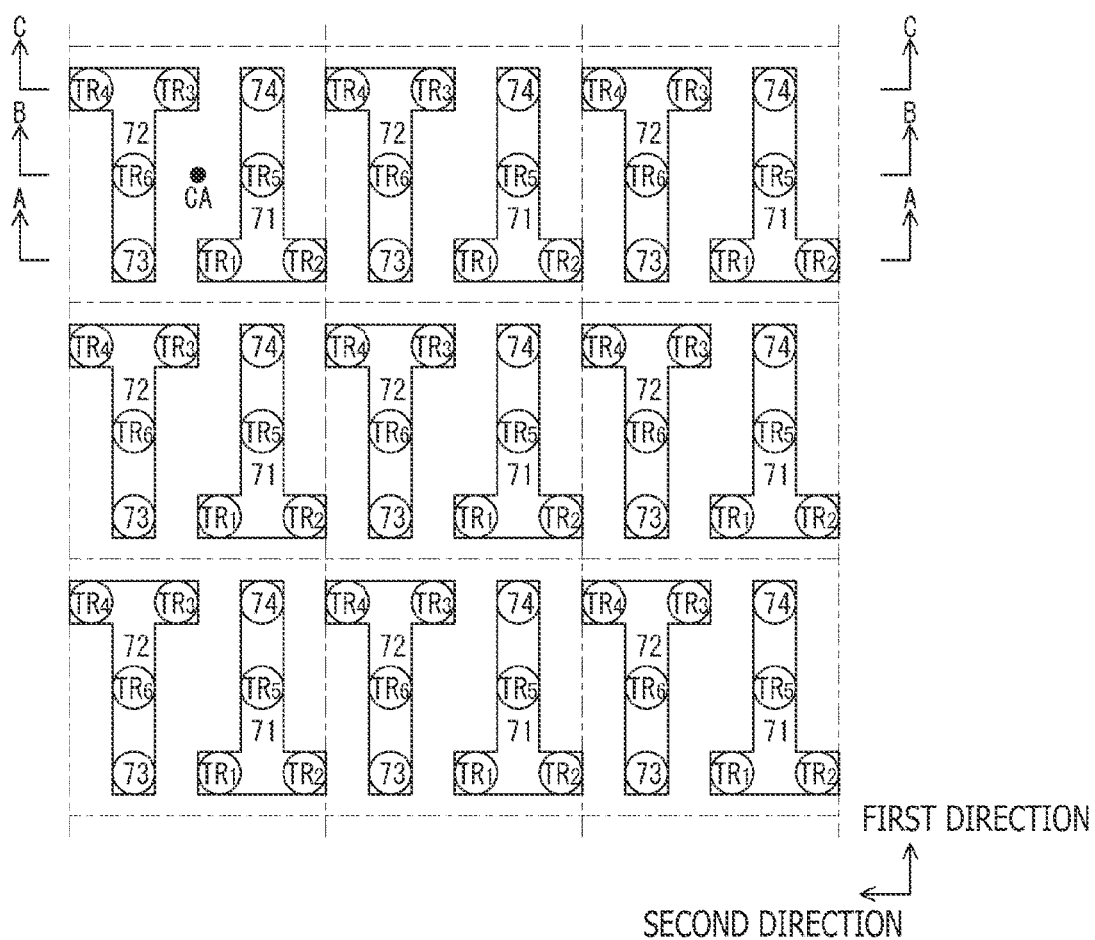
FIG. 5 is a conceptual view of an arrangement state of components configuring the memory cell of the working example 1 when the memory cell of the working example 1 is cut along a virtual horizontal plane including the arrow marks A-A of FIG. 4A.
Figure 6:
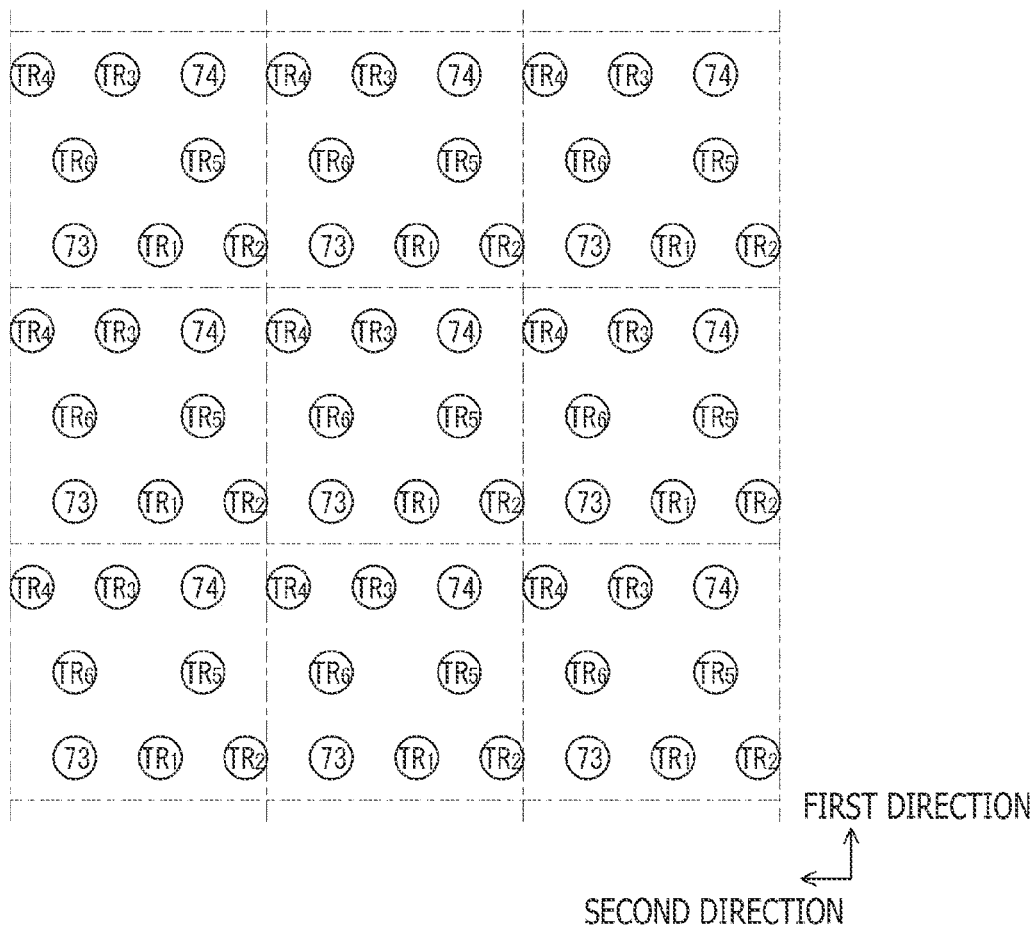
FIG. 6 is a conceptual view of an arrangement state of components configuring the memory cell of the working example 1 when the memory cell of the working example 1 is cut along a virtual horizontal plane including the arrow marks B-B of FIG. 4A.
Figure 7:
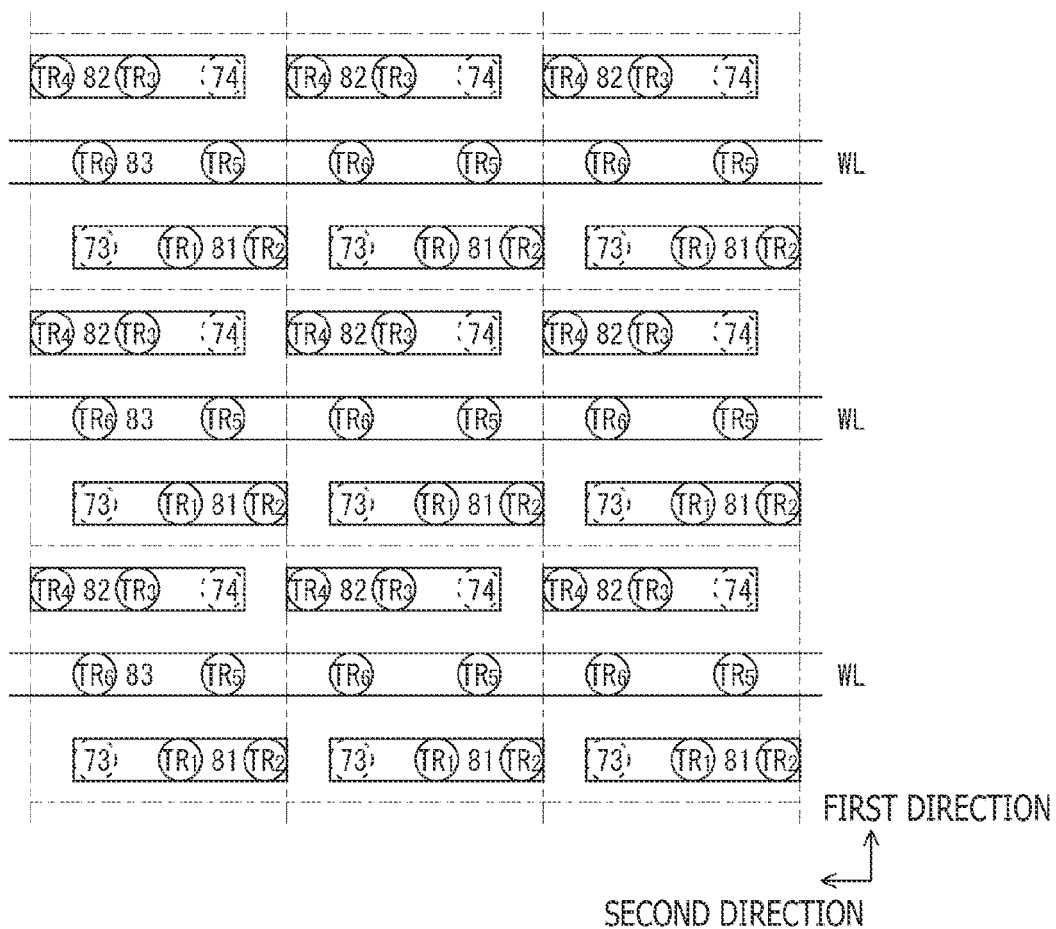
FIG. 7 is a conceptual view of an arrangement state of components configuring the memory cell of the working example 1 when the memory cell of the working example 1 is cut along a virtual horizontal plane including the arrow marks C-C of FIG. 4A.
Figure 8:
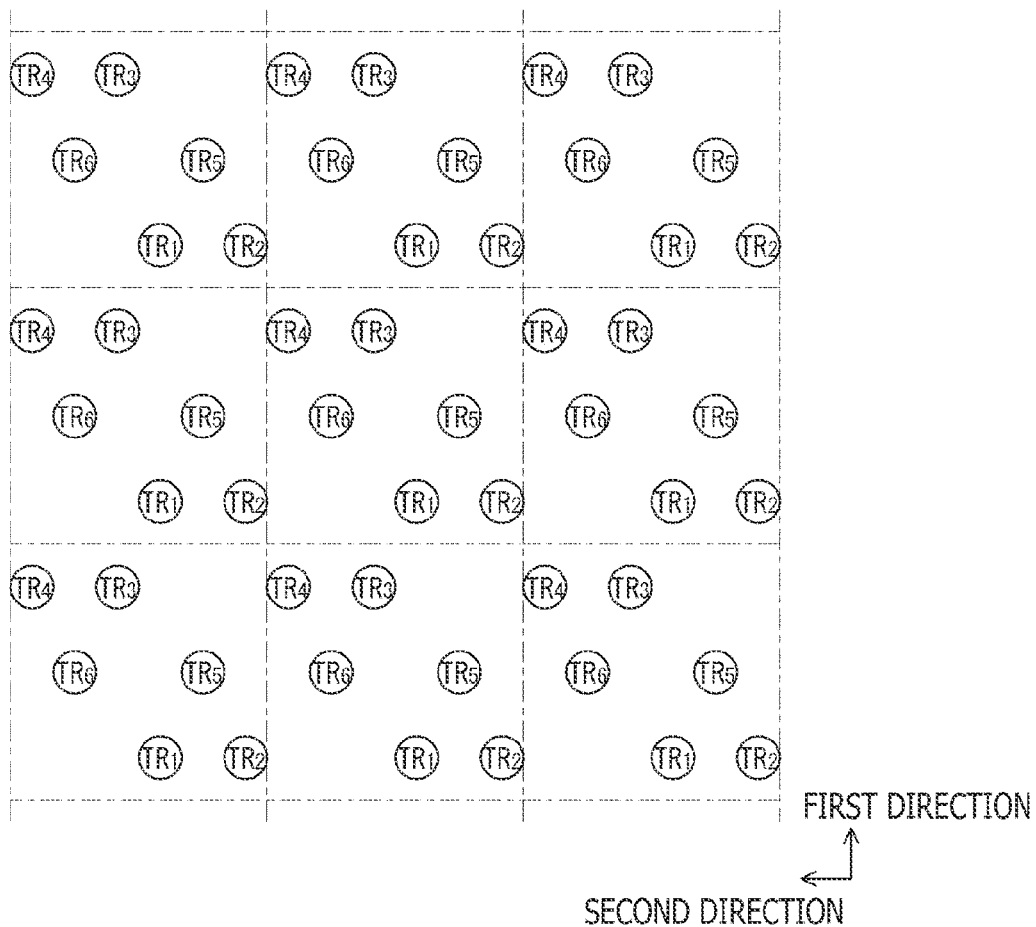
FIG. 8 is a conceptual view of an arrangement state of components configuring the memory cell of the working example 1 when the memory cell of the working example 1 is cut along a virtual horizontal plane including arrow marks D-D of FIG. 4A.

A schematic perspective view of part of the memory cell of the working example 1 is depicted in FIG. 1, and an equivalent circuit diagram of the memory cell of the working example 1 is depicted in FIG. 2. A schematic partial sectional view of the memory cell of the working example 1 taken along arrow marks A-A of FIGS. 1 and 5 is depicted in FIG. 4A; a schematic partial sectional view of the memory cell of the working example 1 taken along arrow marks B-B of FIGS. 1 and 5 is depicted in FIG. 4B; and a schematic partial sectional view of the memory cell of the working example 1 taken along arrow marks C-C of FIGS. 1 and 5 is depicted in FIG. 4C. Further, conceptual diagrams of an arrangement state of components that configure the memory cell of the working example 1 when the memory cell of the working example 1 is cut along a vertical horizontal plane including arrow marks A-A of FIG. 4A, a virtual horizontal plane including arrow marks B-B of FIG. 4A, a virtual horizontal plane including arrow marks C-C of FIG. 4A, a virtual horizontal plane including arrow marks D-D of FIG. 4A, a virtual horizontal plane including arrow marks E-E of FIG. 4A, and a virtual horizontal plane including arrow marks F-F of FIG. 4A of the memory cell of the working example 1 are depicted in FIGS. 5, 6, 7, 8, 9, and 10. Further, a schematic perspective view of part of the CMOS inverter circuit of the working example 1 is depicted in FIG. 3A, and an equivalent circuit diagram is depicted in FIG. 3B. It is to be noted that part of hatching lines are omitted in FIGS. 4A, 4B, and 4C. Further, in FIGS. 5, 6, 7, 8, 9, and 10, nine memory cells are depicted, and a boundary line between memory cells is indicated by a dashed line.

Each of the memory cells of the working example 1 or the working examples 2 to 4 hereinafter described is a memory cell including a flip-flop circuit that includes a first CMOS inverter circuit and a second inverter circuit and two transfer transistors $TR_5$ and $TR_6$. The first CMOS inverter circuit includes a 1Ath transistor $TR_1$ and a 1Bth transistor $TR_2$, and the second CMOS inverter circuit includes a 2Ath transistor $TR_3$ and a 2Bth transistor $TR_4$. Here, the 1Ath transistor $TR_1$ includes a pMOS transistor that includes a drain region 11, a channel formation region 12, and a source region 13 stacked one on another and that further includes a gate electrode layer 81. Further, the 1Bth transistor $TR_2$ includes an nMOS transistor that includes a drain region 21, a channel formation region 22, and a source region 23 stacked one on another and that further includes a gate electrode layer 81. Further, the 2Ath transistor $TR_3$ includes a pMOS transistor that includes a drain region 31, a channel formation region 32, and a source region 33 stacked one on another and that further includes a gate electrode layer 82. Further, the 2Bth transistor $TR_4$ includes an nMOS transistor that includes a drain region 41, a channel formation region 42, and a source region 43 and that further includes a gate electrode layer 82. Each of the transfer transistors $TR_5$ and $TR_6$ includes one source/drain region 51 or 61, a channel formation region 52 or 62, and another source/drain region 53 or 63 stacked one on another and includes an nMOS transistor. However, it is also possible to configure each of the transfer transistors $TR_5$ and $TR_6$ otherwise from a pMOS transistor.

Further, in the memory cell of the working example 1 or any of the working examples 2 to 4 described below, the drain region 11 of the 1Ath transistor $TR_1$ and the drain region 21 of the 1Bth transistor $TR_2$ are connected to a common first drain region-connection portion 71, the drain region 31 of the 2Ath transistor $TR_3$ and the drain region 41 of the 2Bth transistor $TR_4$ are connected to a common second drain region-connection portion 72, the gate electrode layer (first gate electrode layer) 81 common to the 1Ath transistor $TR_1$ and the 1Bth transistor $TR_2$ is connected to the second drain region-connection portion 72 through a first gate electrode-connection portion (via or connection hole) 73, the gate electrode layer (second gate electrode layer) 82 common to the 2Ath transistor $TR_3$ and the 2Bth transistor $TR_4$ is connected to the first drain region-connection portion 71 through a second gate electrode-connection portion (via or connection hole) 74, the source region 13 of the 1Ath transistor $TR_1$ and the source region 33 of the 2Ath transistor $TR_3$ are connected to a common first power supply line 91, and the source region 23 of the 1Bth transistor $TR_2$ and the source region 43 of the 2Bth transistor $TR_4$ are connected to a common second power supply line 92.

Alternatively, in the memory cell of the working example 1 or the working example 2 hereinafter described, the source region 13 of the 1Ath transistor $TR_1$ and the source region 33 of the 2Ath transistor $TR_3$ are connected to the common first power supply line 91 through the connection holes 14 and 34, and the source region 23 of the 1Bth transistor $TR_2$ and the source region 43 of the 2Bth transistor $TR_4$ are connected to the common second power supply line 92 through connection holes 24 and 44.

Further, the CMOS inverter circuit of the working example 1 or any of the working examples 2 to 4 described below is configured such that the CMOS inverter circuit includes the pMOS transistor $TR_1$ that includes the drain region 11, the channel formation region 12, and the source region 13 stacked one on another and further includes the gate electrode layer 81, and the nMOS transistor $TR_2$ that includes the drain region 21, the channel formation region 22, and the source region 23 stacked one on another and further includes the gate electrode layer 81, the drain region 11 of the pMOS transistor $TR_1$ and the drain region 21 of the nMOS transistor $TR_2$ are connected to the common first drain region-connection portion 71, the gate electrode layer 81 common to the pMOS transistor $TR_1$ and the nMOS transistor $TR_2$ is connected to the common gate wiring portion 72 formed on a substrate 70 (particularly, on a top face portion of the substrate 70), through the gate electrode-connection portion (via or connection hole) 73, the source region 13 of the pMOS transistor $TR_1$ is connected to the first power supply line 91; and the source region 23 of the nMOS transistor $TR_2$ is connected to the second power supply line 92.

Alternatively, the CMOS inverter circuit of the working example 1 or any of the working examples 2 to 4 described below is configured such that the CMOS inverter circuit includes the pMOS transistor $TR_3$ that includes the drain region 31, the channel formation region 32, and the source region 33 stacked one on another and further includes the gate electrode layer 82, and the nMOS transistor $TR_4$ that includes the drain region 41, the channel formation region 42, and the source region 43 stacked one on another and further includes the gate electrode layer 82, the drain region 31 of the pMOS transistor $TR_3$ and the drain region 41 of the nMOS transistor $TR_4$ are connected to the common drain region-connection portion 72, the gate electrode layer 82 common to the pMOS transistor $TR_3$ and the nMOS transistor $TR_4$ is connected to the common gate wiring portion 71 formed on the substrate 70 (particularly, on the top face portion of the substrate 70), through the gate electrode-connection portion (via or connection hole) 74, the source region 33 of the pMOS transistor $TR_3$ is connected to the first power supply line 91, and the source region 43 of the nMOS transistor $TR_4$ is connected to the second power supply line 92.

Further, in the CMOS inverter circuit of the working example 1 or the working example 2 hereinafter described, the drain regions 11 and 31 of the pMOS transistors $TR_1$ and $TR_3$ and the drain regions 21 and 41 of the nMOS transistors $TR_2$ and $TR_4$ are formed on the substrate 70 (particularly, just above the substrate 70), and the common drain region-connection portions 71 and 72 are formed on the substrate 70 (particularly, on the top face portion of the substrate 70).

Further, in the memory cell of the working example 1 or the working example 2 hereinafter described, the drain regions 11, 21, 31, and 41 of the 1Ath transistor $TR_1$, the 1Bth transistor $TR_2$, the 2Ath transistor $TR_3$, and the 2Bth transistor $TR_4$ and the one source/drain regions 51 and 61 of the first transfer transistor $TR_5$ and the second transfer transistor $TR_6$ are formed on the substrate 70 (particularly, just above the substrate 70), and the first drain region-connection portion 71 and the second drain region-connection portion 72 are formed on the substrate 70 (particularly, on the top face portion of the substrate 70). The first drain region-connection portion 71 and the second drain region-connection portion 72 include a high concentration impurity region or a conductive material layer formed on the substrate 70 (particularly, on the top face portion of the substrate 70) or include a layer having a resistance component such as a diffusion resistance layer or a metal material layer surrounded by an insulating material layer so as to be insulated from the surroundings.

In the memory cell of the working example 1, the other source/drain region 53 of the first transfer transistor $TR_5$ is connected to a first bit line 93 (BL) through connection holes 54 and 55, and the other source/drain region 63 of the second transfer transistor $TR_6$ is connected to a second bit line 94 (BL') through connection holes 64 and 65. The one source/drain region 51 of the first transfer transistor $TR_5$ is connected to the first drain region-connection portion 71, and the one source/drain region 61 of the second transfer transistor $TR_6$ is connected to the second drain region-connection portion 72. The first power supply line 91, the second power supply line 92, the first bit line 93, and the second bit line 94 extend in a first direction and are configured from a well-known wiring material. It is to be noted that, although the second bit line 94 is usually represented by a symbol BL with "−" added thereabove, it is sometimes represented as "BL'" in the present specification.

Figure 15:
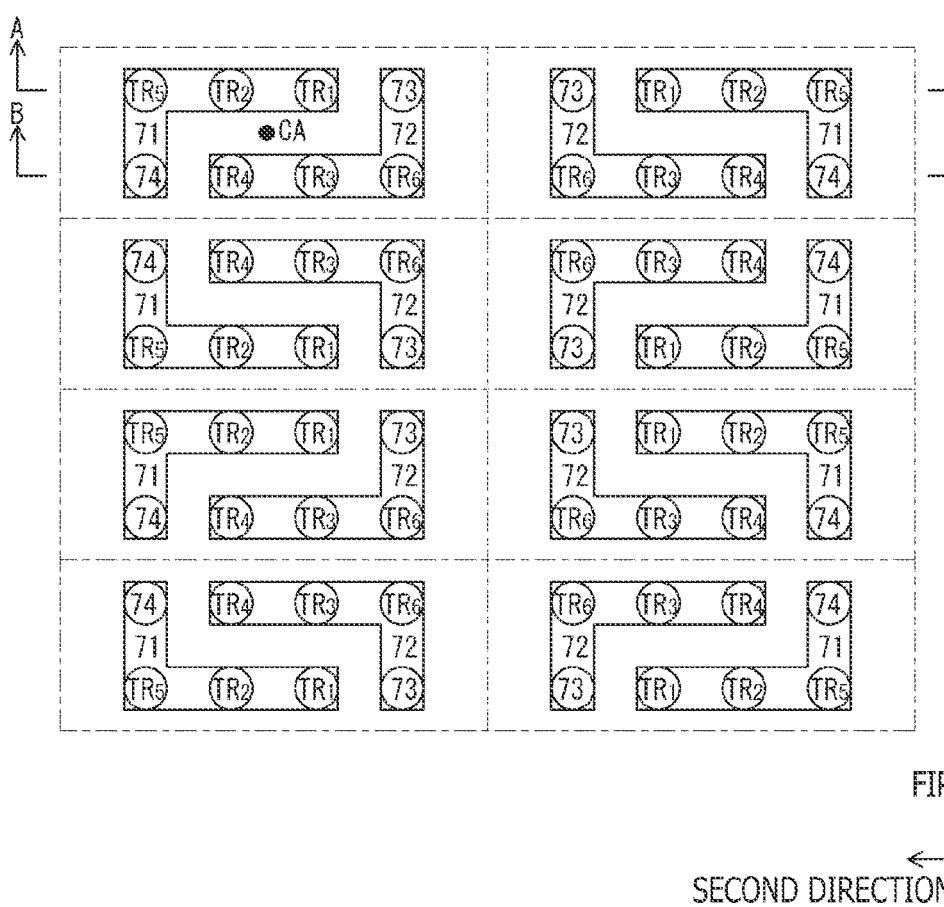
FIG. 15 is a conceptual view of an arrangement state of components configuring the memory cell of the working example 2 when the memory cell of the working example 2 is cut along a virtual horizontal plane including arrow marks A-A of FIG. 13A.
Figure 16:
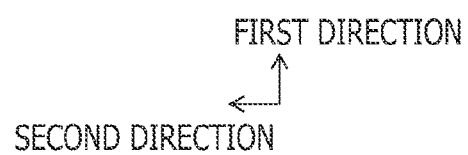
FIG. 16 is a conceptual view of an arrangement state of components configuring the memory cell of the working example 2 when the memory cell of the working example 2 is cut along a virtual horizontal plane including arrow marks B-B of FIG. 13A.

In the memory cell of the working example 1 or the working example 3 hereinafter described, the first CMOS inverter circuit and the second inverter circuit are arranged two times symmetrically with respect to the center axis of the memory cell. In FIG. 5 or 15, the center axis of one memory cell is represented by a black circle "CA."

Figure 9:
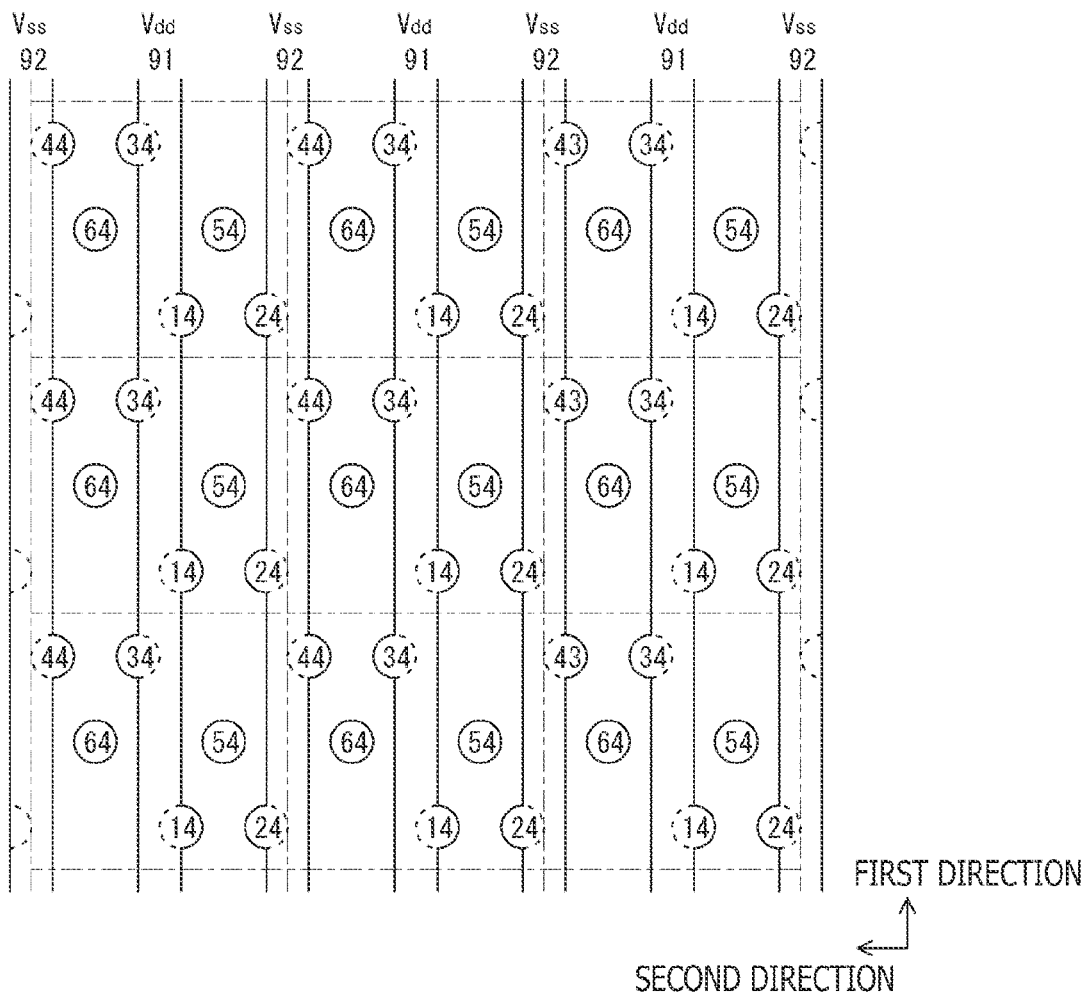
FIG. 9 is a conceptual view of an arrangement state of components configuring the memory cell of the working example 1 when the memory cell of the working example 1 is cut along a virtual horizontal plane including arrow marks E-E of FIG. 4A.
Figure 10:
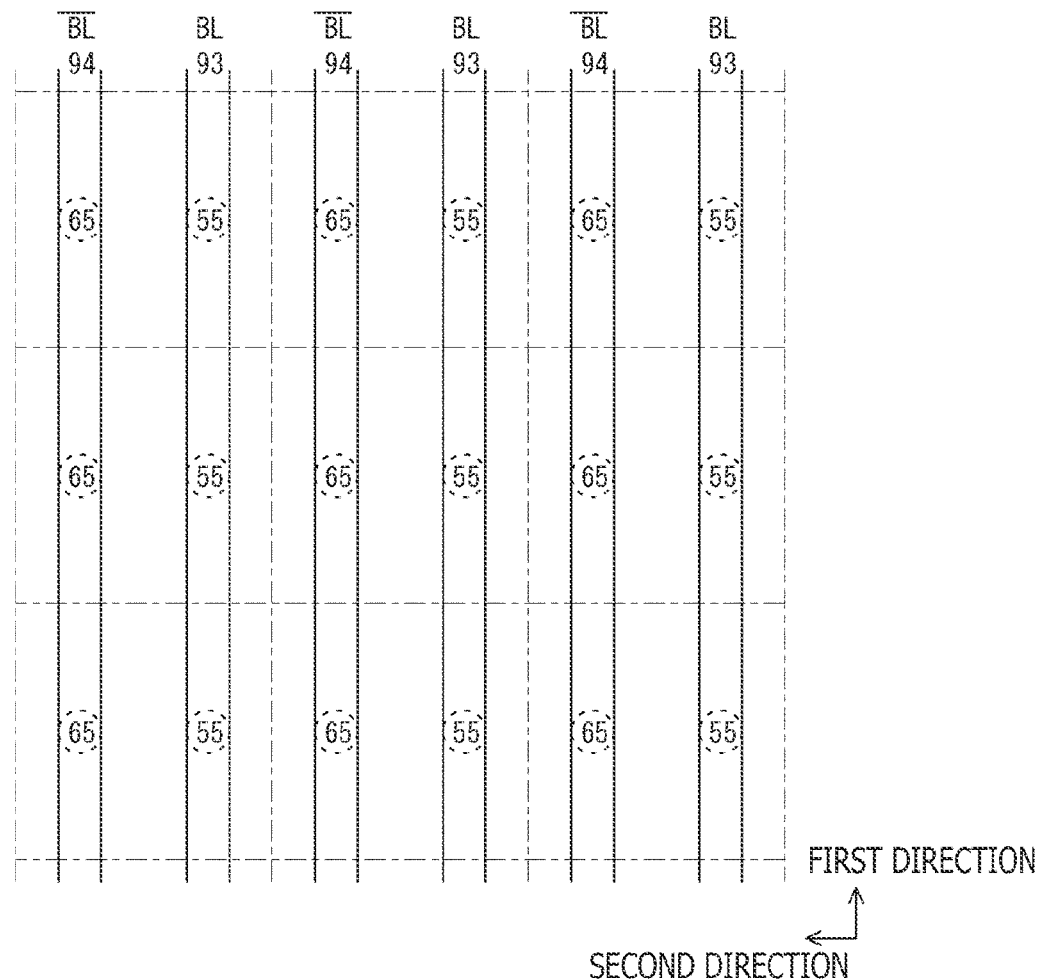
FIG. 10 is a conceptual view of an arrangement state of components configuring the memory cell of the working example 1 when the memory cell of the working example 1 is cut along a virtual horizontal plane including arrow marks F-F of FIG. 4A.

In the memory cell of the working example 1 or the working example 3 hereinafter described, the gate electrode layer (third gate electrode layer) 83 common to the first transfer transistor $TR_5$ and the second transfer transistor $TR_6$ serves also as a word line WL. The word line WL extends in a second direction different from the first direction (particularly, for example, in a second direction orthogonal to the first direction) and is connected to a peripheral circuit. As depicted in FIG. 9, an orthogonal projection image of the first power supply line 91 overlaps with part of an orthogonal projection image of the source region 13 of the 1Ath transistor $TR_1$ and besides overlaps with part of an orthogonal projection image of the source region 33 of the 2Ath transistor $TR_3$. An orthogonal projection image of the second power supply line 92 overlaps with part of an orthogonal projection image of the source region 23 of the 1Bth transistor $TR_2$ and besides overlaps with part of an orthogonal projection image of the source region 43 of the 2Bth transistor $TR_4$. However, the following orthogonal projection images are not substantially overlapping with each other:

[A] an orthogonal projection image of the drain region 11, the channel formation region 12, and the source region 13 configuring the 1Ath transistor $TR_1$ (hereinafter, sometimes referred to as a "channel structure portion of the 1Ath transistor $TR_1$") to a virtual vertical plane vertical to the first direction;

[B] an orthogonal projection image of the drain region 21, the channel formation region 22, and the source region 23 configuring the 1Bth transistor $TR_2$ (hereinafter, sometimes referred to as a "channel structure portion of the 1Bth transistor $TR_2$") to the virtual vertical plane vertical to the first direction,

[C] an orthogonal projection image of the drain region 31, the channel formation region 32, and the source region 33 configuring the 2Ath transistor $TR_3$ (hereinafter, sometimes referred to as a "channel structure portion of the 2Ath transistor $TR_3$") to the virtual vertical plane vertical to the first direction;

[D] an orthogonal projection image of the drain region 41, the channel formation region 42, and the source region 43 configuring the 2Bth transistor $TR_4$ (hereinafter, sometimes referred to as a "channel structure portion of the 2Bth transistor $TR_4$") to the virtual vertical plane vertical to the first direction;

[E] an orthogonal projection image of the one source/drain region 51, the channel formation region 52, and the other source/drain region 53 configuring the first transfer transistor $TR_5$ (hereinafter, sometimes referred to as a "channel structure portion of the first transfer transistor $TR_5$") to the virtual vertical plane vertical to the first direction; and

[F] an orthogonal projection image of the one source/drain region 61, the channel formation region 62, and the other source/drain region 63 configuring the second transfer transistor $TR_6$ (hereinafter, sometimes referred to as a "channel structure portion of the second transfer transistor $TR_6$") to the virtual vertical plane vertical to the first direction. Here, the virtual horizontal plane and the virtual vertical plane signify a virtual plane horizontal to and a virtual plane vertical to the surface of the substrate.

Further, in the memory cell of the working example 1 or the working example 3 hereinafter described, an orthogonal projection image of the channel structure portion of the 1Ath transistor $TR_1$ and an orthogonal projection image of the channel structure portion of the 1Bth transistor $TR_2$ to a virtual vertical plane vertical to the second direction substantially overlap with each other, an orthogonal projection image of the channel structure portion of the 2Ath transistor $TR_3$ and an orthogonal projection image of the channel structure portion of the 2Bth transistor $TR_4$ to the virtual vertical plane vertical to the second direction substantially overlap with each other, and an orthogonal projection image of the channel structure portion of the first transfer transistor $TR_5$ and an orthogonal projection image of the channel structure portion of the second transfer transistor $TR_6$ to the virtual vertical plane vertical to the second direction substantially overlap with each other.

Further, in the memory cell of the working example 1, the first power supply line 91 and the second power supply line 92 are arranged in a first level, and the first bit line 93 and the second bit line 94 are arranged in a second level different from the first level. Although, in the example depicted, the first level is positioned on the substrate side with respect to the second level, the second level may be positioned on the substrate side with respect to the first level.

Further, in the memory cell of the working example 1 or the working example 3 hereinafter described, the second power supply line 92 to which the source region 23 of the 1Bth transistor $TR_2$ configuring a certain memory cell is connected to the source region 43 of the 2Bth transistor $TR_4$ configuring a memory cell adjacent to the certain memory cell along the second direction (memory cell positioned across a boundary line extending in the first direction). In particular, the source region 23 of the 1Bth transistor $TR_2$ configuring one memory cell and the source region 43 of the 2Bth transistor $TR_4$ configuring a memory cell adjacent to the one memory cell along the second direction are connected to the same second power supply line 92. Applied to the first power supply line 91 is $V_{dd}$, and applied to the second power supply line 92 is $V_{ss}$. Above the first transfer transistor $TR_5$ and the second transfer transistor $TR_6$, the first power supply line 91 and the second power supply line 92 are not provided.

In the working example 1 or any of the working examples 2 to 4 hereinafter described, the transistors $TR_1$, $TR_2$, $TR_3$, $TR_4$, $TR_5$, and $TR_6$ (that are hereinafter sometimes referred to as "transistor $TR_1$ and so forth" for the convenience of description) have a nanowire structure. The channel formation regions 12, 22, 32, 42, 52, and 62 are covered over an overall circumference thereof with a gate insulating film 84, and the gate electrode layers 81, 82, and 83 are formed in contact with the gate insulating film 84 (i.e., on the gate insulating film 84). The substrate 70 includes, for example, a silicon semiconductor substrate. In the transistor $TR_1$ and so forth, the number of channel structure portions configuring one transistor may be one or two or more. The channel structure portions of the nMOS transistors $TR_2$, $TR_4$, $TR_5$, and $TR_6$ are configured from silicon (Si), and the channel structure portions of the pMOS transistors $TR_1$ and $TR_3$ are configured from silicon-germanium (SiGe). As the materials for configuring the gate electrode layers 81 and 83 of the nMOS transistors $TR_2$, $TR_4$, $TR_5$, and $TR_6$ and the gate electrode layer 82 of the pMOS transistors $TR_1$ and $TR_3$, TiN can be used. As the material for configuring the gate insulating film 84, SiN, SiON, and $SiO_2$ can be listed, and high permittivity materials (what are generally called High-k materials), for example, $HfO_2$, HfAlON, and $Y_2O_3$ can be listed.

In the following, an overview of a fabrication method of the memory cell of the working example 1 is described. However, the fabrication method of the memory cell is not limited to the method described below.

[Step 100]

First, a device isolation region (not depicted) having an STI (Shallow Trench Isolation) structure is formed on the basis of a well-known method in a predetermined region of a substrate 70 including a silicon semiconductor substrate, so that an activation region does not short-circuit.

[Step 110]

Then, for well formation, ion implantation is performed into the predetermined region of the substrate 70. Thereafter, a first drain region-connection portion 71 and a second drain region-connection portion 72 each including a high concentration impurity region are formed on the substrate 70 on the basis of a well-known ion implantation method. Then, after an insulating layer 79A is formed over an overall area on the basis of a well-known method, a second gate electrode-connection portion (via or connection hole) 74 and a first gate electrode-connection portion (via or connection hole) 73 are formed in the insulating layer 79A above the first drain region-connection portion 71 and the second drain region-connection portion 72, respectively.

[Step 120]

Then, an opening is formed at portions of the insulating layer 79A at which the drain region 11 of the 1Ath transistor $TR_1$ and the drain region 31 of the 2Ath transistor $TR_3$ are to be formed. Following this, drain regions 11 and 31 of transistors $TR_1$ configured from SiGe containing a p-type impurity are formed on the basis of an epitaxial growth method, and channel formation regions 12 and 32 of the transistors $TR_1$ configured from SiGe are formed, whereafter source regions 13 and 33 of the transistors $TR_1$ configured from SiGe containing a p-type impurity are formed. Then, the channel formation regions 12 and 32 and the source regions 13 and 33 of the 1Ath transistor $TR_1$ and the 2Ath transistor $TR_3$ are covered with an appropriate mask material.

[Step 130]

Then, an opening is formed at portions of the insulating layer 79A at which the drain region 21 of the 1Bth transistor $TR_2$, the drain region 41 of the 2Bth transistor $TR_4$, the one source/drain region 51 of the first transfer transistor $TR_5$, and the one source/drain region 61 of the second transfer transistor $TR_6$ are to be formed. Then, drain regions 21 and 41 and the one source/drain regions 51 and 61 of the transistors configured from Si containing an n-type impurity are formed on the basis of an epitaxial growth method, and then channel formation regions 22, 42, 52, and 62 of the transistors configured from Si are formed, whereafter source regions 23 and 43 and the other source/drain regions 53 and 63 of the transistors configured from Si containing an n-type impurity are formed. Thereafter, the mask material is removed.

[Step 140]

Then, a gate insulating film 84 is formed on the basis of a well-known method on an outer face of the channel formation region 12 of the 1Ath transistor $TR_1$, the channel formation region 22 of the 1Bth transistor $TR_2$, the channel formation region 32 of the 2Ath transistor $TR_3$, the channel formation region 42 of the 2Bth transistor $TR_4$, the channel formation region 52 of the first transfer transistor $TR_5$, and the channel formation region 62 of the second transfer transistor $TR_6$, which project on the insulating layer 79A. Although the gate insulating film 84 is formed also on an outer face of the source regions 13, 23, 33, 43, 53, and 63 of the transistors, there is no problem even if the gate insulating film 84 at the portions is left. Further, the gate insulating film at the portions is not depicted.

[Step 150]

Thereafter, gate electrode layers 81, 82 and 83 configured from TiN are formed on the basis of a well-known method on the insulating layer 79A in such a manner as to surround the gate insulating film 84 formed on the outer face of the channel formation regions 12, 22, 32, 42, 52, and 62 of the 1Ath transistor $TR_1$, the 1Bth transistor $TR_2$, the 2Ath transistor $TR_3$, the 2Bth transistor $TR_4$, the first transfer transistor $TR_5$, and the second transfer transistor $TR_6$ that project on the insulating layer 79A.

[Step 160]

Then, an insulating layer 79B is formed over an overall area and a flattening process is performed to expose the top face of the source regions 13, 23, 33, and 43 of the 1Ath transistor $TR_1$, the 1Bth transistor $TR_2$, the 2Ath transistor $TR_3$, and the 2Bth transistor $TR_4$ and the top face of the other source/drain regions 53 and 63 of the first transfer transistor $TR_5$ and the second transfer transistor $TR_6$ on the top face of the insulating layer 79B.

[Step 170]

Thereafter, an interlayer insulating layer 79C is formed over an overall area, an opening is formed at portions of the interlayer insulating layer 79C above the source regions 13, 23, 33, and 43 of the 1Ath transistor $TR_1$, the 1Bth transistor $TR_2$, the 2Ath transistor $TR_3$, and the 2Bth transistor $TR_4$, and connection holes 14, 24, 34, and 44 as well as a first power supply line 91 and a second power supply line 92 are formed on the interlayer insulating layer 79C including the inside of the openings. In addition, an opening is formed at portions of the interlayer insulating layer 79C above the source regions 53 and 63 of the first transfer transistor $TR_5$ and the second transfer transistor $TR_6$, and connection holes 54 and 64 are formed in the openings.

[Step 180]

Then, an interlayer insulating layer 79D is formed over an overall area, an opening is formed at portions of the interlayer insulating layer 79D above the connection holes 54 and 64, and connection holes 55 and 65 as well as a first bit line 93 and a second bit line 94 are formed on the interlayer insulating layer 79D including the inside of the openings. The memory cell of the working example 1 can be obtained in this manner.

In the memory cell of the working example 1, the drain regions 11 and 21 of the 1Ath transistor $TR_1$ and the 1Bth transistor $TR_2$ are connected to the common first drain region-connection portion 71; the drain regions 31 and 41 of the 2Ath transistor $TR_3$ and the 2Bth transistor $TR_4$ are connected to the common second drain region-connection portion 72; the first gate electrode layer 81 common to the 1Ath transistor $TR_1$ and the 1Bth transistor $TR_2$ is connected to the second drain region-connection portion 72 through the first gate electrode-connection portion 73; the second gate electrode layer 82 common to the 2Ath transistor $TR_3$ and the 2Bth transistor $TR_4$ is connected to the first drain region-connection portion 71 through the second gate electrode-connection portion 74; the source regions 13 and 33 of the 1Ath transistor $TR_1$ and the 1Bth transistor $TR_2$ are connected to the common first power supply line 91; and the source regions 23 and 43 of the 1Bth transistor $TR_2$ and the 2Bth transistor $TR_4$ are connected to the common second power supply line 92. Thus, reduction of the area of the memory cell can be achieved. It is to be noted that the area of the memory cell is $36\Delta^2$ ($6\Delta \times 6\Delta$). Further, although, for one memory cell, one word line WL, two bit lines 93 and 94, one first power supply line 91, and one second power supply line 92 are provided, the number of wiring layers for providing the wiring may be three, and the number of wiring layers can be made less than that in the past. Besides, in the CMOS inverter circuit of the working example 1, the drain regions 11 and 31 of the pMOS transistors $TR_1$ and $TR_3$ and the drain regions 21 and 41 of the nMOS transistors $TR_2$ and $TR_4$ are connected to the common drain region-connection portions 71 and 72, respectively, and the gate electrode layer 82 common to the pMOS transistors $TR_1$ and $TR_3$ and the nMOS transistors $TR_2$ and $TR_4$ is connected to the common gate wiring portions 72 and 71 formed on the substrate 70 (particularly, on the top face portion of the substrate 70), through the gate electrode-connection portions 73 and 74. Therefore, reduction of the area of the CMOS inverter circuit can be achieved.

Figure 11:
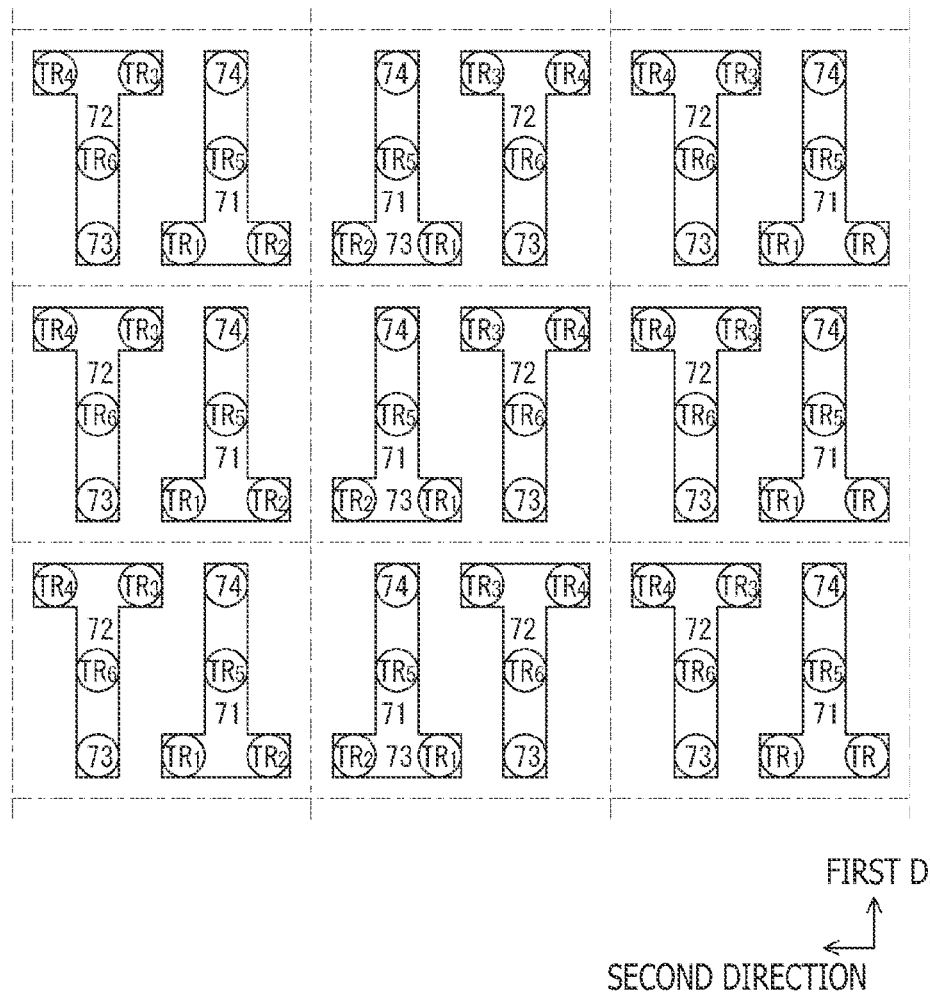
FIG. 11 is a conceptual view of an arrangement state of components configuring a first modification of the memory cell of the working example 1 when the first modification of the memory cell of the working example 1 is cut along a virtual horizontal plane including the arrow marks A-A of FIG. 4A and is a conceptual view similar to FIG. 5.
Figure 12:
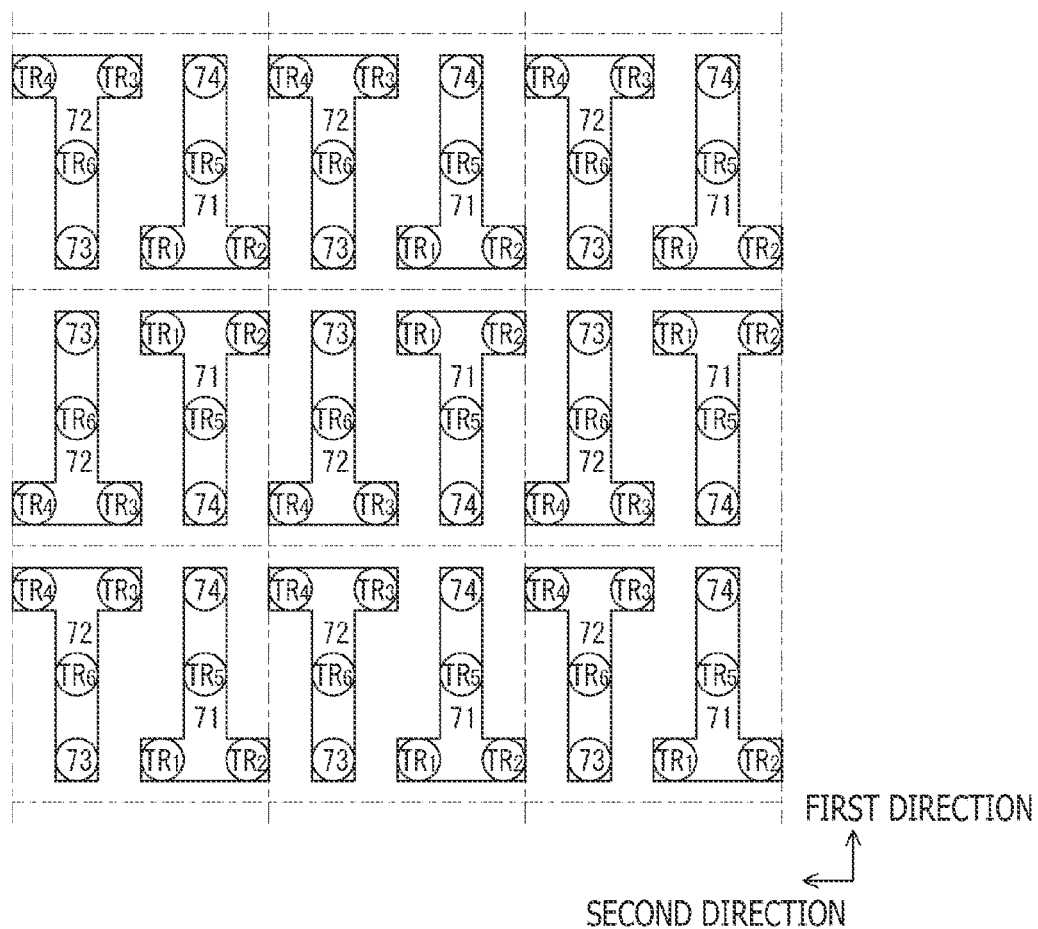
FIG. 12 is a conceptual view of an arrangement state of components configuring a second modification of the memory cell of the working example 1 when the second modification of the memory cell of the working example 1 is cut along a virtual horizontal plane including the arrow marks A-A of FIG. 4A and is a conceptual view similar to FIG. 5.

While conceptual diagrams of an arrangement state of components configuring a first modification and a second modification of the memory cell of the working example 1 when the first modification and the second modification of the memory cell of the working example 1 are cut along a virtual horizontal plane including arrow marks A-A of FIG. 4A are depicted in FIGS. 11 and 12, not only is it possible to use a form in which adjacent memory cells are arranged line symmetrically with respect to a boundary line extending in the first direction (refer to FIG. 11), but it is also possible to use a form in which adjacent memory cells are arranged line symmetrically with respect to a boundary line extending in the second direction (refer to FIG. 12). It is to be noted that FIGS. 11 and 12 are conceptual diagrams similar to FIG. 5.

Working Example 2

The working example 2 is a modification of the working example 1 and is related to a memory cell of the first form of the present disclosure and a memory cell of the second configuration of the present disclosure.

Figure 13A:
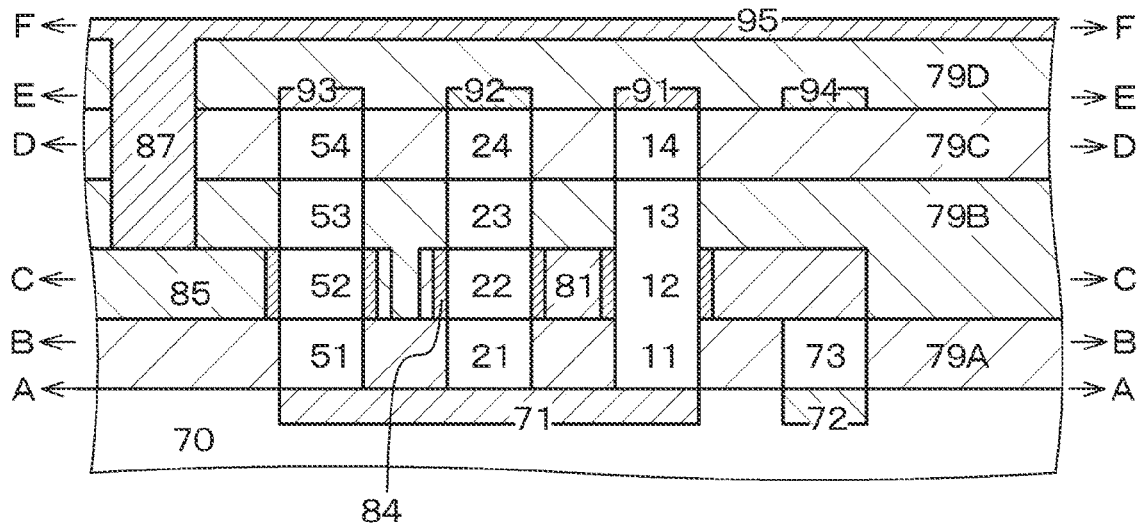
FIGS. 13A and 13B are schematic partial sectional views taken along arrow marks A-A and arrow marks B-B of FIG. 15 of a memory cell of a working example 2.
Figure 13B:
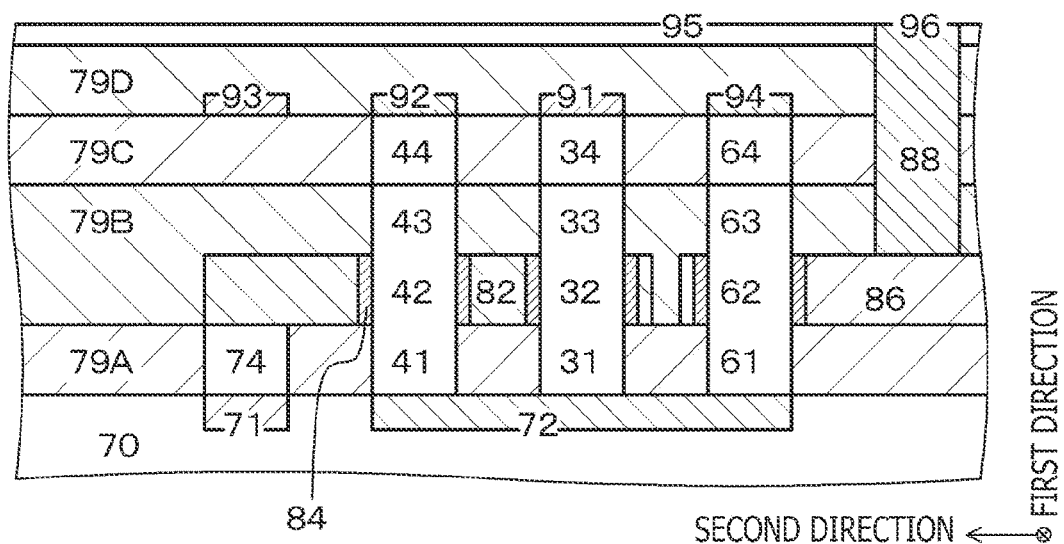
Figure 14:
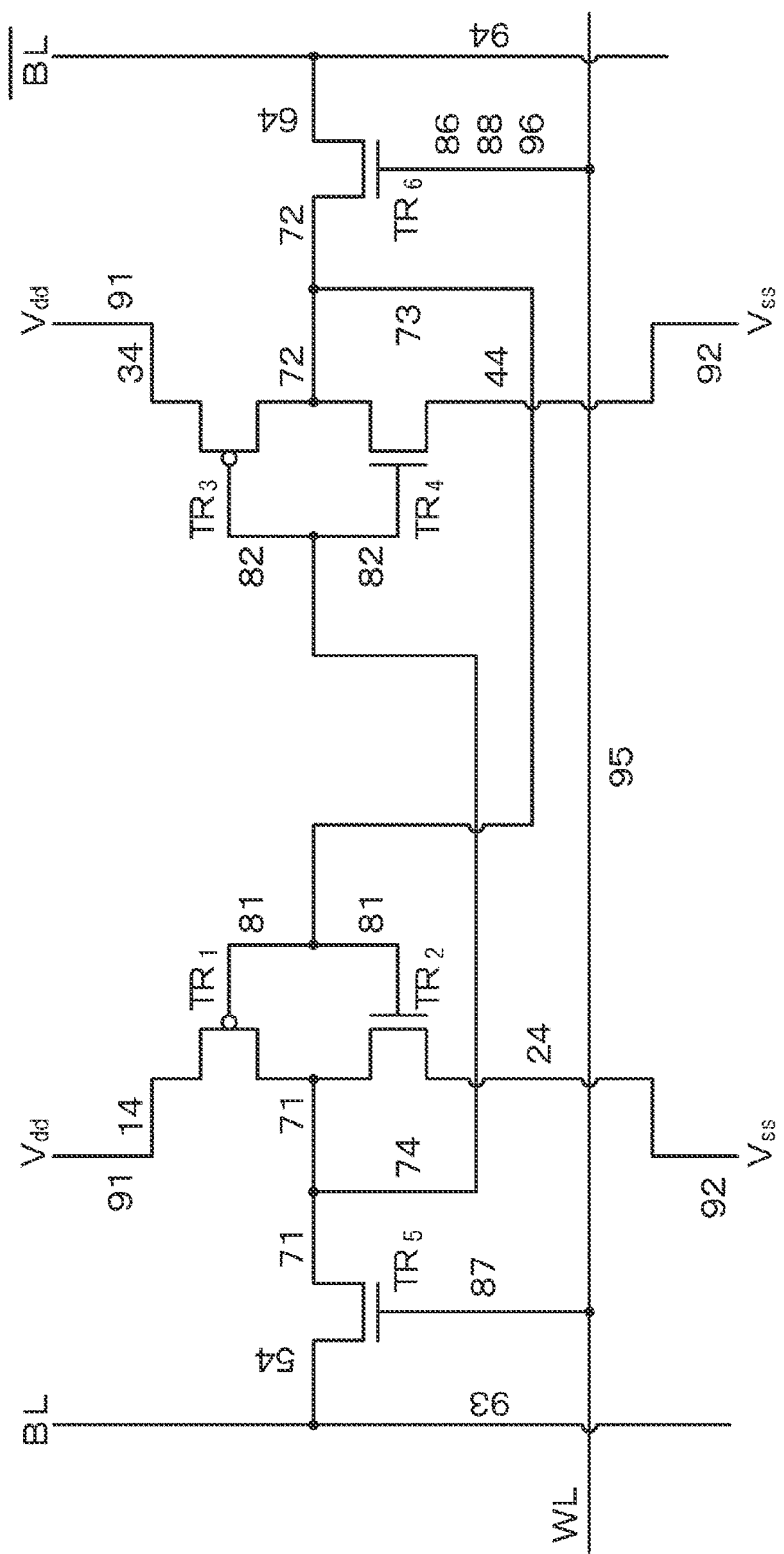
FIG. 14 is an equivalent circuit diagram of the memory cell of the working example 2.

A schematic partial sectional view of the memory cell of the working example 2 taken along arrow marks A-A of FIG. 15 is depicted in FIG. 13A, a schematic partial sectional view of the memory cell of the working example 2 taken along arrow marks B-B of FIG. 15 is depicted in FIG. 13B, and an equivalent circuit diagram of the memory cell of the working example 2 is depicted in FIG. 14. Further, conceptual diagrams of an arrangement state of components configuring the memory cell of the working example 2 when the memory cell of the working example 2 is cut along a virtual horizontal plane including arrow marks A-A of FIG. 13A, a virtual horizontal plane including arrow marks B-B of FIG. 13A, a virtual horizontal plane including arrow marks C-C of FIG. 13A, a virtual horizontal plane including arrow marks D-D of FIG. 13A, a virtual horizontal plane including arrow marks E-E of FIG. 13A, and a virtual horizontal plane including arrow marks F-F of FIG. 13A of the memory cell of the working example 2 are depicted in FIGS. 15, 16, 17, 18, 19, and 20. It is to be noted that, in FIGS. 13A and 13B, part of hatching lines are omitted, and in FIG. 13B, a side face of the word line (WL) 95 is depicted. Further, in FIGS. 15, 16, 17, 18, 19, and 20, eight memory cells are depicted, and a boundary line between memory cells is indicated by a dashed line.

In memory cell of the working example 2 or the working example 4 hereinafter described, a gate electrode layer 85 of the first transfer transistor $TR_5$ and a gate electrode layer 86 of the second transfer transistor $TR_6$ are connected to the word line (WL) 95. The word line WL extends in a second direction different from the first direction in which the first power supply line 91, the second power supply line 92, the first bit line (BL) 93, and the second bit line (BL') 94 extend (particularly, for example, in a second direction orthogonal to the first direction), and is connected to a peripheral circuit.

In particular, in the memory cell of the working example 2 or the working example 4 hereinafter described, the gate electrode layer 85 of the first transfer transistor $TR_5$ is connected to the word line 95 through a connection hole 87 formed in the interlayer insulating layer 79C. On the other hand, the gate electrode layer 86 of the second transfer transistor $TR_6$ is connected to the word line 95 through a connection hole 88 and a wiring portion 96 formed in the interlayer insulating layer 79C. The word line 95 and the wiring portion 96 are formed on the interlayer insulating layer 79D, and the connection holes 87 and 88 are provided on the insulating layer 79B and the interlayer insulating layers 79C and 79D.

In the memory cell of the working example 2, the other source/drain region 53 of the first transfer transistor $TR_5$ is connected to the first bit line (BL) 93 through the connection hole 54 provided in the interlayer insulating layer 79C, and the other source/drain region 63 of the second transfer transistor TR$_6$ is connected to the second bit line 94 (BL') through the connection hole 64 provided in the interlayer insulating layer 79C. The source region 13 of the 1Ath transistor TR$_1$ and the source region 33 of the 2Ath transistor TR$_3$ are connected to the common first power supply line 91 through the connection holes 14 and 34 formed in the interlayer insulating layer 79C. The source regions 23 and 43 of the 1Bth transistor TR$_2$ and the 2Bth transistor TR$_4$ are connected to the common second power supply line 92 through the connection holes 24 and 44 formed in the interlayer insulating layer 79C. The drain region 11 of the 1Ath transistor TR$_1$, the drain region 21 of the 1Bth transistor TR$_2$, and the one source/drain region 51 of the first transfer transistor TR$_5$ are connected to the first drain region-connection portion 71, and the drain region 31 of the 2Ath transistor TR$_3$, the drain region 41 of the 2Bth transistor TR$_4$, and the one source/drain region 61 of the second transfer transistor TR$_6$ are connected to the second drain region-connection portion 72. Above the first transfer transistor TR$_5$ and the second transfer transistor TR$_6$, the first power supply line 91 and the second power supply line 92 are not provided. The first power supply line 91, the second power supply line 92, the first bit line 93, and the second bit line 94 are formed on the interlayer insulating layer 79C.

Figure 36:
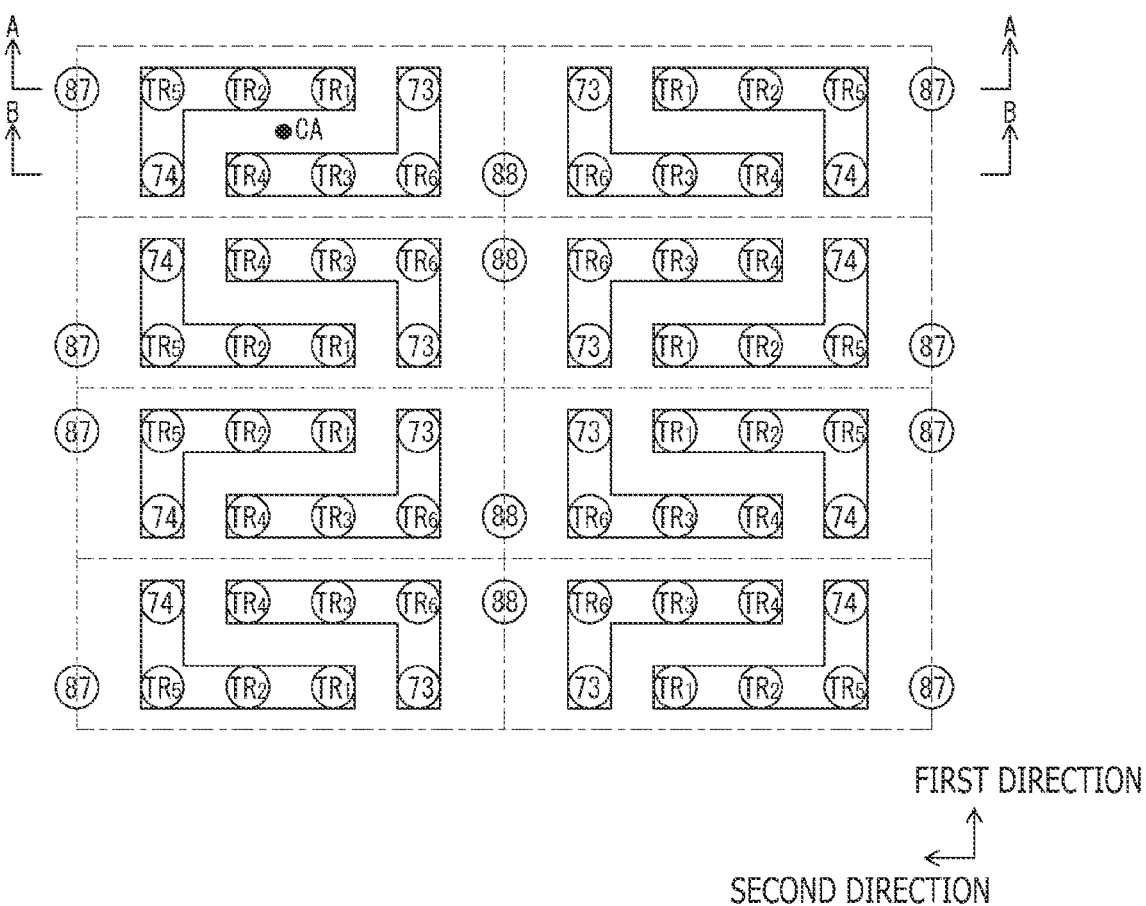
FIG. 36 is a conceptual view of an arrangement state of components configuring the memory cell of the working example 4 when the memory cell of the working example 4 is cut along a virtual horizontal plane including arrow marks E-E of FIG. 30A.
Figure 37:
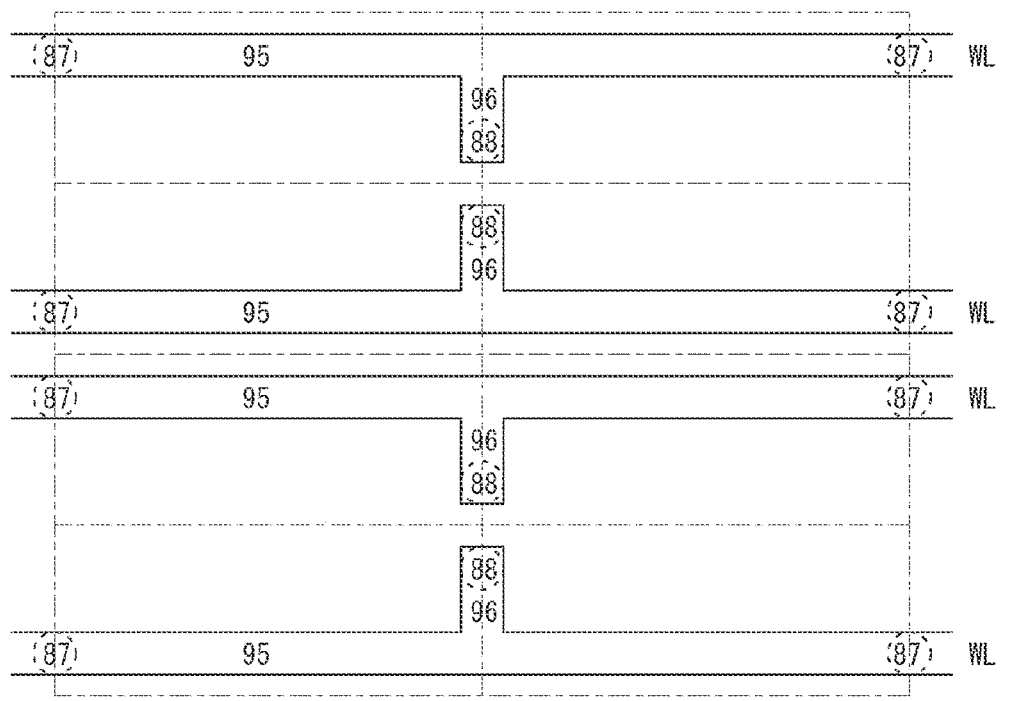
FIG. 37 is a conceptual view of an arrangement state of components configuring the memory cell of the working example 4 when the memory cell of the working example 4 is cut along a virtual horizontal plane including arrow marks F-F of FIG. 30A.

Further, in the memory cell of the working example 2 or the working example 4 hereinafter described, adjacent memory cells are arranged line symmetrically with respect to a boundary line extending in the first direction, a boundary line extending in the second direction, or boundary lines extending in the first direction and the second direction. In the example depicted, adjacent memory cells are arranged line symmetrically with respect to a boundary line extending in the first direction and a boundary line extending in the second direction. Further, the first CMOS inverter circuit and the second inverter circuit are arranged two times symmetrically with respect to the center axis of the memory cell. In FIGS. 15 and 36, the center axis of one memory cell is represented by a dark circle "CA."

Further, in the memory cell of the working example 2 or the working example 4 described below,

[a] an orthogonal projection image of the channel structure portion of the 1Ath transistor TR$_1$ to a virtual vertical plane vertical to the second direction,

[b] an orthogonal projection image of the channel structure portion of the 1Bth transistor TR$_2$ to the virtual vertical plane vertical to the second direction, and

[c] an orthogonal projection image of the channel structure portion of the first transfer transistor TR$_5$ to the virtual vertical plane vertical to the second direction substantially overlap with each other, and

[d] an orthogonal projection image of the channel structure portion of the 2Ath transistor TR$_3$ to the virtual vertical plane vertical to the second direction,

[e] an orthogonal projection image of the channel structure portion of the 2Bth transistor TR$_4$ to the virtual vertical plane vertical to the second direction, and

[f] an orthogonal projection image of the channel structure portion of the second transfer transistor TR$_6$ to the virtual vertical plane vertical to the second direction substantially overlap with each other.

Further, in the memory cell of the working example 2, the first power supply line 91, the second power supply line 92, the first bit line 93, and the second bit line 94 are arranged in a first level, and the word line 95 is arranged in a second level different from the first level. Although, in the example depicted, the first level is positioned on the substrate side with respect to the second level, the second level may be positioned on the substrate side with respect to the first level.

Since, except the matters described above, the memory cell of the working example 2 can be made substantially similar in configuration and structure to the memory cell of the working example 1, detailed description of them is omitted.

Working Example 3

Although the working example 3 is also a modification of the working example 1, it is related to the memory cell of the second form of the present disclosure and the memory cell of the first configuration of the present disclosure.

Figure 21A:
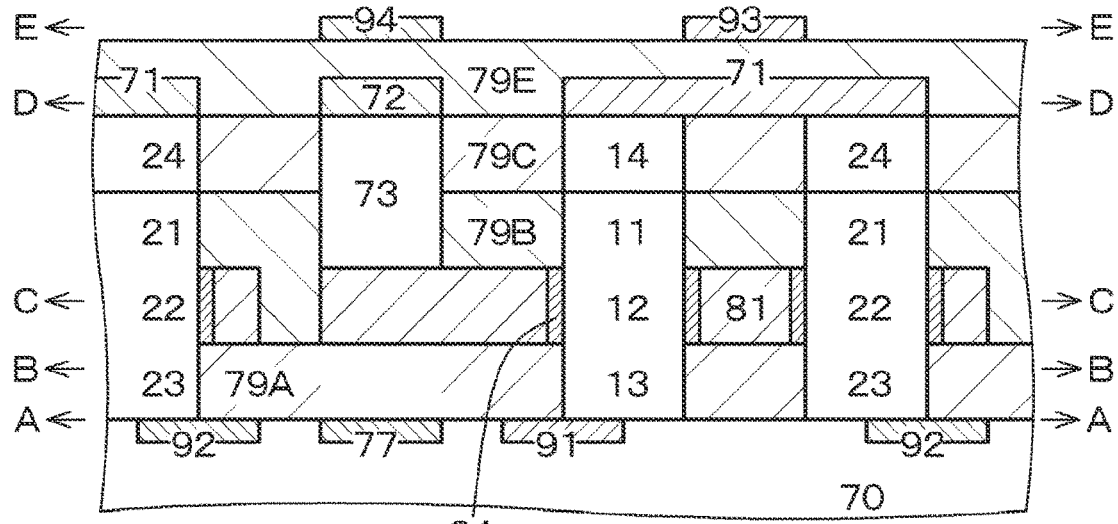
FIGS. 21A, 21B, and 21C are schematic partial sectional views taken along arrow marks A-A, arrow marks B-B, and arrow marks C-C of FIG. 24 of a memory cell of a working example 3.
Figure 21B:
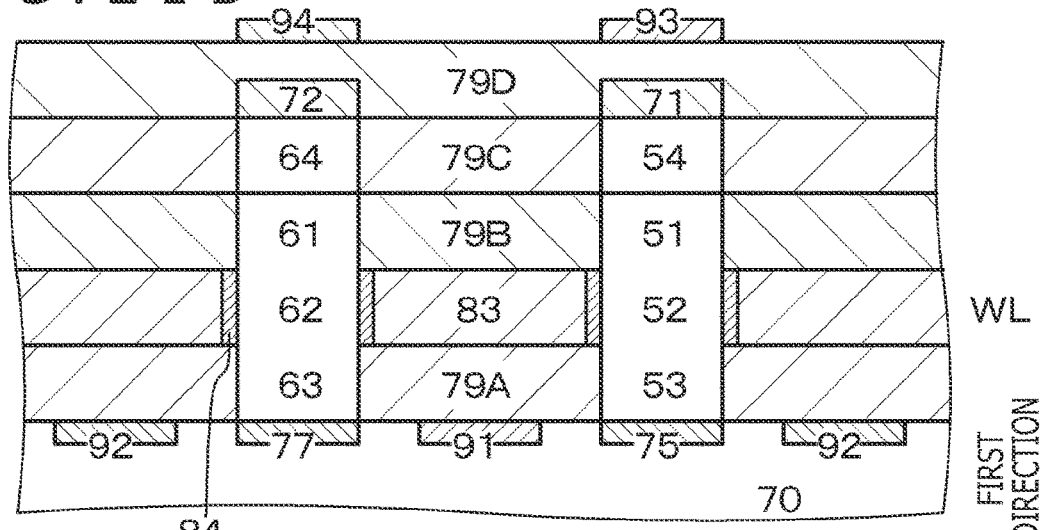
Figure 21C:
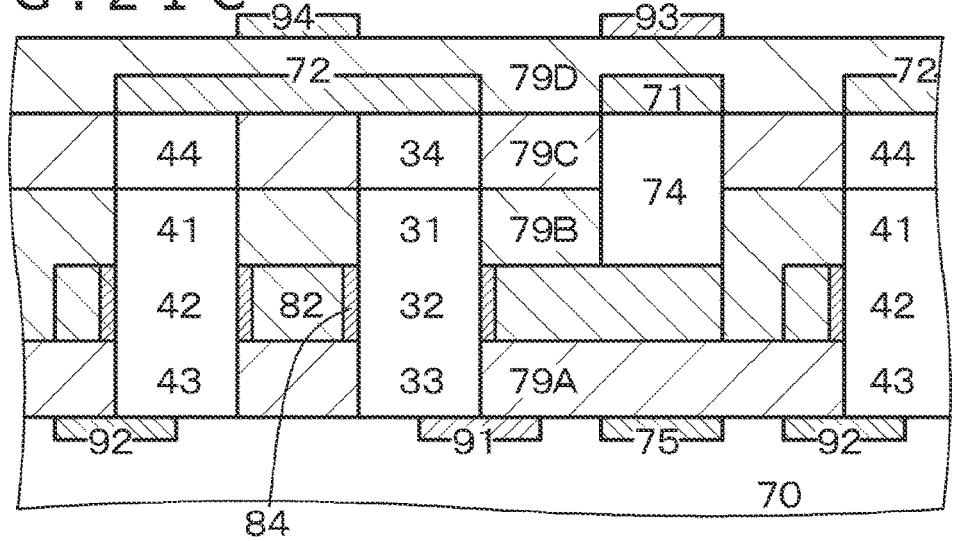
Figure 22A:
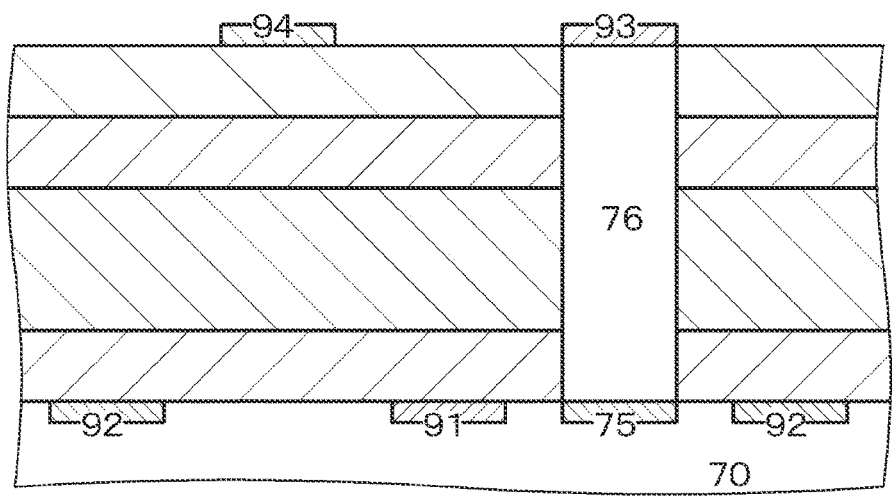
FIGS. 22A and 22B are schematic partial sectional views taken along arrow marks D-D and arrow marks E-E of FIG. 24 of the memory cell of the working example 3.
Figure 22B:
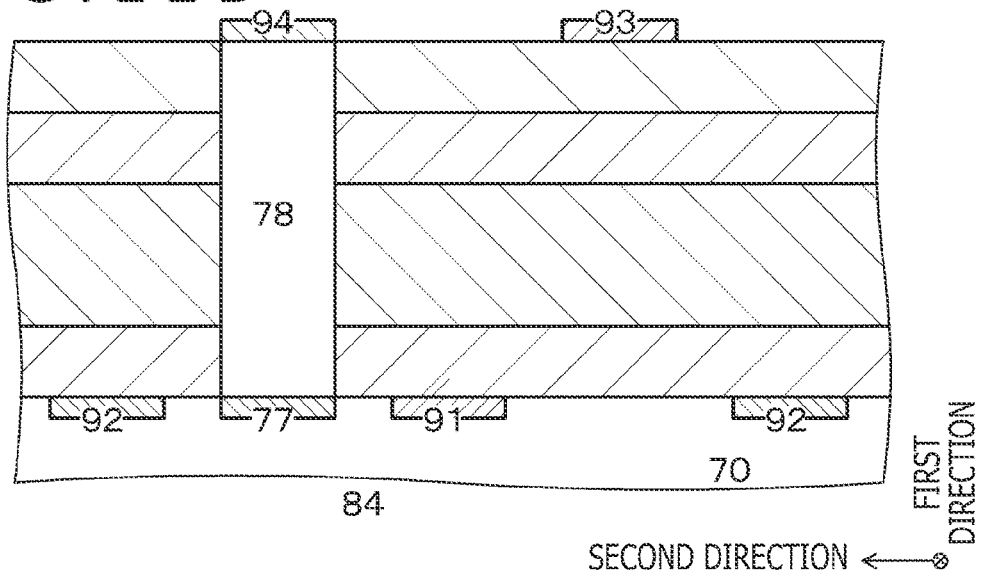
Figure 23:
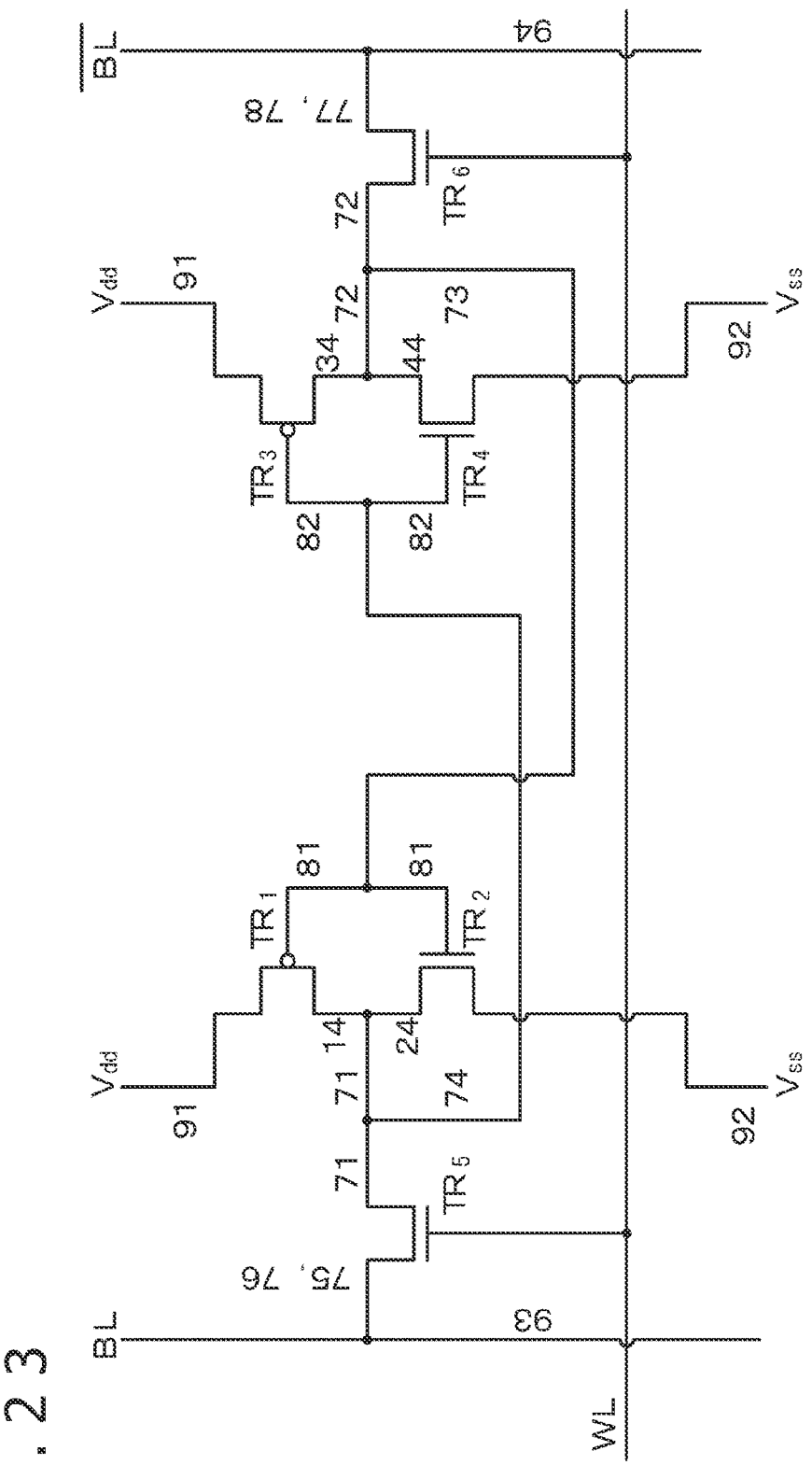
FIG. 23 is an equivalent circuit diagram of the memory cell of the working example 3.
Figure 24:
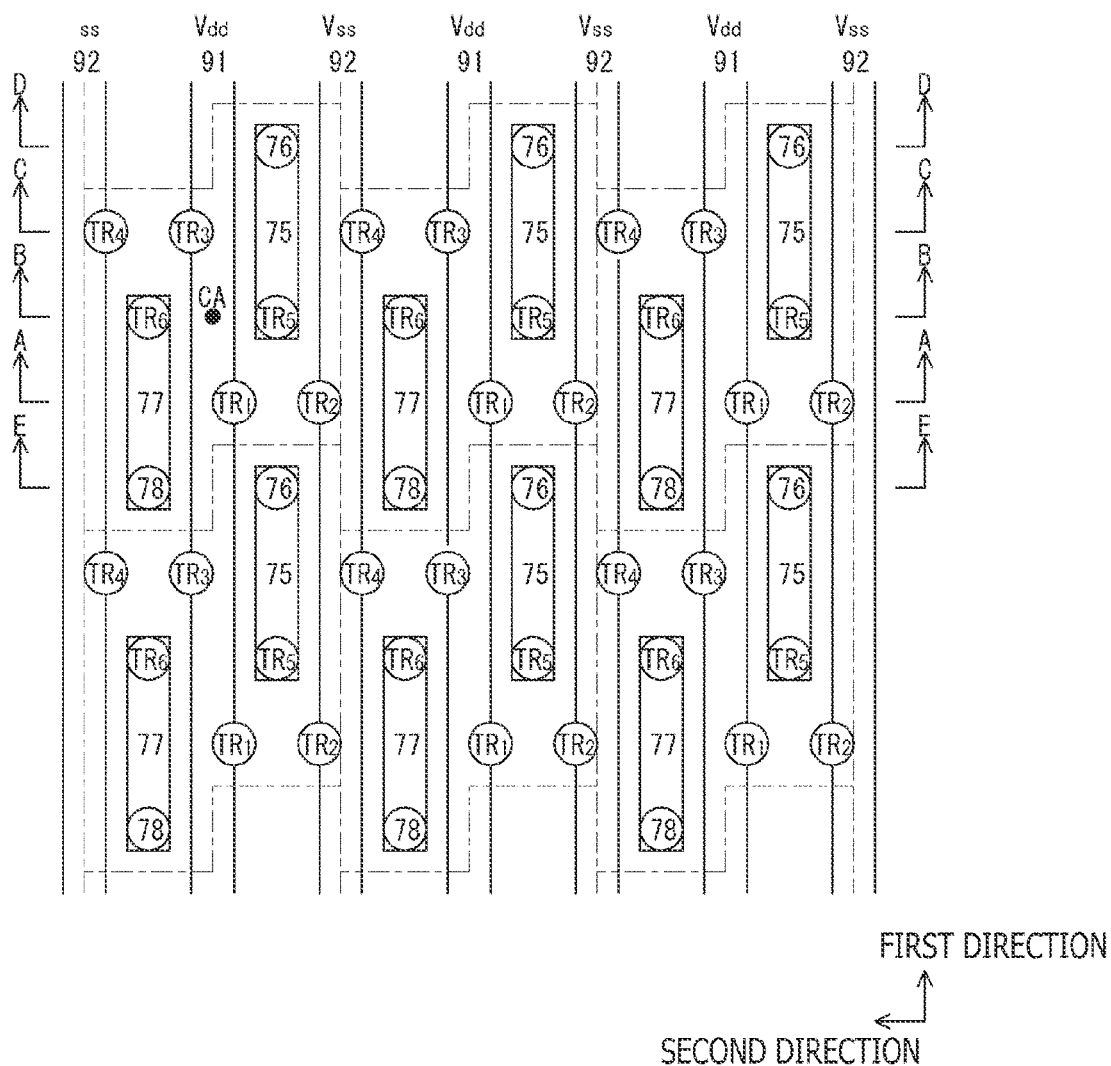
FIG. 24 is a conceptual view of an arrangement state of components configuring the memory cell of the working example 3 when the memory cell of the working example 3 is cut along a virtual horizontal plane including arrow marks A-A of FIG. 21A.

A schematic partial sectional view of the memory cell of the working example 3 taken along arrow marks A-A of FIG. 24 is depicted in FIG. 21A; a schematic partial sectional view of the memory cell of the working example 3 taken along arrow marks B-B of FIG. 24 is depicted in FIG. 21B; a schematic partial sectional view of the memory cell of the working example 3 taken along arrow marks C-C of FIG. 24 is depicted in FIG. 21C; a schematic partial sectional view of the memory cell of the working example 3 taken along arrow marks D-D of FIG. 24 is depicted in FIG. 22A; and a schematic partial sectional view of the memory cell of the working example 3 taken along arrow marks E-E of FIG. 24 is depicted in FIG. 22B. Further, an equivalent circuit diagram of the memory cell of the working example 3 is depicted in FIG. 23. Further, conceptual views of an arrangement state of components that configure the memory cell of the working example 3 when the memory cell of the working example 3 is cut along a virtual horizontal plane including arrow marks A-A of FIG. 21A of the memory cell of the working example 3, a virtual horizontal plane including arrow marks B-B of FIG. 21A, a virtual horizontal plane including arrow marks C-C of FIG. 21A, a virtual horizontal plane including arrow marks D-D of FIG. 21A, and a virtual horizontal plane including arrow marks E-E of FIG. 21A are depicted in FIGS. 24, 25, 26, 27, and 28. It is to be noted that, in FIGS. 21A, 21B, 21C, 22A and 22B, part of hatching lines are omitted. Further, in FIGS. 24, 25, 26, 27, and 28, six memory cells are depicted, and a boundary line between memory cells is indicated by a dashed line.

In the memory cell of the working example 3, the source regions 13, 23, 33, and 43 of the 1Ath transistor TR$_1$, the 1Bth transistor TR$_2$, the 2Ath transistor TR$_3$, and the 2Bth transistor TR$_4$ and the other source/drain regions 53 and 63 of the first transfer transistor TR$_5$ and the second transfer transistor TR$_6$ are formed on the substrate 70 (in particular, just above the substrate 70), and the first power supply line 91 and the second power supply line 92 are formed on the substrate 70 (particularly, on the top face portion of the substrate 70). The first power supply line 91 and the second power supply line 92 each include a high concentration impurity region or a conductive material layer formed on the substrate 70 (particularly, on the top face portion of the substrate 70) or include a metal material layer surrounded by an insulating material layer and isolated from the surroundings.

The 1Ath transistor TR$_1$, the 1Bth transistor TR$_2$, the 2Ath transistor TR$_3$, the 2Bth transistor TR$_4$, the first transfer transistor TR$_5$, and the second transfer transistor TR$_6$ are covered with an interlayer insulating layer 79C, and the interlayer insulating layer 79D is formed on the interlayer insulating layer 79C.

The source region 13 of the 1Ath transistor TR$_1$ and the source region 33 of the 2Ath transistor TR$_3$ are connected to the common first power supply line 91, and the source region 23 of the 1Bth transistor $TR_2$ and the source region 43 of the 2Bth transistor $TR_4$ are connected to the common second power supply line 92.

Further, the drain region 11 of the 1Ath transistor $TR_1$ is connected to the first drain region-connection portion 71 through the connection hole 14 provided in the interlayer insulating layer 79C, and the drain region 21 of the 1Bth transistor $TR_2$ is connected to the first drain region-connection portion 71 through a connection hole 24 provided in the interlayer insulating layer 79C. The one source/drain region 51 of the first transfer transistor $TR_5$ is connected to the first drain region-connection portion 71 through the connection hole 54 provided in the interlayer insulating layer 79C. The drain region 31 of the 2Ath transistor $TR_3$ is connected to the second drain region-connection portion 72 through a connection hole 34 provided in the interlayer insulating layer 79C, and the drain region 41 of the 2Bth transistor $TR_4$ is connected to the second drain region-connection portion 72 through a connection hole 44 provided in the interlayer insulating layer 79C. The one source/drain region 61 of the second transfer transistor $TR_6$ is connected to the second drain region-connection portion 72 through the connection hole 64 provided in the interlayer insulating layer 79C.

The other source/drain region 53 of the first transfer transistor $TR_5$ is connected to the first bit line 93 provided on the interlayer insulating layer 79D, through a connection portion 75 including a high concentration impurity region or a conductive material layer provided on the substrate 70 (particularly on the top face portion of the substrate 70) and a connection hole 76 connected to the connection portion 75 and provided in the insulating layers 79A and 79B and the interlayer insulating layers 79C and 79D. The other source/drain region 63 of the second transfer transistor $TR_6$ is connected to the second bit line 94 provided on the interlayer insulating layer 79D, through a connection portion 77 including a high concentration impurity region or a conductive material layer provided on the substrate 70 (particularly, on the top face portion of the substrate 70) and a connection hole 78 connected to the connection portion 77 and provided in the insulating layers 79A and 79B and the interlayer insulating layers 79C and 79D.

The first gate electrode layer 81 common to the 1Ath transistor $TR_1$ and the 1Bth transistor $TR_2$ is connected to the second drain region-connection portion 72 through the first gate electrode-connection portion 73 provided on the insulating layer 79B and the interlayer insulating layer 79C, and the second gate electrode layer 82 common to the 2Ath transistor $TR_3$ and the 2Bth transistor $TR_4$ is connected to the first drain region-connection portion 71 through the second gate electrode-connection portion 74 provided on the insulating layer 79B and the interlayer insulating layer 79C.

The first power supply line 91, the second power supply line 92, the first bit line 93, and the second bit line 94 extend in the first direction, and the gate electrode layer (third gate electrode layer) 83 common to the first transfer transistor $TR_5$ and the second transfer transistor $TR_6$ serves also as the word line WL and extends in the second direction.

Further, in the CMOS inverter circuit of the working example 3, the source regions 13 and 33 of the pMOS transistors $TR_1$ and $TR_3$ and the source regions 23 and 43 of the nMOS transistors $TR_2$ and $TR_4$ are formed on the substrate 70 (particularly, just above the substrate 70), and the first power supply line 91 and the second power supply line 92 are formed on the substrate 70 (particularly, on the top face portion of the substrate 70).

Since the memory cell of the working example 3 can be made substantially similar in configuration and structure to the memory cell of the working example 1 except the points described above, detailed description of the same is omitted. It is to be noted that, although the area of the memory cell of the working example 3 is $48\Delta^2$ and is the same as the area of the region occupied by the conventional SRAM memory cell depicted in FIG. 52B, reduction of the number of wiring layers is achieved.

Figure 25:
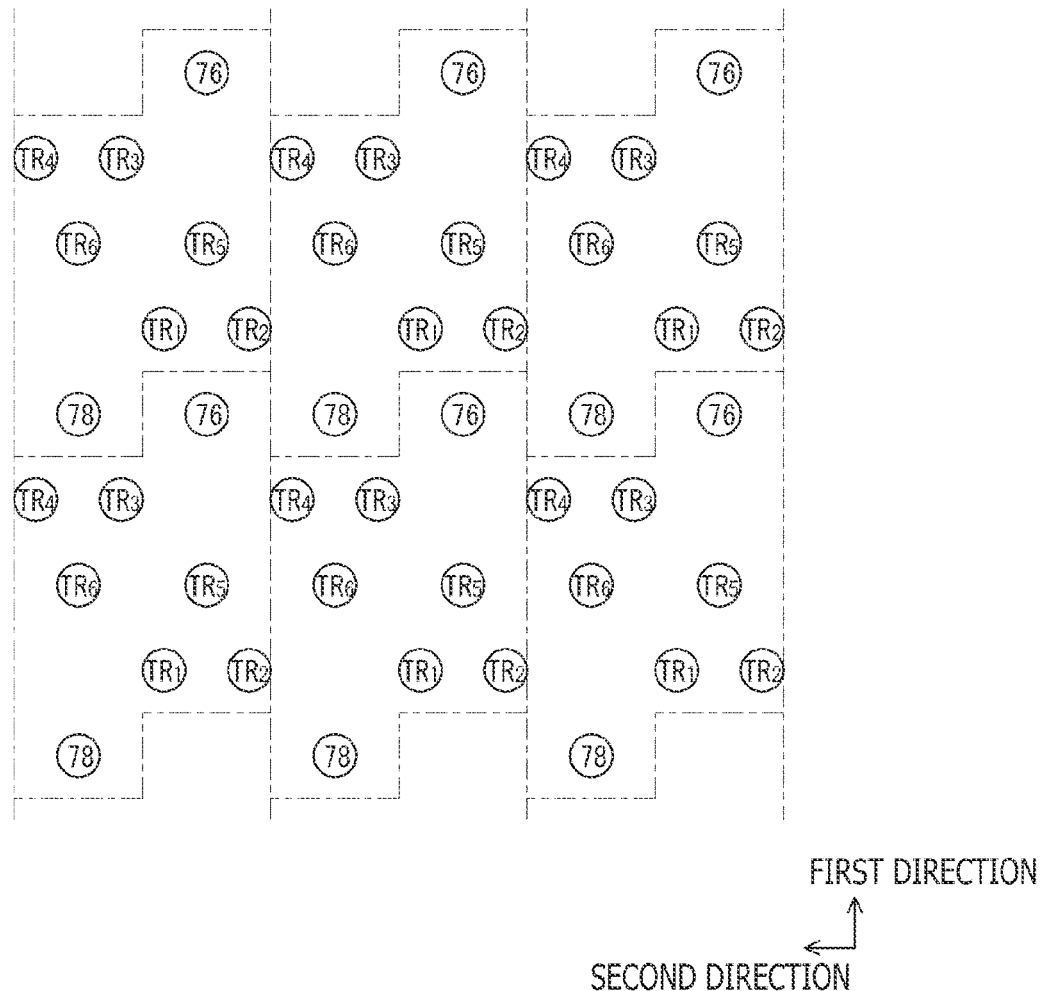
FIG. 25 is a conceptual view of an arrangement state of components configuring the memory cell of the working example 3 when the memory cell of the working example 3 is cut along a virtual horizontal plane including arrow marks B-B of FIG. 21A.
Figure 26:
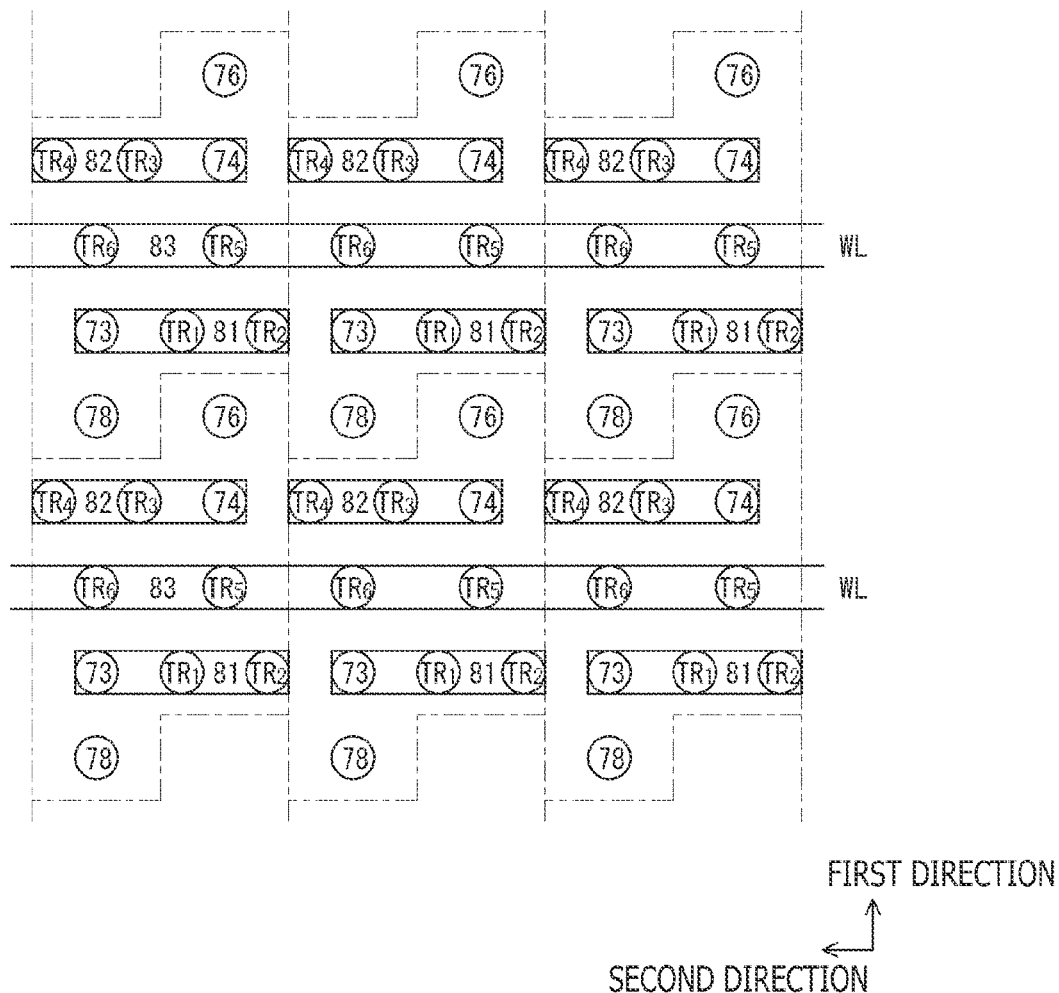
FIG. 26 is a conceptual view of an arrangement state of components configuring the memory cell of the working example 3 when the memory cell of the working example 3 is cut along a virtual horizontal plane including arrow marks C-C of FIG. 21A.
Figure 27:
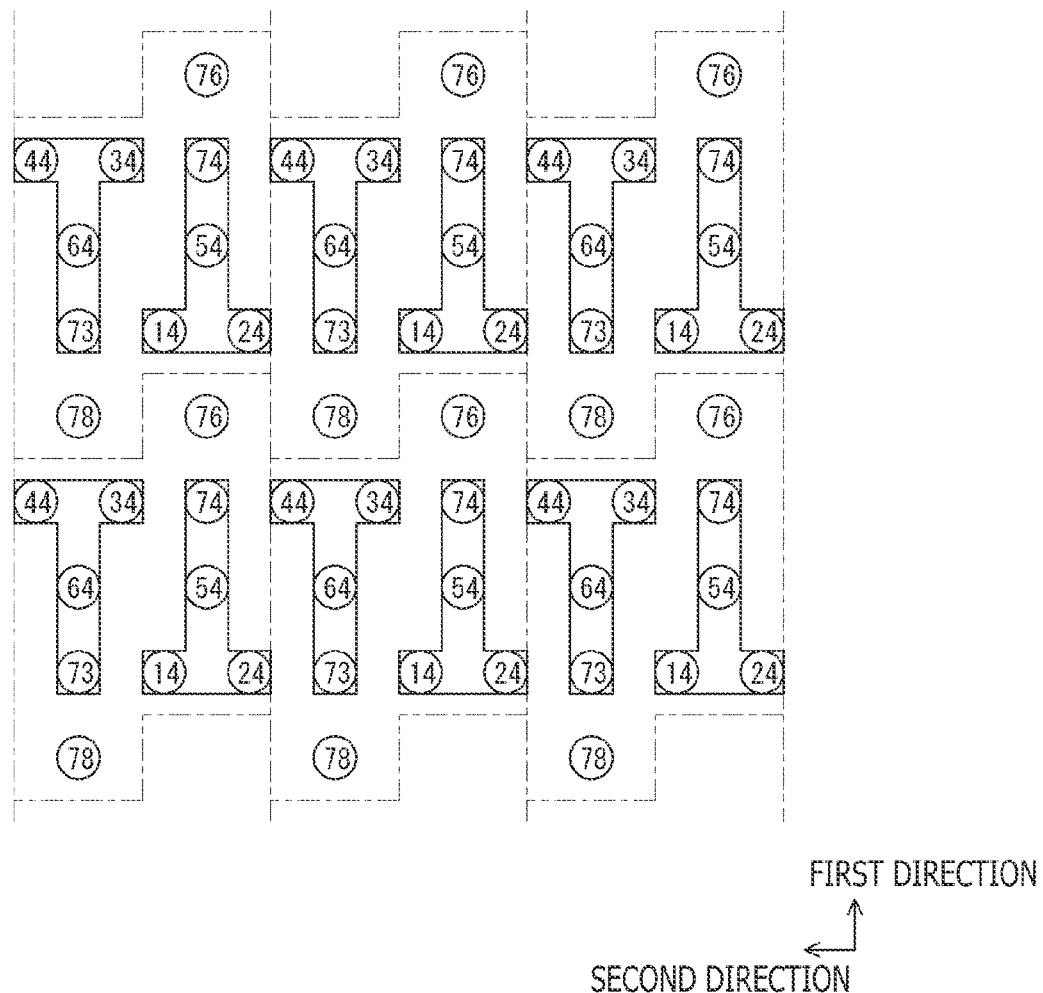
FIG. 27 is a conceptual view of an arrangement state of components configuring the memory cell of the working example 3 when the memory cell of the working example 3 is cut along a virtual horizontal plane including arrow marks D-D of FIG. 21A.
Figure 28:
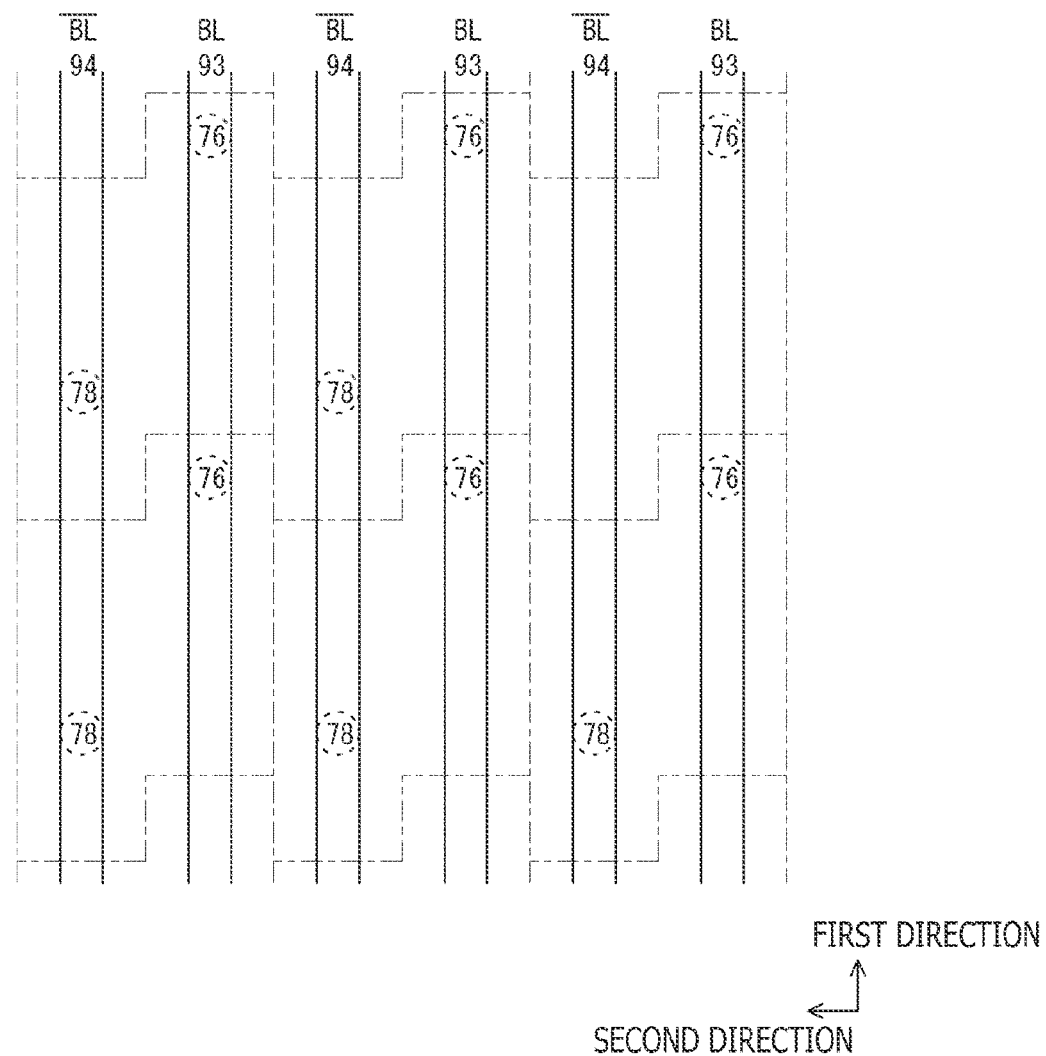
FIG. 28 is a conceptual view of an arrangement state of components configuring the memory cell of the working example 3 when the memory cell of the working example 3 is cut along a virtual horizontal plane including arrow marks E-E of FIG. 21A.
Figure 29:
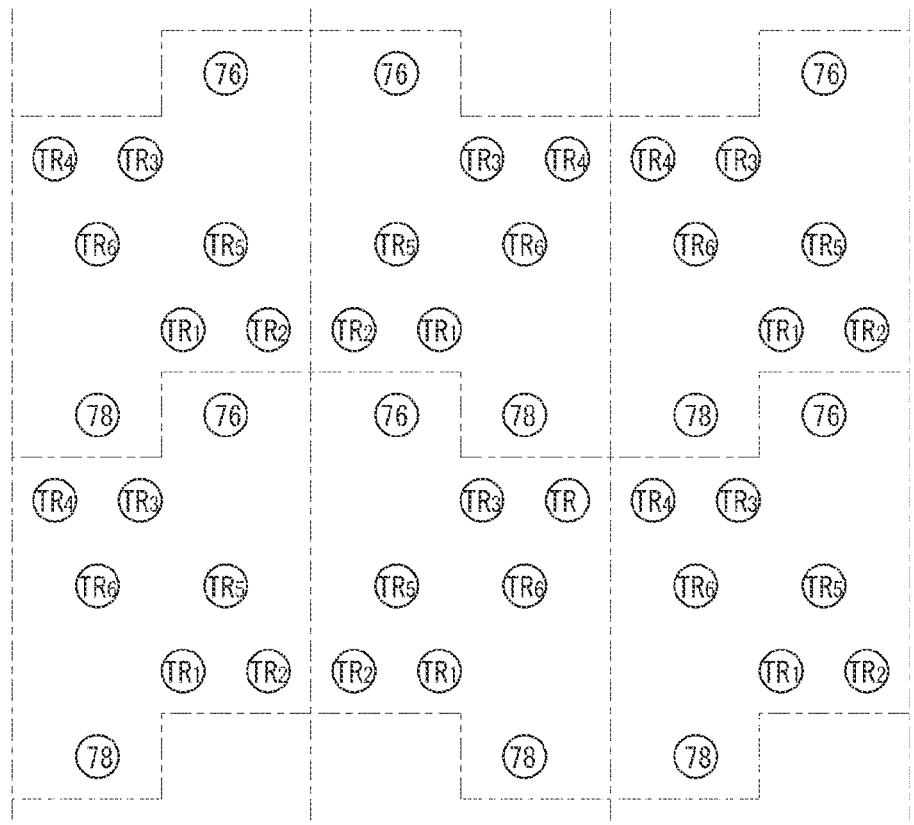
FIG. 29 is a conceptual view of an arrangement state of components configuring a first modification of the memory cell of the working example 3 when the first modification of the memory cell of the working example 3 is cut along a virtual horizontal plane including arrow marks A-A of FIG. 25A.

As depicted in FIG. 29 that is a conceptual diagram of a first modification of the working example 3 similar to that of FIG. 25, it is also possible to adopt a form in which adjacent memory cells are arranged line symmetrically with respect to a boundary line extending in the first direction.

Working Example 4

The working example 4 is a modification of the working example 2 and is related to a memory cell of the second form of the present disclosure and a memory cell of the second configuration of the present disclosure.

Figure 30A:
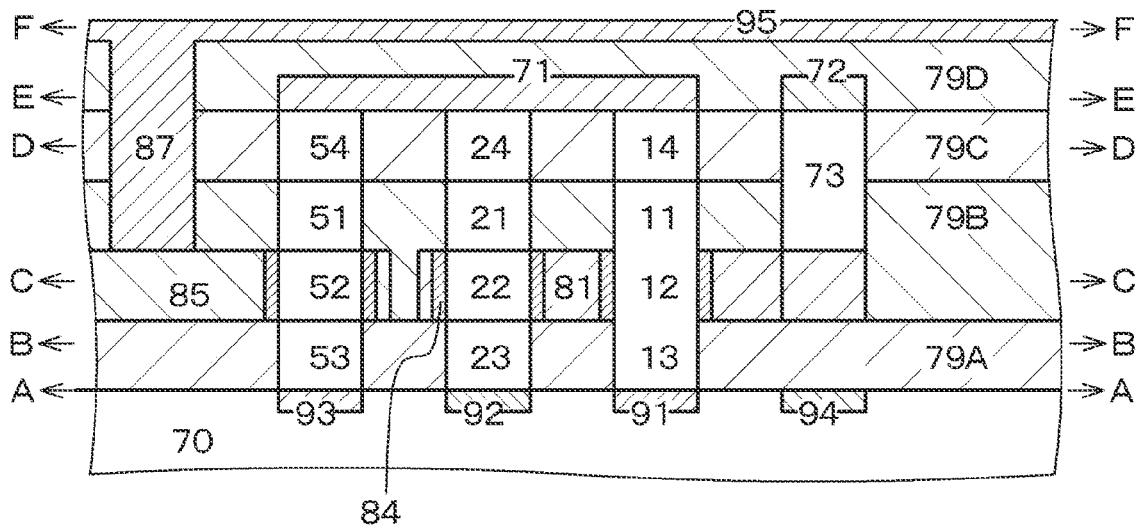
FIGS. 30A and 30B are schematic partial sectional views taken along arrow marks A-A and arrow marks B-B of FIG. 32 of a memory cell of a working example 4.
Figure 30B:
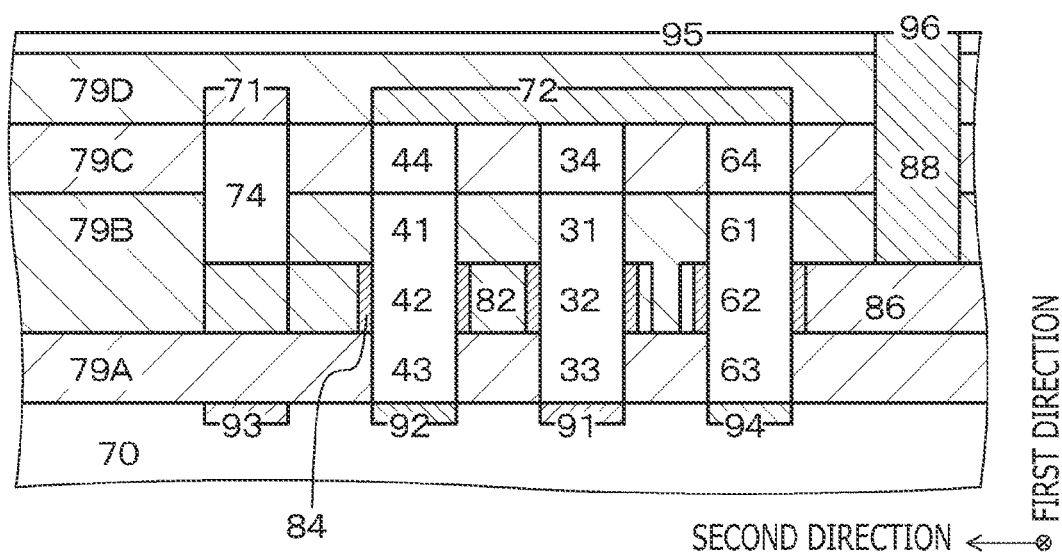
Figure 32:
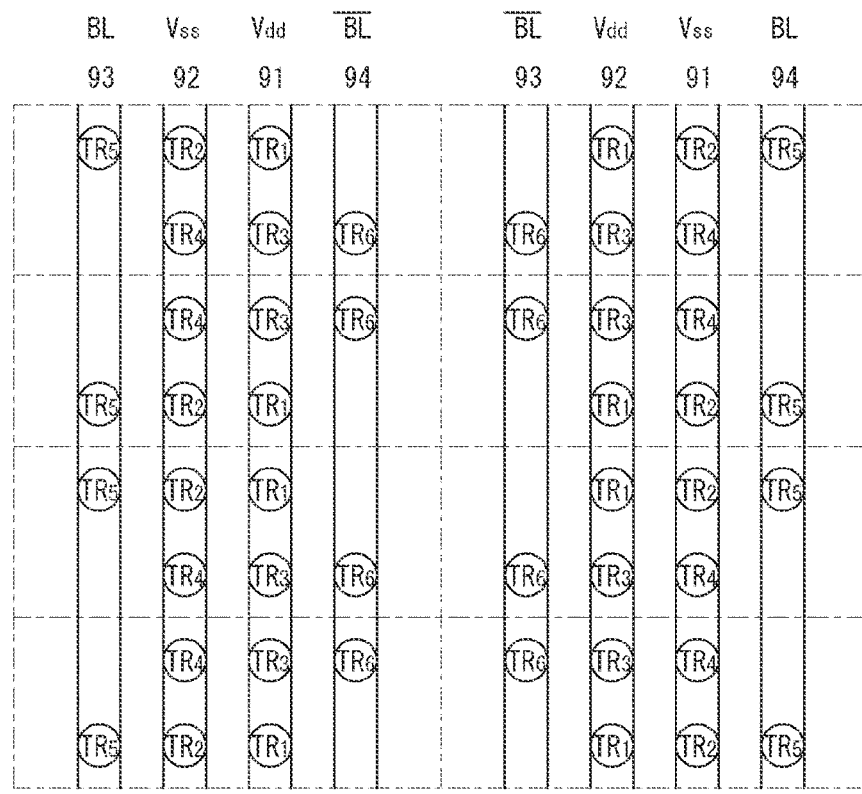
FIG. 32 is a conceptual view of an arrangement state of components configuring the memory cell of the working example 4 when the memory cell of the working example 4 is cut along a virtual horizontal plane including arrow marks A-A of FIG. 30A.
Figure 33:
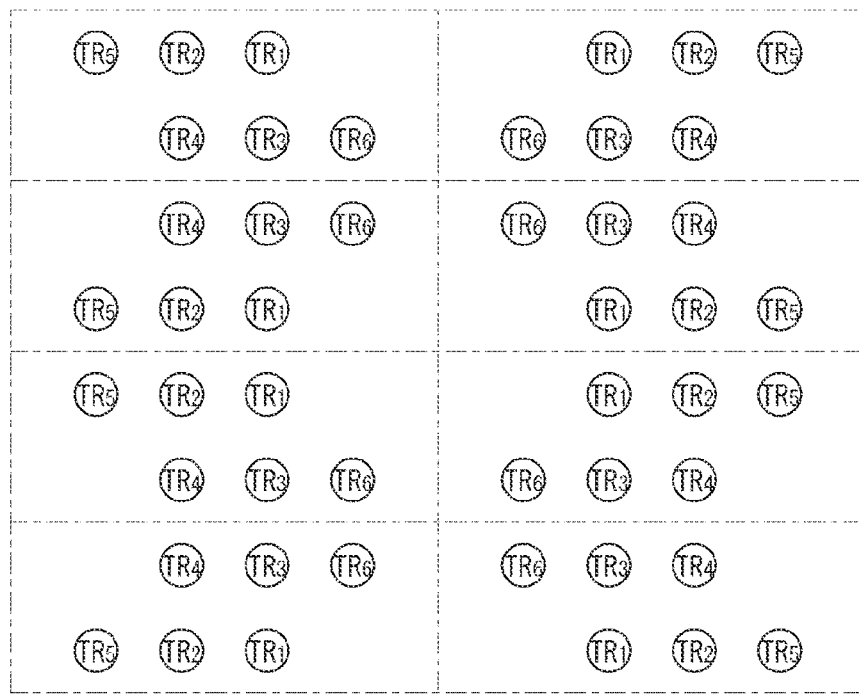
FIG. 33 is a conceptual view of an arrangement state of components configuring the memory cell of the working example 4 when the memory cell of the working example 4 is cut along a virtual horizontal plane including arrow marks B-B of FIG. 30A.
Figure 34:
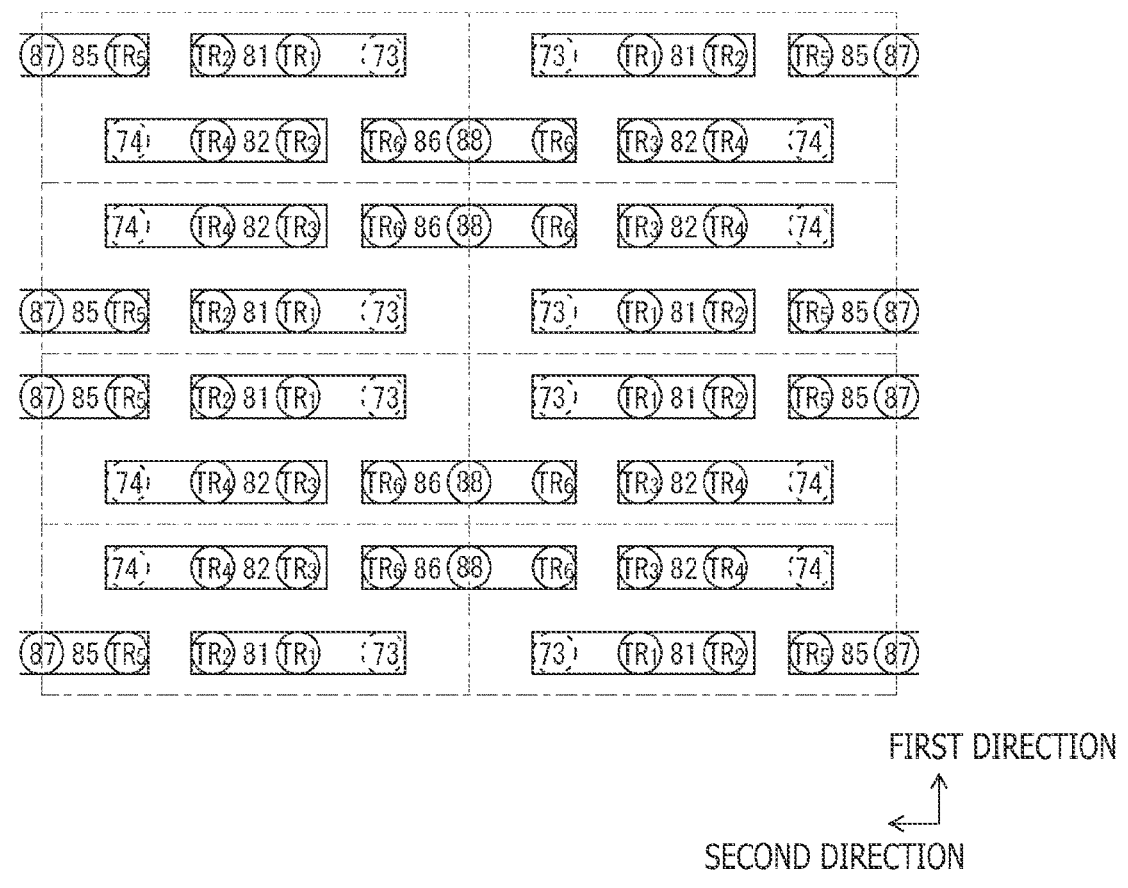
Figure 35:
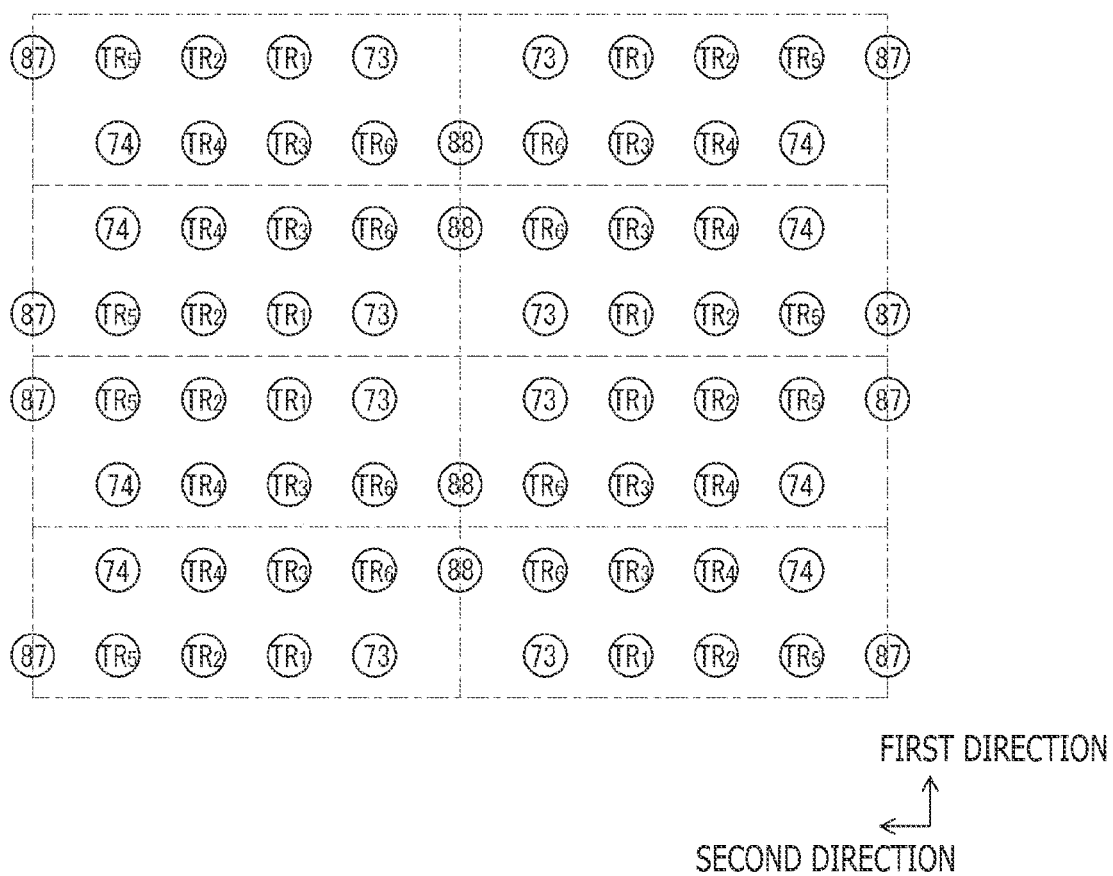
FIG. 35 is a conceptual view of an arrangement state of components configuring the memory cell of the working example 4 when the memory cell of the working example 4 is cut along a virtual horizontal plane including arrow marks D-D of FIG. 30A.

A schematic partial sectional view of the memory cell of the working example 4 taken along arrow marks A-A of FIG. 36 is depicted in FIG. 30A; a schematic partial sectional view of the memory cell of the working example 4 taken along arrow marks B-B of FIG. 36 is depicted in FIG. 30B; and an equivalent circuit diagram of the memory cell of the working example 4 is depicted in FIG. 31. Further, conceptual views of an arrangement state of components that configure the memory cell of the working example 4 when the memory cell of the working example 4 is cut along a virtual horizontal plane including arrow marks A-A of FIG. 30A of the memory cell of the working example 4, a virtual horizontal plane including arrow marks B-B of FIG. 30A, a virtual horizontal plane including arrow marks C-C of FIG. 30A, a virtual horizontal plane including arrow marks D-D of FIG. 30A, a virtual horizontal plane including arrow marks E-E of FIG. 30A, and a virtual horizontal plane including arrow marks F-F of FIG. 30A are depicted in FIGS. 32, 33, 34, 35, 36, and 37. It is to be noted that, in FIGS. 30A and 30B, part of hatching lines are omitted, and in FIG. 30B, a side face of the word line (WL) 95 is depicted. Further, in FIGS. 32, 33, 34, 35, 36, and 37, eight memory cells are depicted, and a boundary line between memory cells is indicated by a dashed line.

In the memory cell of the working example 4, the source regions 13, 23, 33, and 43 of the 1Ath transistor $TR_1$, the 1Bth transistor $TR_2$, the 2Ath transistor $TR_3$, and the 2Bth transistor $TR_4$ and the other source/drain regions 53 and 63 of the first transfer transistor $TR_5$ and the second transfer transistor $TR_6$ are formed on the substrate 70 (particularly, just above the substrate 70), and the first power supply line 91, the second power supply line 92, the first bit line 93, and the second bit line 94 are formed on the substrate 70 (particularly, on the top face portion of the substrate 70). The first power supply line 91, second power supply line 92, first bit line 93 and second bit line 94 include a high concentration impurity region or a conductive material layer formed on the substrate 70 (particularly, on the top face portion of the substrate 70) or include a metal material layer surrounded by an insulating material layer and isolated from the surroundings.

In the memory cell of the working example 4, the other source/drain region 53 of the first transfer transistor $TR_5$ is connected to the first bit line 93 (BL), and the other source/drain region 63 of the second transfer transistor $TR_6$ is connected to the second bit line 94 (BL'). The source region 13 of the 1Ath transistor TR$_1$ and the source region 33 of the 2Ath transistor TR$_3$ are connected to the common first power supply line 91. The source regions 23 and 43 of the 1Bth transistor TR$_2$ and the 2Bth transistor TR$_4$ are connected to the common second power supply line 92. The drain region 11 of the 1Ath transistor TR$_1$, the drain region 21 of the 1Bth transistor TR$_2$, and the one source/drain region 51 of the first transfer transistor TR$_5$ are connected to the first drain region-connection portion 71 through the connection holes 14, 24, and 54, and the drain region 31 of the 2Ath transistor TR$_3$, the drain region 41 of the 2Bth transistor TR$_4$, and the one source/drain region 61 of the second transfer transistor TR$_6$ are connected to the second drain region-connection portion 72 through the respective connection holes 34, 44, and 64. The first drain region-connection portion 71 and the second drain region-connection portion 72 are provided on the interlayer insulating layer 79C. Above the first transfer transistor TR$_5$ and the second transfer transistor TR$_6$, the first power supply line 91 and the second power supply line 92 are not provided.

The first gate electrode layer 81 common to the 1Ath transistor TR$_1$ and the 1Bth transistor TR$_2$ is connected to the second drain region-connection portion 72 through the first gate electrode-connection portion 73 provided on the insulating layer 79B and the interlayer insulating layer 79C, and the gate electrode layer (second gate electrode layer) 82 common to the 2Ath transistor TR$_3$ and the 2Bth transistor TR$_4$ is connected to the first drain region-connection portion 71 through the second gate electrode-connection portion 74 provided on the insulating layer 79B and the interlayer insulating layer 79C.

Since the memory cell of the working example 4 can be made substantially similar in configuration and structure to the memory cell of the working example 2 except the points described above, detailed description of the same is omitted.

Although the present disclosure has been described on the basis of the preferred working examples, the configurations and structures of the memory cell or the CMOS inverter circuit described in connection with the working examples, the materials configuring the memory cell or the CMOS inverter circuit, and the fabrication method of the memory cell or the CMOS inverter circuit are exemplary and can be changed suitably. Further, the order of the steps in the fabrication method of the memory cell described hereinabove in connection with the working example 1 can be changed suitably, as desired. Although, in the description of the working examples, the channel structure portion is described on the basis of the nanowire structure, it is also possible to use a nanosheet structure or a nanotube structure. It is also possible to use, as the substrate, a SOI substrate in place of a silicon semiconductor substrate.

The memory cell (SRAM) of the present disclosure can be applied to a 2-Port-SRAM and a dual Port-SRAM.

Figure 38B:
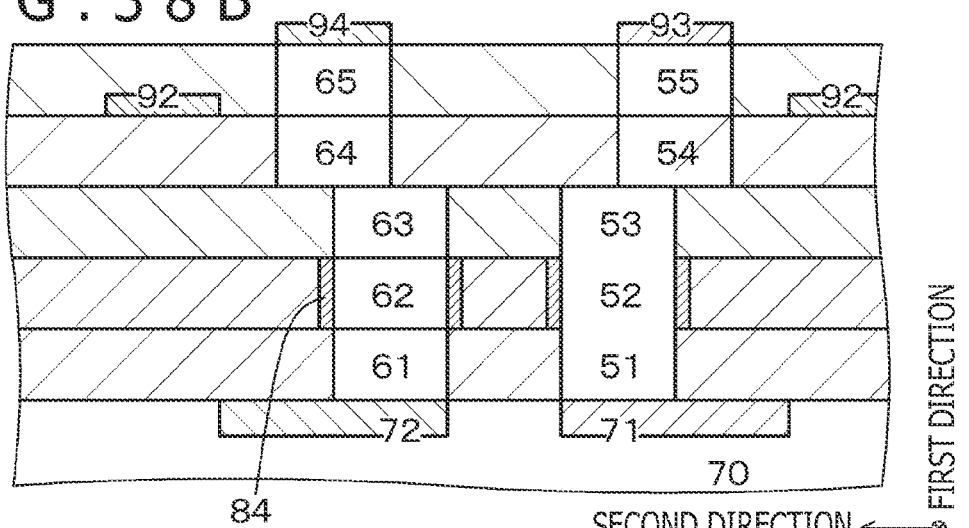
Figure 38C:
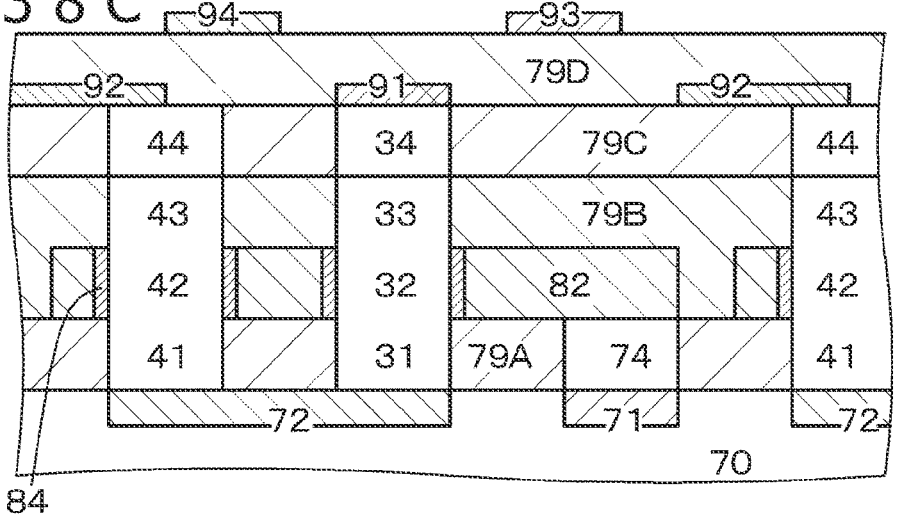
Figure 39:
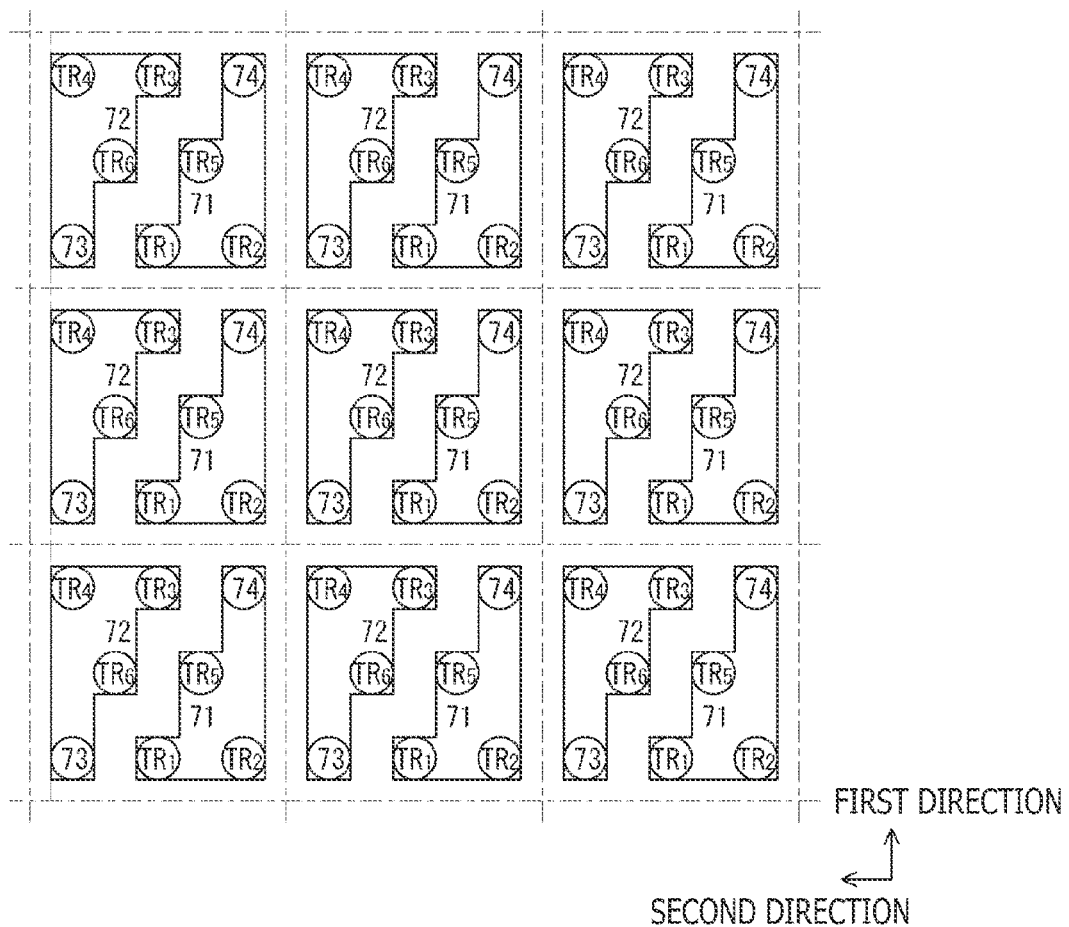
FIG. 39 is a conceptual view of an arrangement state of components configuring the third modification of the memory cell of the working example 1 when the third modification of the memory cell of the working example 1 is cut along a virtual horizontal plane including arrow marks A-A of FIG. 38A.
Figure 40:
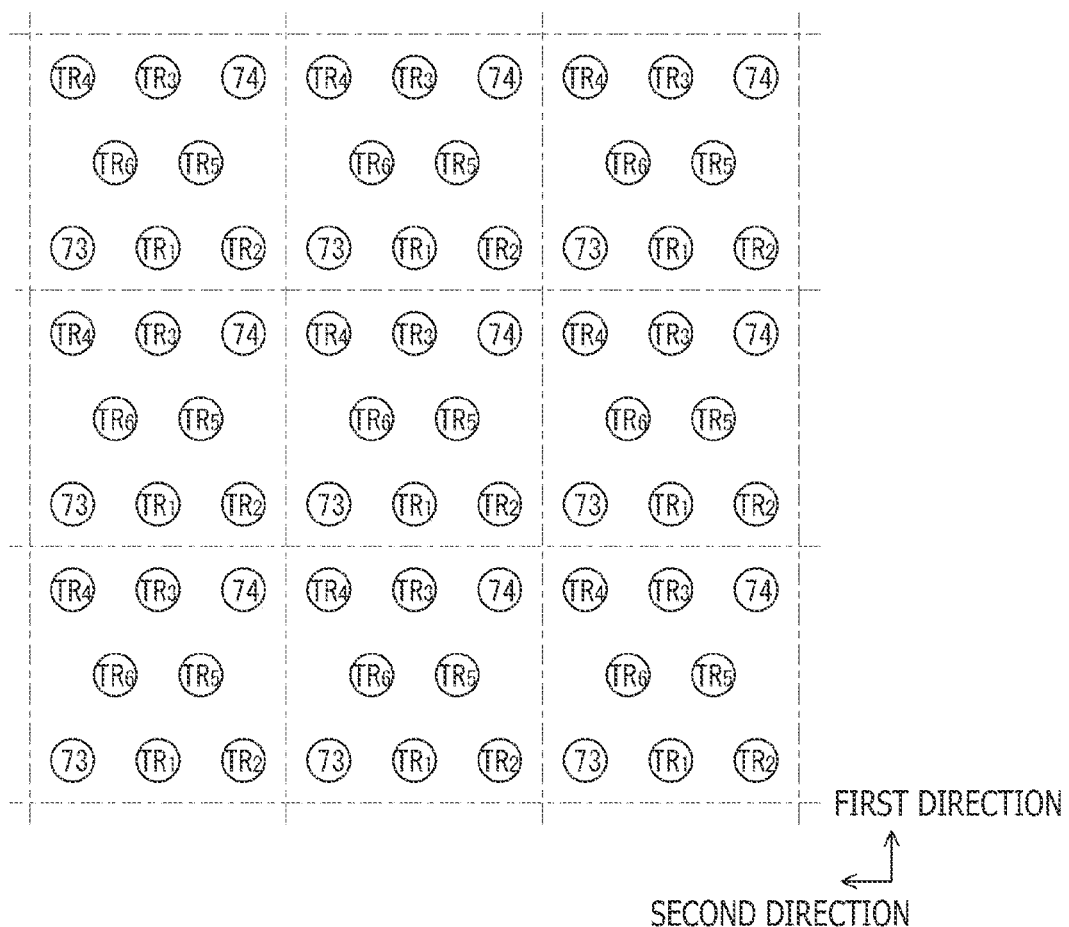
FIG. 40 is a conceptual view of an arrangement state of components configuring the third modification of the memory cell of the working example 1 when the third modification of the memory cell of the working example 1 is cut along a virtual horizontal plane including arrow marks B-B of FIG. 38A.
Figure 41:
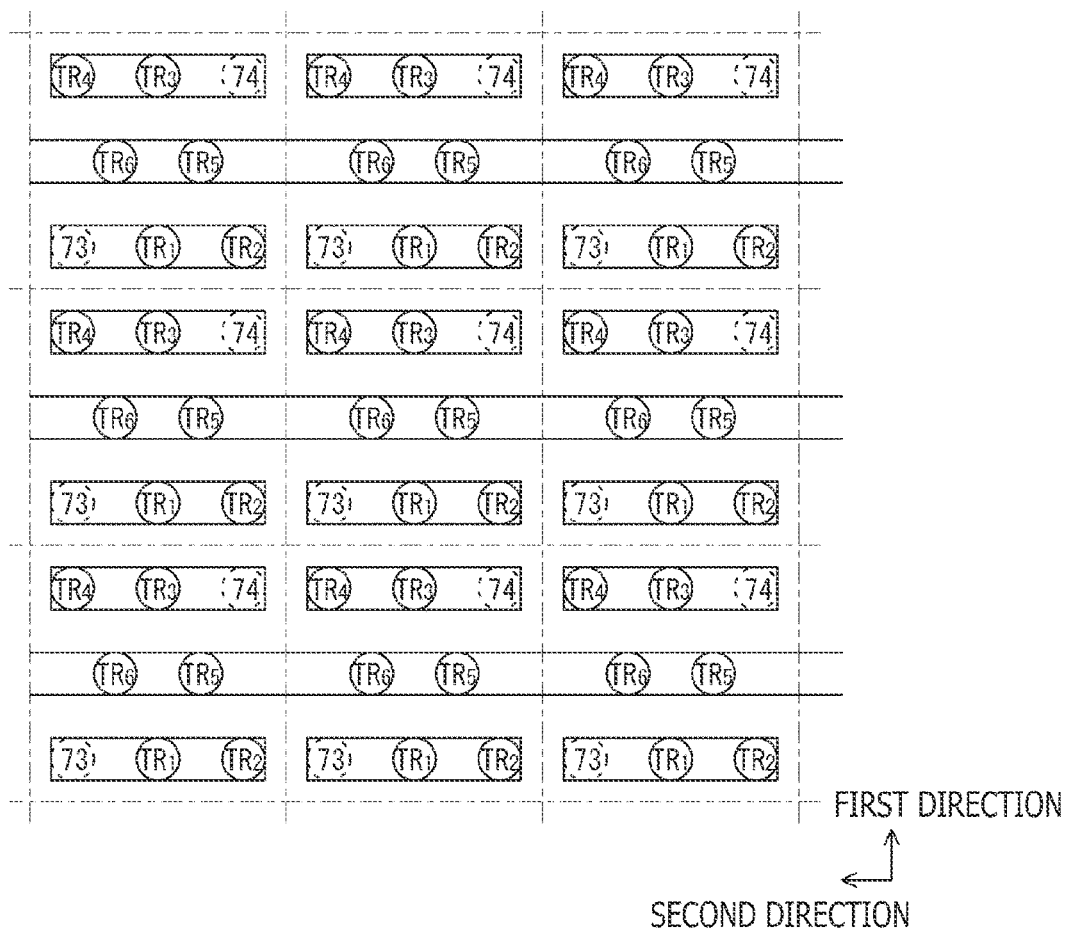
FIG. 41 is a conceptual view of an arrangement state of components configuring the third modification of the memory cell of the working example 1 when the third modification of the memory cell of the working example 1 is cut along a virtual horizontal plane including arrow marks C-C of FIG. 38A.
Figure 42:
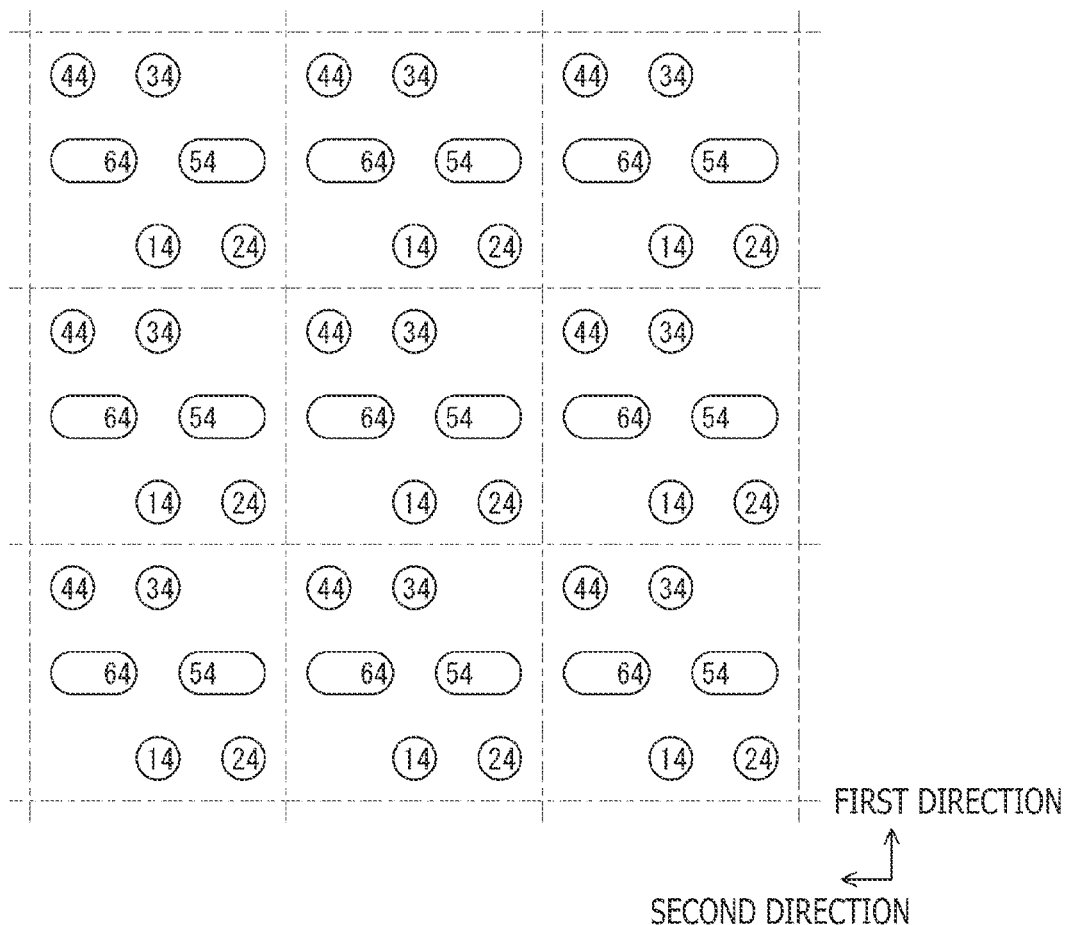
FIG. 42 is a conceptual view of an arrangement state of components configuring the third modification of the memory cell of the working example 1 when the third modification of the memory cell of the working example 1 is cut along a virtual horizontal plane including arrow marks D-D of FIG. 38A.
Figure 43:
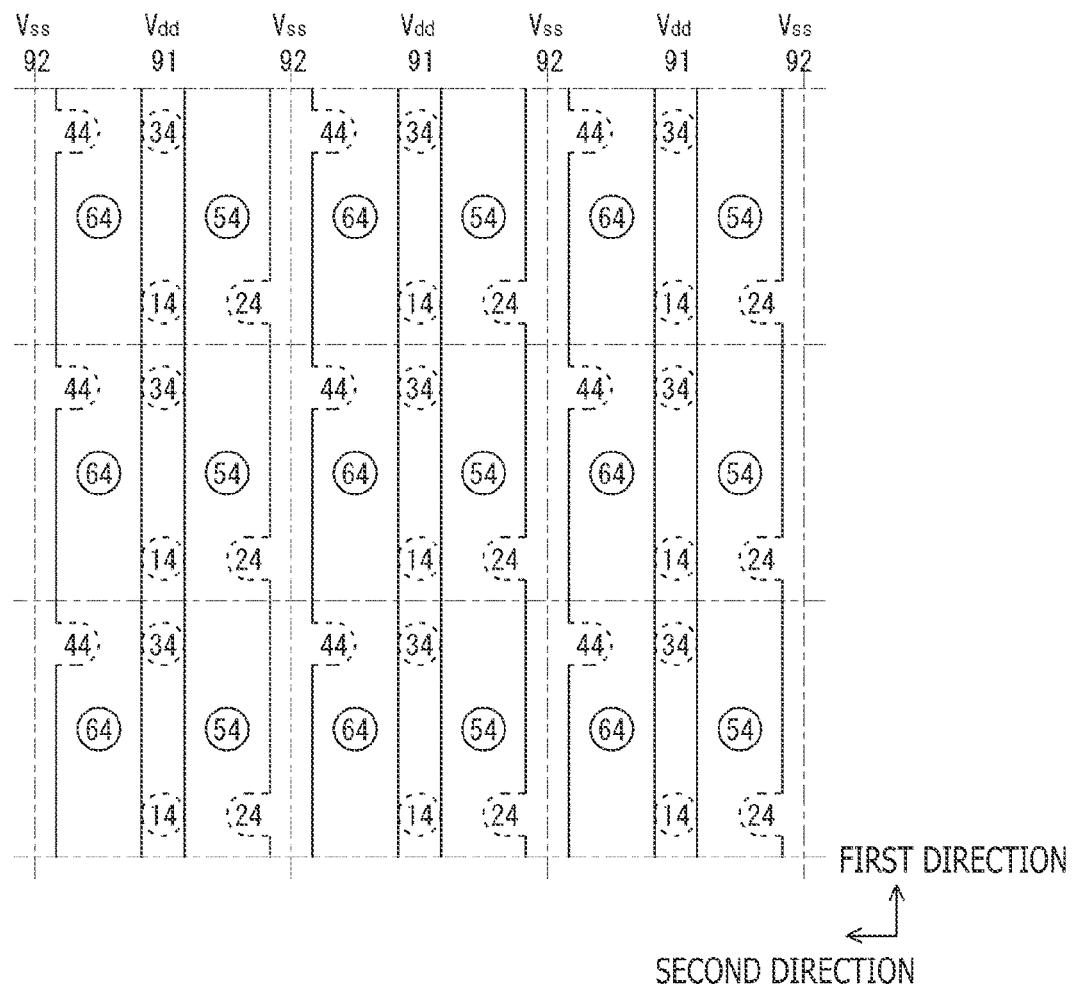
FIG. 43 is a conceptual view of an arrangement state of components configuring the third modification of the memory cell of the working example 1 when the third modification of the memory cell of the working example 1 is cut along a virtual horizontal plane including arrow marks E-E of FIG. 38A.
Figure 44:
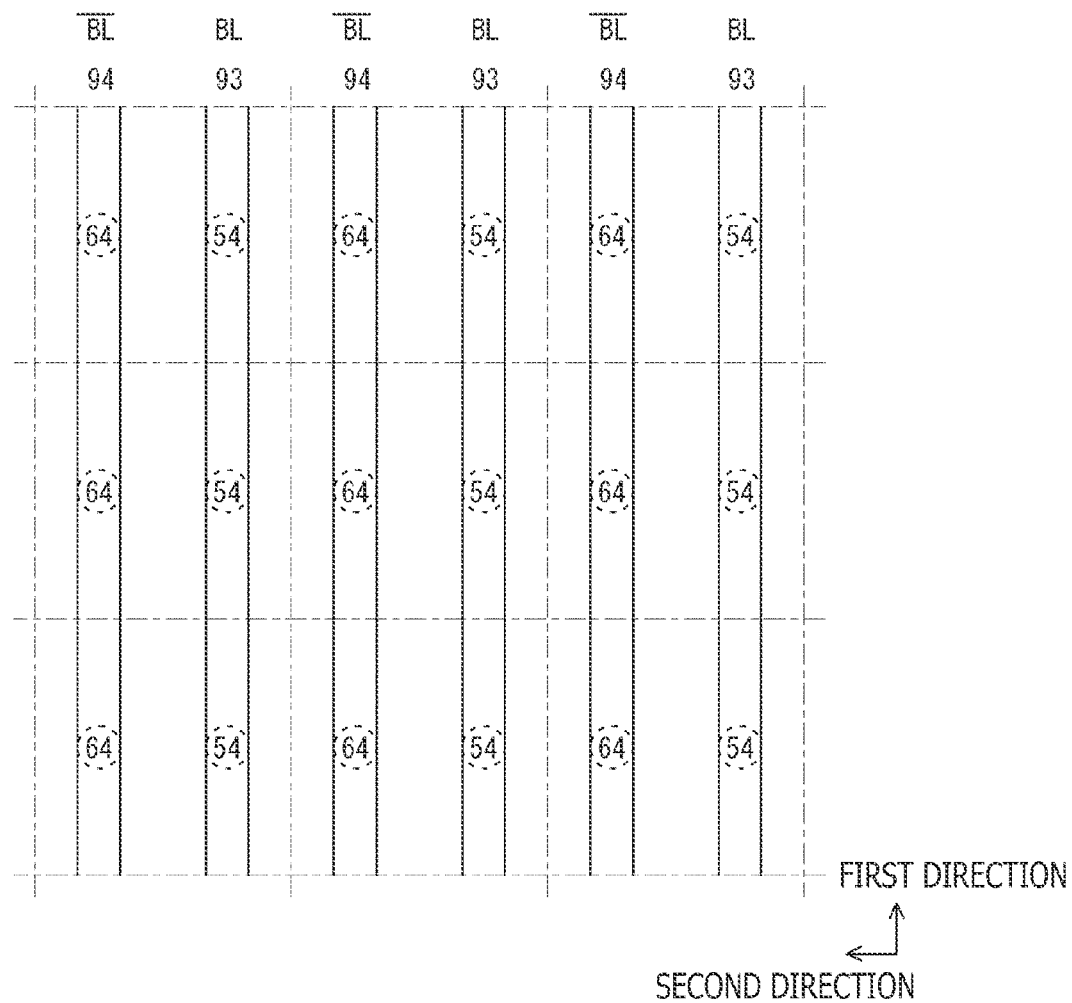
FIG. 44 is a conceptual view of an arrangement state of components configuring the third modification of the memory cell of the working example 1 when the third modification of the memory cell of the working example 1 is cut along a virtual horizontal plane including arrow marks F-F of FIG. 38A.
Figure 45:
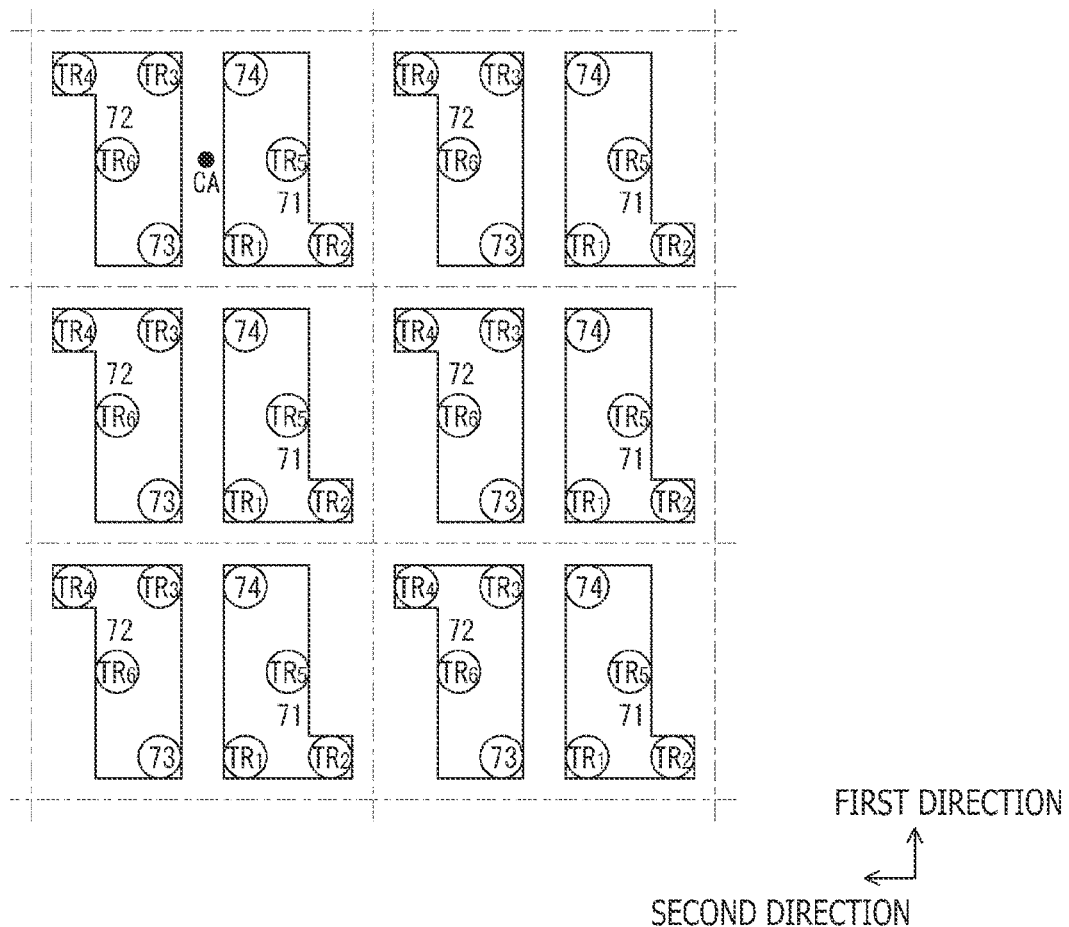
FIG. 45 is a conceptual view of an arrangement state of components configuring the third modification of the memory cell of the working example 1 when the third modification of the memory cell of the working example 1 is cut along a virtual horizontal plane similar to the virtual horizontal plane including arrow marks A-A of FIG. 38A.

Schematic partial sectional views of a third modification of the memory cell of the working example 1 taken along arrow marks A-A, arrow marks B-B, and arrow marks C-C of FIG. 39 are depicted in FIGS. 38A, 38B, and 38C. Further, an arrangement state of components configuring the third modification of the memory cell of the working example 1 when the third modification of the memory cell of the working example 1 is cut along a virtual horizontal plane including arrow marks A-A of FIG. 38A, a virtual horizontal plane including arrow marks B-B of FIG. 38A, a virtual horizontal plane including arrow marks C-C of FIG. 38A, a virtual horizontal plane including arrow marks D-D of FIG. 38A, a virtual horizontal plane including arrow marks E-E of FIG. 38A, and a virtual horizontal plane including arrow marks F-F of FIG. 38A is depicted in the conceptual views of FIGS. 39, 40, 41, 42, 43, and 44. In the memory cell of the third modification of the working example 1, different from the memory cell described hereinabove in connection with the working example 1,

[A] an orthogonal projection image of the drain region, the channel formation region, and the source region configuring the 1Ath transistor to a virtual plane (virtual vertical plane) vertical to the first direction and

[C] an orthogonal projection image of the drain region, the channel formation region, and the source region configuring the 2Ath transistor to the virtual plane (virtual vertical plane) vertical to the first direction, which are described hereinabove, overlap with each other, and besides,

[B] an orthogonal projection image of the drain region, the channel formation region, and the source region configuring the 1Bth transistor to the virtual plane (virtual vertical plane) vertical to the first direction and

[D'] an orthogonal projection image of the drain region, the channel formation region, and the source region configuring the 2Bth transistor, which is the 2Bth transistor TR$_4$ adjacent to the 1Bth transistor TR$_2$, to the virtual plane (virtual vertical plane) vertical to the first direction have a gap therebetween. The first power supply line 91 is positioned above the 1Ath transistor TR$_1$ and the 1Bth transistor TR$_2$. On the other hand, the second power supply line 92 is positioned above a region between the 1Bth transistor TR$_2$ and the 2Bth transistor TR$_4$ adjacent to the 1Bth transistor TR$_2$. In particular, although the orthogonal projection image of the first power supply line 91 overlaps with the orthogonal projection image of the 1Ath transistor TR$_1$ and the 1Bth transistor TR$_2$, the second power supply line 92 does not overlap with the orthogonal projection image of the 1Bth transistor TR$_2$ and the 2Bth transistor TR$_4$. The first bit line 93 is positioned above in a displaced relation with respect to the first transfer transistor TR$_5$ on the 1Bth transistor TR$_2$ side, and the second bit line 94 is positioned above in a displaced relation with respect to the second transfer transistor TR$_6$ on the 2Bth transistor TR$_4$ side. In particular, the first bit line 93 and the second bit line 94 are provided above a region positioned between the first power supply line 91 and the second power supply line 92, and the orthogonal projection image of the first bit line 93 and the second bit line 94 does not overlap with the orthogonal projection image of the first power supply line 91 and the second power supply line 92.

Further, an arrangement state of components configuring a fourth modification of the memory cell of the working example 1 when the fourth modification of the memory cell of the working example 1 is cut along the virtual horizontal plane including arrow marks A-A of FIG. 38A, a virtual horizontal plane including arrow marks B-B of FIG. 38A, a virtual horizontal plane including arrow marks C-C of FIG. 38A, a virtual horizontal plane including arrow marks D-D of FIG. 38A, a virtual horizontal plane including arrow marks E-E of FIG. 38A, and a virtual horizontal plane including arrow marks F-F of FIG. 38A is depicted in conceptual views of FIGS. 45, 46, 47, 48, 49, and 50. In the memory cell of the fourth modification of the working example 1, different from the memory cell described hereinabove in connection with the working example 1,

[A] an orthogonal projection image of the drain region, the channel formation region, and the source region configuring the 1Ath transistor to a virtual plane (virtual vertical plane) vertical to the first direction and

[C] an orthogonal projection image of the drain region, the channel formation region, and the source region configuring the 2Ath transistor to the virtual plane (virtual vertical plane) vertical to the first direction, which are described hereinabove, do not overlap with each other, and besides a gap is provided between the orthogonal projection images. The first power supply line 91 is positioned above a region between the 1Ath transistor $TR_1$ and the 1Bth transistor $TR_2$ and the second power supply line 92 is positioned above a region between the 1Bth transistor $TR_2$ and the 2Bth transistor $TR_4$ adjacent to the 1Bth transistor $TR_2$. The orthogonal projection image of the first power supply line 91 does not overlap with the orthogonal projection image of the 1Ath transistor $TR_1$ and the 1Bth transistor $TR_2$, and the second power supply line 92 does not overlap with the orthogonal projection image of the 1Bth transistor $TR_2$ and the 2Bth transistor $TR_4$. The first bit line 93 is positioned above the first transfer transistor $TR_5$, and the second bit line 94 is positioned above the second transfer transistor $TR_6$.

The positions of the connection holes 87 and 88 may be changed in such a manner as depicted in FIG. 51 that depicts a conceptual view of the arrangement state of components configuring a first modification of the memory cell of the working example 2 when the first modification of the memory cell of the working example 2 is cut along a virtual horizontal plane similar to that depicted in FIG. 17.

Although, in the working examples, the first power supply line is made common to the source region of the 1Ath transistor and the source region of the 2Ath transistor and the second power supply line is made common to the source region of the 1Bth transistor and the source region of the 2Bth transistor, in some cases, the first power supply line may be made common to the source region of the 1Ath transistor and the source region of the 2Ath transistor while two second power supply lines are individually connected to the source region of the 1Bth transistor and the source region of the 2Bth transistor, or two first power supply lines are individually connected to the source region of the 1Ath transistor and the source region of the 2Ath transistor while the second power supply line is made common to the source region of the 1Bth transistor and the source region of the 2Bth transistor.

It is to be noted that it is also possible for the present disclosure to have such configurations as described below.

[A01]

<<Imaging Device>>

A memory cell including:

a flip-flop circuit including a first CMOS inverter circuit and a second inverter circuit; and two transfer transistors, in which the first CMOS inverter includes a 1Ath transistor including a pMOS transistor that includes a drain region, a channel formation region, and a source region stacked one on another and further includes a gate electrode layer, and a 1Bth transistor including an nMOS transistor that includes a drain region, a channel formation region, and a source region stacked one on another and further includes a gate electrode layer, a second CMOS inverter circuit includes a 2Ath transistor including a pMOS transistor that includes a drain region, a channel formation region, and a source region stacked one on another and further includes a gate electrode layer, and a 2Bth transistor including an nMOS transistor that includes a drain region, a channel formation region, and a source region stacked one on another and further includes a gate electrode layer, each of the transfer transistors includes a drain region, a channel formation region, and a source region stacked one on another and further includes a gate electrode layer, the drain region of the 1Ath transistor and the drain region of the 1Bth transistor are connected to a common first drain region-connection portion, the drain region of the 2Ath transistor and the drain region of the 2Bth transistor are connected to a common second drain region-connection portion, the gate electrode layer common to the 1Ath transistor and the 1Bth transistor is connected to the second drain region-connection portion through a first gate electrode-connection portion, the gate electrode layer common to the 2Ath transistor and the 2Bth transistor is connected to the first drain region-connection portion through a second gate electrode-connection portion, the source region of the 1Ath transistor and the source region of the 2Ath transistor are connected to a common first power supply line, and the source region of the 1Bth transistor and the source region of the 2Bth transistor are connected to a common second power supply line.

[A02]

The memory cell according to [A01], in which the drain regions of the 1Ath transistor, the 1Bth transistor, the 2Ath transistor, and the 2Bth transistor and one source/drain regions of the first transfer transistor and the second transfer transistor are formed on a substrate, and the first drain region-connection portion and the second drain region-connection portion are formed on the substrate.

[A03]

The memory cell according to [A02], in which the first drain region-connection portion and the second drain region-connection portion each include a high concentration impurity region or a conductive material layer formed on the substrate.

[A04]

The memory cell according to [A01], in which the source regions of the 1Ath transistor, the 1Bth transistor, the 2Ath transistor, and the 2Bth transistor and one source/drain regions of the first transfer transistor and the second transfer transistor are formed on a substrate, and the first power supply line and the second power supply line are formed on the substrate.

[A05]

The memory cell according to [A04], in which the first power supply line and the second power supply line each include a high concentration impurity region or a conductive material layer formed on the substrate.

[A06]

The memory cell according to any one of [A01] to [A05], in which another source/drain region of the first transfer transistor is connected to a first bit line, another source/drain region of the second transfer transistor is connected to a second bit line, the one source/drain region of the first transfer transistor is connected to the first drain region-connection portion, and the one source/drain region of the second transfer transistor is connected to the second drain region-connection portion.

[A07]

The memory cell according to [A06], in which the first power supply line, the second power supply line, the first bit line, and the second bit line extend in a first direction.

[A08]

The memory cell according to any one of [A01] to [A07], in which, where a direction in which the first power supply line, the second power supply line, the first bit line, and the second bit line extend is assumed to be a first direction and a direction orthogonal to the first direction is assumed to be a second direction, adjacent memory cells are arranged line symmetrically with respect to a boundary line extending in the first direction, a boundary line extending in the second direction, or boundary lines extending in the first direction and the second direction.

[A09]

The memory cell according to any one of [A01] to [A08], in which the first CMOS inverter circuit and a second inverter circuit are arranged two times symmetrically with respect to a center axis of the memory cell.

[A10]

The memory cell according to any one of [A01] to [A9], in which the gate electrode layer common to the first transfer transistor and the second transfer transistor serves also as a word line, and the word line extends in the second direction different from the first direction in which the first power supply line, the second power supply line, the first bit line, and the second bit line extend.

[A11]

The memory cell according to [A10], in which an orthogonal projection image of the first power supply line overlaps with part of an orthogonal projection image of the source region of the 1Ath transistor and besides overlaps with part of an orthogonal projection image of the source region of the 2Ath transistor, and an orthogonal projection image of the second power supply line overlaps with part of an orthogonal projection image of the source region of the 1Bth transistor and besides overlaps with part of an orthogonal projection image of the source region of the 2Bth transistor.

[A12]

The memory cell according to [A10] or [A11], in which an orthogonal projection image of the drain region, the channel formation region, and the source region configuring the 1Ath transistor and the drain region, the channel formation region, and the source region configuring the 1Bth transistor to a virtual plane vertical to a first direction, an orthogonal projection image of the drain region, the channel formation region, and the source region configuring the 2Ath transistor and the drain region, the channel formation region, and the source region configuring the 2Bth transistor to a virtual plane vertical to the first direction, an orthogonal projection image of the one source/drain region, the channel formation region, and the other source/drain region configuring the first transfer transistor to a virtual plane vertical to the first direction, and an orthogonal projection image of the one source/drain region, the channel formation region, and the other source/drain region configuring the second transfer transistor to a virtual plane vertical to the first direction do not substantially overlap with each other.

[A13]

The memory cell according to any one of [A10] to [A12], in which an orthogonal projection image of the drain region, the channel formation region, and the source region configuring the 1Ath transistor to a virtual plane vertical to the second direction and an orthogonal projection image of the drain region, the channel formation region, and the source region configuring the 1Bth transistor to a virtual plane vertical to the second direction substantially overlap with each other, an orthogonal projection image of the drain region, the channel formation region, and the source region configuring the 2Ath transistor to a virtual plane vertical to the second direction and an orthogonal projection image of the drain region, the channel formation region, and the source region configuring the 2Bth transistor to a virtual plane vertical to the second direction substantially overlap with each other, and an orthogonal projection image of the one source/drain region, the channel formation region, and the other source/drain region configuring the first transfer transistor to a virtual plane vertical to the second direction and an orthogonal projection image of the one source/drain region, the channel formation region, and the other source/drain region configuring the second transfer transistor to a virtual plane vertical to the second direction substantially overlap with each other.

[A14]

The memory cell according to any one of [A10] to [A13], in which the first power supply line and the second power supply line are arranged in a first level, and the first bit line and the second bit line are arranged in a second level different from the first level.

[A15]

The memory cell according to any one of [A01] to [A09], in which the gate electrode layer common to the first transfer transistor and the second transfer transistor is connected to a word line, and the word line extends in the second direction different from the first direction in which the first power supply line, the second power supply line, the first bit line, and the second bit line extend.

[A16]

The memory cell according to [A15], in which an orthogonal projection image of the drain region, the channel formation region, and the source region configuring the 1Ath transistor to a virtual plane vertical to the second direction, an orthogonal projection image of the drain region, the channel formation region, and the source region configuring the 1Bth transistor to a virtual plane vertical to the second direction, and an orthogonal projection image of the one source/drain region, the channel formation region, and the other source/drain region configuring the first transfer transistor substantially overlap with each other, and an orthogonal projection image of the drain region, the channel formation region, and the source region configuring the 2Ath transistor to a virtual plane vertical to the second direction, an orthogonal projection image of the drain region, the channel formation region, and the source region configuring the 2Bth transistor to the virtual plane vertical to the second direction, and an orthogonal projection image of the one source/drain region, the channel formation region, and the other source/drain region configuring the second transfer transistor substantially overlap with each other.

[A17]

The memory cell according to [A15] or [A16], in which the first power supply line, the second power supply line, the first bit line, and the second bit line are arranged in a first level, and the word line is arranged in a second level different from the first level.

[A18]

The memory cell according to any one of [A01] to [A17], in which the first power supply line and the second power supply line are not provided above the first transfer transistor and the second transfer transistor.

[B01]

<<CMOS Inverter Circuit>>

A CMOS inverter circuit including:

a pMOS transistor that includes a drain region, a channel formation region, and a source region stacked one on another and further includes a gate electrode layer; and an nMOS transistor that includes a drain region, a channel formation region, and a source region stacked one on another and further includes a gate electrode layer, in which the drain region of the pMOS transistor and the drain region of the nMOS transistor are connected to a common drain region-connection portion, the gate electrode layer common to the pMOS transistor and the nMOS transistor is connected to a common gate wiring portion formed on a substrate, through a gate electrode-connection portion, the source region of the pMOS transistor is connected to a first power supply line, and the source region of the nMOS transistor is connected to a second power supply line.

[B02]

The CMOS inverter circuit according to [B01], in which the drain region of the pMOS transistor and the drain region of the nMOS transistor are formed on the substrate, and the common drain region-connection portion is formed on the substrate.

[B03]

The CMOS inverter circuit according to [B01], in which the source region of the pMOS transistor and the source region of the nMOS transistor are formed on the substrate, and the first power supply line and the second power supply line are formed on the substrate.

REFERENCE SIGNS LIST $TR_1$ . . . 1Ath transistor, $TR_2$ . . . 1Bth transistor, $TR_3$ . . . 2Ath transistor, $TR_4$ . . . 2Bth transistor, $TR_5$ . . . First transfer transistor, $TR_6$ . . . Second transfer transistor, 11, 21, 31, 41 . . . Drain region, 51, 61 . . . One source/drain region, 12, 22, 32, 42, 52, 62 . . . Channel formation region, 13, 23, 33, 43 . . . Source region, 53, 63 . . . Other source/drain region, 14, 24, 34, 44, 54, 55, 64, 65, 76, 78, 87, 88 . . . Connection hole, 70 . . . Substrate, 71 . . . First drain region-connection portion (gate wiring portion), 72 . . . Second drain region-connection portion (gate wiring portion), 73 . . . First gate electrode-connection portion (via or connection hole), 74 . . . Second gate electrode-connection portion (via or connection hole), 75, 77 . . . Connection portion, 79A, 79B . . . Insulating layer, 79C, 79D . . . Interlayer insulating layer, 81 . . . Gate electrode layer (first gate electrode layer), 82 . . . Gate electrode layer (second gate electrode layer), 83 . . . Gate electrode layer (third gate electrode layer), 84 . . . Gate insulating film, 85 . . . Gate electrode layer of first transfer transistor, 86 . . . Gate electrode layer of second transfer transistor, 91 . . . First power supply line, 92 . . . Second power supply line, 93 . . . First bit line, 94 . . . Second bit line (BL'), 95 . . . Word line, 96 . . . Wiring portion

What is claimed is:

1. A memory cell, comprising:
   a flip-flop circuit including a first complementary metal-oxide-semiconductor (CMOS) inverter circuit and a second CMOS inverter circuit; and
   two transfer transistors,
   wherein the first CMOS inverter circuit includes:
      a 1Ath transistor including a p metal-oxide-semiconductor (MOS) transistor that includes a drain region, a channel formation region, and a source region stacked one on another and further includes a gate electrode layer; and
      a 1Bth transistor including an nMOS transistor that includes a drain region, a channel formation region, and a source region stacked one on another and further includes a gate electrode layer,
   wherein the second CMOS inverter circuit includes:
      a 2Ath transistor including a pMOS transistor that includes a drain region, a channel formation region, and a source region stacked one on another and further includes a gate electrode layer, and
      a 2Bth transistor including an nMOS transistor that includes a drain region, a channel formation region, and a source region stacked one on another and further includes a gate electrode layer,
   wherein each of the two transfer transistors includes a drain region, a channel formation region, and a source region stacked one on another and further includes a gate electrode layer,
   wherein the drain region of the 1Ath transistor and the drain region of the 1Bth transistor are connected to a common first drain region-connection portion,
   wherein the drain region of the 2Ath transistor and the drain region of the 2Bth transistor are connected to a common second drain region-connection portion,
   wherein the gate electrode layer common to the 1Ath transistor and the 1Bth transistor is connected to the common second drain region-connection portion through a first gate electrode-connection portion,
   wherein the gate electrode layer common to the 2Ath transistor and the 2Bth transistor is connected to the common first drain region-connection portion through a second gate electrode-connection portion,
   wherein the source region of the 1Ath transistor and the source region of the 2Ath transistor are connected to a common first power supply line, and
   wherein the source region of the 1Bth transistor and the source region of the 2Bth transistor are connected to a common second power supply line, and
   wherein the gate electrode layer common to the first transfer transistor and the second transfer transistor serves also as a word line.

2. The memory cell according to claim 1, wherein the drain regions of the 1Ath transistor, the 1Bth transistor, the 2Ath transistor, and the 2Bth transistor and one source/drain region of the first transfer transistor and the second transfer transistor are formed on a substrate, and the common first drain region-connection portion and the common second drain region-connection portion are formed on the substrate.

3. The memory cell according to claim 2, wherein the common first drain region-connection portion and the common second drain region-connection portion each include a high concentration impurity region or a conductive material layer formed on the substrate.

4. The memory cell according to claim 1, wherein
the source regions of the 1Ath transistor, the 1Bth transistor, the 2Ath transistor, and the 2Bth transistor and one source/drain region of the first transfer transistor and the second transfer transistor are formed on a substrate, and
the common first power supply line and the common second power supply line are formed on the substrate.

5. The memory cell according to claim 4, wherein the common first power supply line and the common second power supply line each include a high concentration impurity region or a conductive material layer formed on the substrate.

6. The memory cell according to claim 1, wherein
another source/drain region of the first transfer transistor is connected to a first bit line,
another source/drain region of the second transfer transistor is connected to a second bit line,
one source/drain region of the first transfer transistor is connected to the common first drain region-connection portion, and
one source/drain region of the second transfer transistor is connected to the common second drain region-connection portion.

7. The memory cell according to claim 6, wherein the common first power supply line, the common second power supply line, the first bit line, and the second bit line extend in a first direction.

8. The memory cell according to claim 1, wherein, where a direction in which the common first power supply line, the common second power supply line, a first bit line, and a second bit line extend is assumed to be a first direction and a direction orthogonal to the first direction is assumed to be a second direction, adjacent memory cells are arranged line symmetrically with respect to a boundary line extending in the first direction, a boundary line extending in the second direction, or boundary lines extending in the first direction and the second direction.

9. The memory cell according to claim 1, wherein the first CMOS inverter circuit and the second CMOS inverter circuit are arranged two times symmetrically with respect to a center axis of the memory cell.

10. The memory cell according to claim 1, wherein
an orthogonal projection image of the common first power supply line overlaps with part of an orthogonal projection image of the source region of the 1Ath transistor and besides overlaps with part of an orthogonal projection image of the source region of the 2Ath transistor, and
an orthogonal projection image of the common second power supply line overlaps with part of an orthogonal projection image of the source region of the 1Bth transistor and besides overlaps with part of an orthogonal projection image of the source region of the 2Bth transistor.

11. The memory cell according to claim 1, wherein an orthogonal projection image of the drain region, the channel formation region, and the source region configuring the 1Ath transistor and the drain region, the channel formation region, and the source region configuring the 1Bth transistor to a virtual plane vertical to a first direction, an orthogonal projection image of the drain region, the channel formation region, and the source region configuring the 2Ath transistor and the drain region, the channel formation region, and the source region configuring the 2Bth transistor to a virtual plane vertical to the first direction, an orthogonal projection image of one source/drain region, the channel formation region, and another source/drain region configuring the first transfer transistor to a virtual plane vertical to the first direction, and an orthogonal projection image of one source/drain region, the channel formation region, and another source/drain region configuring the second transfer transistor to a virtual plane vertical to the first direction do not substantially overlap with each other.

12. The memory cell according to claim 1, wherein
an orthogonal projection image of the drain region, the channel formation region, and the source region configuring the 1Ath transistor to a virtual plane vertical to a second direction and an orthogonal projection image of the drain region, the channel formation region, and the source region configuring the 1Bth transistor to a virtual plane vertical to the second direction substantially overlap with each other,
an orthogonal projection image of the drain region, the channel formation region, and the source region configuring the 2Ath transistor to a virtual plane vertical to the second direction and an orthogonal projection image of the drain region, the channel formation region, and the source region configuring the 2Bth transistor to a virtual plane vertical to the second direction substantially overlap with each other, and
an orthogonal projection image of one source/drain region, the channel formation region, and another source/drain region configuring the first transfer transistor to a virtual plane vertical to the second direction and an orthogonal projection image of one source/drain region, the channel formation region, and another source/drain region configuring the second transfer transistor to a virtual plane vertical to the second direction substantially overlap with each other.

13. The memory cell according to claim 1, wherein
the common first power supply line and the common second power supply line are arranged in a first level, and
a first bit line and a second bit line are arranged in a second level different from the first level.

14. The memory cell according to claim 1, wherein
the common first power supply line, the common second power supply line, a first bit line, and a second bit line are arranged in a first level, and
the word line is arranged in a second level different from the first level.

15. A memory cell, comprising:
a flip-flop circuit including a first complementary metal-oxide-semiconductor (CMOS) inverter circuit and a second CMOS inverter circuit; and
two transfer transistors,
wherein the first CMOS inverter circuit includes:
a 1Ath transistor including a p metal-oxide-semiconductor (MOS) transistor that includes a drain region, a channel formation region, and a source region stacked one on another and further includes a gate electrode layer; and a 1Bth transistor including an nMOS transistor that includes a drain region, a channel formation region, and a source region stacked one on another and further includes a gate electrode layer, wherein the second CMOS inverter circuit includes:

a 2Ath transistor including a pMOS transistor that includes a drain region, a channel formation region, and a source region stacked one on another and further includes a gate electrode layer; and a 2Bth transistor including an nMOS transistor that includes a drain region, a channel formation region, and a source region stacked one on another and further includes a gate electrode layer, wherein each of the two transfer transistors includes a drain region, a channel formation region, and a source region stacked one on another and further includes a gate electrode layer, wherein the drain region of the 1Ath transistor and the drain region of the 1Bth transistor are connected to a common first drain region-connection portion, wherein the drain region of the 2Ath transistor and the drain region of the 2Bth transistor are connected to a common second drain region-connection portion, wherein the gate electrode layer common to the 1Ath transistor and the 1Bth transistor is connected to the common second drain region-connection portion through a first gate electrode-connection portion, wherein the gate electrode layer common to the 2Ath transistor and the 2Bth transistor is connected to the common first drain region-connection portion through a second gate electrode-connection portion, wherein the source region of the 1Ath transistor and the source region of the 2Ath transistor are connected to a common first power supply line, wherein the source region of the 1Bth transistor and the source region of the 2Bth transistor are connected to a common second power supply line, wherein the gate electrode layer common to the first transfer transistor and the second transfer transistor serves also as a word line, and wherein the word line extends in a second direction different from a first direction in which the common first power supply line, the common second power supply line, a first bit line, and a second bit line extend.

16. The memory cell according to claim 15, wherein
the drain regions of the 1Ath transistor, the 1Bth transistor, the 2Ath transistor, and the 2Bth transistor and one source/drain region of the first transfer transistor and the second transfer transistor are formed on a substrate, and
the common first drain region-connection portion and the common second drain region-connection portion are formed on the substrate.

17. The memory cell according to claim 16, wherein the common first drain region-connection portion and the common second drain region-connection portion each include a high concentration impurity region or a conductive material layer formed on the substrate.

18. The memory cell according to claim 15, wherein
the source regions of the 1Ath transistor, the 1Bth transistor, the 2Ath transistor, and the 2Bth transistor and one source/drain region of the first transfer transistor and the second transfer transistor are formed on a substrate, and
the common first power supply line and the common second power supply line are formed on the substrate.

19. The memory cell according to claim 18, wherein the common first power supply line and the common second power supply line each include a high concentration impurity region or a conductive material layer formed on the substrate.

20. The memory cell according to claim 15, wherein
another source/drain region of the first transfer transistor is connected to the first bit line,
another source/drain region of the second transfer transistor is connected to the second bit line,
one source/drain region of the first transfer transistor is connected to the common first drain region-connection portion, and
one source/drain region of the second transfer transistor is connected to the common second drain region-connection portion.

* * * * *